United States Patent
Abdel Aziz et al.

(10) Patent No.: US 8,640,541 B2
(45) Date of Patent: Feb. 4, 2014

(54) MEMS MASS-SPRING-DAMPER SYSTEMS USING AN OUT-OF-PLANE SUSPENSION SCHEME

(75) Inventors: Ahmed Kamal Said Abdel Aziz, Cairo (EG); Abdel Hameed Sharaf, New Cairo (EG); Mohamed Yousef Serry, Cairo (EG); Sherif Salah Sedky, Giza (EG)

(73) Assignee: King Abdullah University of Science and Technology, Thuwal (SA)

( * ) Notice: Subject to any disclaimer, the term of this patent is extended or adjusted under 35 U.S.C. 154(b) by 309 days.

(21) Appl. No.: 12/789,051

(22) Filed: May 27, 2010

(65) Prior Publication Data

US 2011/0030472 A1  Feb. 10, 2011

Related U.S. Application Data

(60) Provisional application No. 61/181,565, filed on May 27, 2009.

(51) Int. Cl.
  *G01P 9/00* (2012.01)
(52) U.S. Cl.
  USPC ..................................................... 73/504.12
(58) Field of Classification Search
  USPC ................. 73/504.12, 504.14, 504.1, 514.326
  See application file for complete search history.

(56) References Cited

U.S. PATENT DOCUMENTS

| | | | |
|---|---|---|---|
| 4,737,793 A | 4/1988 | Munson et al. | 342/361 |
| 5,025,346 A | 6/1991 | Tang et al. | 361/283.1 |
| 5,126,812 A | 6/1992 | Greiff | 257/417 |
| 5,203,208 A * | 4/1993 | Bernstein | 73/504.12 |
| 5,241,861 A | 9/1993 | Hulsing, II | 73/514.02 |
| 5,313,835 A | 5/1994 | Dunn | 73/514.15 |
| 5,349,855 A | 9/1994 | Bernstein et al. | 73/504.16 |
| 5,536,988 A | 7/1996 | Zhang et al. | 310/309 |
| 5,635,638 A * | 6/1997 | Geen | 73/504.04 |
| 5,757,103 A | 5/1998 | Lee et al. | 310/309 |
| 5,952,572 A | 9/1999 | Yamashita et al. | 73/504.04 |
| 5,992,233 A | 11/1999 | Clark | 73/514.35 |
| 6,008,776 A | 12/1999 | Yarbrough et al. | 343/853 |
| 6,028,552 A | 2/2000 | Shuguang | 342/372 |
| 6,045,712 A | 4/2000 | Yarbrough et al. | 216/2 |

(Continued)

FOREIGN PATENT DOCUMENTS

| | | |
|---|---|---|
| EP | 1 518 822 | 3/2005 |
| JP | 2006234720 A | 9/2006 |
| WO | WO 00/71981 | 11/2000 |
| WO | WO 2008/052306 | 5/2008 |

OTHER PUBLICATIONS

"+1g to +5g Single Chip Accelerometer with Signal Conditioning: ADXL05", Analog Devices, Norwood, MA, datasheet, 1996.

(Continued)

*Primary Examiner* — Leonard Chang
*Assistant Examiner* — Natalie Huls
(74) *Attorney, Agent, or Firm* — Steptoe & Johnson LLP

(57) ABSTRACT

MEMS mass-spring-damper systems (including MEMS gyroscopes and accelerometers) using an out-of-plane (or vertical) suspension scheme, wherein the suspensions are normal to the proof mass, are disclosed. Such out-of-plane suspension scheme helps such MEMS mass-spring-damper systems achieve inertial grade performance. Methods of fabricating out-of-plane suspensions in MEMS mass-spring-damper systems (including MEMS gyroscopes and accelerometers) are also disclosed.

28 Claims, 42 Drawing Sheets

(56) References Cited

U.S. PATENT DOCUMENTS

| | | | | |
|---|---|---|---|---|
| 6,122,961 | A | 9/2000 | Geen et al. | 73/504.12 |
| 6,158,280 | A | 12/2000 | Nonomura et al. | 73/504.04 |
| 6,185,107 | B1 | 2/2001 | Wen | 361/803 |
| 6,198,438 | B1 | 3/2001 | Herd et al. | 343/700 |
| 6,286,369 | B1 | 9/2001 | Yazdi | 73/514.32 |
| 6,308,573 | B1 * | 10/2001 | Lee et al. | 73/652 |
| 6,349,597 | B1 * | 2/2002 | Folkmer et al. | 73/504.02 |
| 6,384,797 | B1 | 5/2002 | Schaffner et al. | 343/795 |
| 6,393,913 | B1 | 5/2002 | Dyck et al. | 73/504.12 |
| 6,417,807 | B1 | 7/2002 | Hsu et al. | 343/700 |
| 6,426,538 | B1 * | 7/2002 | Knowles | 257/417 |
| 6,469,677 | B1 | 10/2002 | Schaffner et al. | 343/876 |
| 6,481,284 | B2 | 11/2002 | Geen et al. | 73/504.12 |
| 6,505,511 | B1 * | 1/2003 | Geen et al. | 73/504.12 |
| 6,539,801 | B1 * | 4/2003 | Gutierrez et al. | 73/504.12 |
| 6,571,630 | B1 | 6/2003 | Weinberg et al. | 73/504.16 |
| 6,611,237 | B2 | 8/2003 | Smith | 34/772 |
| 6,666,088 | B2 | 12/2003 | Leung | 73/488 |
| 6,670,212 | B2 | 12/2003 | McNie et al. | 438/52 |
| 6,674,340 | B2 | 1/2004 | Quan et al. | 333/164 |
| 6,739,189 | B2 | 5/2004 | Lee et al. | 73/488 |
| 6,742,390 | B2 | 6/2004 | Mochida et al. | 73/504.04 |
| 6,756,247 | B1 | 6/2004 | Davis et al. | 438/52 |
| 6,769,303 | B1 | 8/2004 | Okojie | 73/514.16 |
| 6,828,938 | B2 | 12/2004 | Tran | 343/700 |
| 6,842,148 | B2 | 1/2005 | Hendler et al. | 343/702 |
| 6,848,304 | B2 | 2/2005 | Geen | 73/504.04 |
| 6,859,189 | B1 | 2/2005 | Ramirez et al. | 343/815 |
| 6,865,402 | B1 | 3/2005 | Gilbert | 455/562.1 |
| 6,875,936 | B1 | 4/2005 | Suzuki et al. | 200/181 |
| 6,877,374 | B2 | 4/2005 | Geen | 73/504.04 |
| 6,887,776 | B2 | 5/2005 | Shang et al. | 438/612 |
| 6,915,693 | B2 * | 7/2005 | Kim et al. | 73/504.12 |
| 6,952,965 | B2 | 10/2005 | Kang et al. | 73/504.12 |
| 6,981,414 | B2 | 1/2006 | Knowles et al. | 73/504.12 |
| 7,004,024 | B1 * | 2/2006 | Park | 73/504.16 |
| 7,036,373 | B2 * | 5/2006 | Johnson et al. | 73/504.14 |
| 7,042,420 | B2 | 5/2006 | Ebling et al. | 343/911 L |
| 7,061,447 | B1 | 6/2006 | Bozler et al. | 343/910 |
| 7,123,119 | B2 | 10/2006 | Pashby et al. | 333/262 |
| 7,151,501 | B2 | 12/2006 | Tran | 343/823 |
| 7,164,387 | B2 | 1/2007 | Sievenpiper | 343/702 |
| 7,172,919 | B2 | 2/2007 | Weinberg et al. | 438/50 |
| 7,194,889 | B1 | 3/2007 | Jean et al. | 73/12.04 |
| 7,196,666 | B2 | 3/2007 | Allen et al. | 343/700 MS |
| 7,210,347 | B2 | 5/2007 | Nicu et al | 73/504.12 |
| 7,210,351 | B2 | 5/2007 | Lo et al. | 73/514.32 |
| 7,223,624 | B2 | 5/2007 | Wu et al. | 438/52 |
| 7,250,332 | B2 | 7/2007 | Lai et al. | 438/231 |
| 7,267,004 | B2 | 9/2007 | Leverrier et al. | 73/504.12 |
| 7,293,460 | B2 | 11/2007 | Zarabadi et al. | 73/514.32 |
| 7,318,349 | B2 | 1/2008 | Vaganov et al. | 73/514.33 |
| 7,402,897 | B2 | 7/2008 | Leedy | 257/678 |
| 7,406,867 | B2 | 8/2008 | Cardarelli | 73/504.13 |
| 7,421,897 | B2 | 9/2008 | Geen et al. | 73/504.12 |
| 7,425,465 | B2 | 9/2008 | Birkmeyer | 438/107 |
| 7,444,870 | B2 | 11/2008 | Uchiyama et al. | 73/504.12 |
| 7,458,263 | B2 | 12/2008 | Nasiri et al. | 73/504.12 |
| 7,463,201 | B2 | 12/2008 | Chiang et al. | 343/700 |
| 7,481,112 | B2 | 1/2009 | Kim et al. | 73/514.33 |
| 7,501,069 | B2 | 3/2009 | Liu et al. | 216/2 |
| 7,518,493 | B2 | 4/2009 | Bryzek et al. | 340/442 |
| 2003/0104649 | A1 | 6/2003 | Ozgur et al. | 438/50 |
| 2004/0149035 | A1 | 8/2004 | Acar et al. | 73/502.12 |
| 2005/0024527 | A1 * | 2/2005 | Chiou | 348/373 |
| 2006/0010978 | A1 * | 1/2006 | Lee et al. | 73/504.02 |
| 2006/0169041 | A1 * | 8/2006 | Madni et al. | 73/504.02 |
| 2007/0193355 | A1 | 8/2007 | Axelrod et al. | 73/514.32 |
| 2007/0214883 | A1 * | 9/2007 | Durante et al. | 73/504.04 |
| 2007/0214891 | A1 * | 9/2007 | Robert et al. | 73/514.32 |
| 2007/0222697 | A1 | 9/2007 | Caimi et al. | 343/861 |
| 2007/0224948 | A1 | 9/2007 | Hartenstein et al. | 455/101 |
| 2007/0278075 | A1 | 12/2007 | Terano et al. | 200/181 |
| 2008/0023803 | A1 | 1/2008 | Shi et al. | 257/623 |
| 2008/0061026 | A1 | 3/2008 | Milanovic et al. | 216/2 |
| 2008/0148851 | A1 * | 6/2008 | Ackerley et al. | 73/514.38 |
| 2008/0158094 | A1 | 7/2008 | Rofougaran | 343/873 |
| 2008/0278405 | A1 | 11/2008 | Montgomery | 343/893 |
| 2008/0314147 | A1 * | 12/2008 | Nasiri et al. | 73/514.32 |
| 2009/0050487 | A1 | 2/2009 | Fang et al. | 205/135 |
| 2009/0096676 | A1 | 4/2009 | Yan et al. | 343/700 |
| 2010/0024549 | A1 * | 2/2010 | Wang et al. | 73/504.14 |
| 2012/0096943 | A1 * | 4/2012 | Potasek et al. | 73/504.14 |

OTHER PUBLICATIONS

Allen et al., "Accelerometer Systems with Self-testable Features", Sensor and Actuatores, 20:153-161, 1989.

Ayazi, "The HARPSS process for fabrication of precision MEMS inertial sensors", Mechatronics, 12 (9-10):1185-1199, 2002.

Barth et al., "A Monolithic Silicon Accelerometer with Integral Air Damping and Overrange Protection", in Tech. Dig. Solid-State Sensors and Actuators Workshop, Hilton Head Island, SC, pp. 35-38, 1988.

Becker et al, "A Finite Ground Coplanar Line-to-Silicon Micromachines Waveguide Transition", IEEE Transactions on Microwave Theory and Techniques, vol. 49, No. 10, pp. 1671-1676, Oct. 2001.

Bernstein et al., "A Micromachines Comb-Drive Tuning Fork Rate Gyroscope", Electrical and Electronic Engineering, pp. 143-148, 1993.

Burbaum et al,, "Fabrication of Capcitive Acceleration Sensors by the LIGA Technique", Sensors and Actuators A, 25-27, pp. 559-563, 1991.

Burns et al., "Sealed-cavity resonant microbeam accelerometer", Sensors and Actuators A, vol. 53, pp. 249-255, 1996.

Cadarso et al., "Polymer microoptoelectromechanical systems: Accelerometers and variable optical attenuators", Sensors and Acutators A, vol. 145/146, pp. 147-153, 2008.

Caillet et al., "Foam Micromachined Aperture-Coupled Antennas for V-Band Low-Cost Applications", Proceedings of the 37th Euopean Microwave Conference, pp. 1066-1069, Oct. 2007.

Chang et al., "Resonant-bridge Two-axis Microaccelerometer", Sensors and Actuators, A21-A23, pp. 342-345, 1990.

Chau et al., "An integrated force-balanced capacitive accelerometer for low-g applications", Sensors and Actuators A54, pp. 472-476, 1996.

Cho et al., "floating-patch MEMS antennas on HRS substrate for millimeter-wave applications", Electornics Letters, vol. 41, No. 1, pp. 5-6, Jan. 6, 2005.

Choi et al., "High standoff dual-mode-actuation MEMS switches", Microsystem Technologies, vol. 15, No. 5, pp. 777-787, 2009.

Cole, "A new sense element technology for accelerometer subsystems", in Tech. Dig. 6th Int. Conf. Solid-State Sensors and Actuators, San Francisco, CA. pp. 93-96, Jun. 1991.

Courteaud et al., "Sutdies and optimization of the frequency response of a micromachined thermal accelerometer", Sensors and Actuators A: Physical, vol. 147, pp. 75-82, 2008.

Danel et al., "Micromachining of Quartz and its Application to an Acceleration Sensor", Sensors and Actuators, A21/A23, pp. 971-977, 1990.

Digby et al., "Fabrication and Characterization of Micromachined Rectangular Waveguide Components for Use at Millimeter-Wave and Terahertz Frequencies", IEEE Transactions on Microwave Theory and Techniques, vol. 48, No. 8, Aug. 2000.

Dong et al., "A novel out-of-plane MEMS tunneling accelerometer", Sensors and Actuators A, vol. 120, pp. 360-364, 2005.

Duan et al., "A novel x-axis tuning formk gyroscope with '8 vertical springs-proofmass' structure on (111) silicon", Microsystems Technology, vol. 14, pp. 1009-1013, 2008.

Fedder et al., "Multimode Digital Control of Suspended Polysilicon Microstructure", Journal of Microelectromechanical Systems, vol. 5, No. 4, Dec. 1996.

Fujita et al., "Design of two-dimensional micromachined gyroscope by using nickel electroplating", Sensors and Actuators A, vol. 66, pp. 173-177, 1998.

Grade et al., "Low Frequency Drift in Tunnel Sensors", International Conference of Solid-State Sensors and Actuators (Transducers '97), pp. 871-874, 1997.

(56) References Cited

OTHER PUBLICATIONS

Ha et al., "Q-band Micro-patch Antennas implemented on a High Resistivity Silicon substrate using the Surface Micromachining Technology", IEEE MTT-S International Symposium digest, pp. 1189-1192, Jun. 2004.

Henrion et al., "Wide Dynamic Range Direct Digital Accelerometer", Tech. Dig. Solid-State Sensors and Actuators Workshop, Hilton Head Island, SC, pp. 153-156, 1990.

Hesler et al., "Analysis of an Octagonal Micromachined Horn Antenna for Submillimeter-Wave Applications", IEEE Transactions on Antennas and Propagation, Vo. 49, No. 6, pp. 997-1001, Jun. 2001.

Hiratsuka et al., "Design considerations for the thermal accelerometer", Sensors and Acutators A, vol. 32, pp. 380-385, 1992.

Hoivik et al., "High-Efficiency 60gHz Antenna Fabricated Using Low-Cost Silicon Micromachining Techniques", IEEE AP-S International Symposium Digest, pp. 5043-5046, Jun. 2007.

Hou et al., "Millimeter-wave Design of Aperture-coupled Micromachined Patch Antennas", IEEE International Conference on Microwave and Millimeter Wave Technoloyg Proceedings, pp. 1401-1404, 2008.

Huang et al., "Compact 3D-MEMS-mander monopole antenna", Electronic Letters, vol. 41, No. 21, Oct. 13, 2005.

Huang et al., "Micromachined patch antenna and array using MEMS technology", Proceedings of SPIE—the International Society for Optical engineering, vol. 4586, pp. 432-239, 2001.

Huss et al., "A Micromachined 94 GHz Dielectric Resonator Antenna for Focal Plane Array Applications", IEEE MTT-S International Microwave Symposium Digest, pp. 1375-1378, 2007.

Jung et al., "Enhancement of miniature and small-bandwidth Micromachined antennas using GaAs technology", Proceedings of SPIE—the International Society for Optical Engineering, pp. 41-45, Mar. 2004.

Jung et al., "Improving Bias Stability of Micromachined Accelerometer by Increasing Mechanical Stability", Sensors and Materials, vol. 18, No. 3, pp. 151-160, 2006.

Kenny et al., "Micromachined Electron Tunneling Infrared Sensor", Proc. IEE Micro electro Mechanical Systems Workshop, (MEMS'90), Napa Valley, pp. 205-212, 1990.

Kim et al., "60-GHz CPW-Fed Post-Supported Patch Antenna Using Micromachining Technology", IEEE Microwave Wireless Components Letters, vol. 15, No. 10, pp. 635-637 Oct. 2005.

Kourepenis et al., "Low cost quartz resonant accelerometer for aircraft inertial navigation", IEEE Tech. Dig. $6^{th}$ Int. Conf. Solid-State Sensors and Actuators (Transducers '91), San Francisco, CA, pp. 551-553, 1991.

Kratz et al., "Micromachined S-band patch antenna with reduced dielectric constant", Sensors and Actuators A, vol. 130/131, pp. 478-484, 2006.

Krishnamoorthy et al., "In-plane MEMS-based nano-g accelerometer with sub-wavelength optical resonant sensor", Sensors and Actuators A: Physical, vol. 145/146, pp. 283-290, 2008.

Leung et al., "Micromachined Accelerometer based on Convection Heat Transfer", IEEE MicroElectro mechanical Systems Workshop (MEMS' 98) Heidelberg, Germany, Jan. 1998, pp. 627-630.

Liu et al., "Vertical Profiles and CD Loss Control in Deep RIE technology", IEEE International Conference on Solid-State and Integrated Circuits Technology, vol. 3, pp. 1848-1851, Oct. 18-21, 2004.

Lukic & Filipovic, "Surface-Micromachined Dual Ka-Band Cavity Backed Patch Antenna", IEEE Transactions on Antennas and Propagation, vol. 55, No. 7, pp. 2107-2110, 2007.

Lukic et al. "Multi-Physics Design and Performance of a Surface-Micromachined Ka-Band Cavity Backed Patch Antenna", IEEE MTT-S International Microwave and Optoelectronics Conference Proceedings, pp. 321-324, 2007.

Marconnet et al., "Micromachined Step-Tapered High Frequency Waveguide Inserts and Antennas", IEEE International Vacuum electronics Conference, pp. 22-23, 2008.

Moussa et al., "Investigating the reliability of electrostatic comb-drive actuators used in microfluidic and space systems using finite element analysis", Can. J. Elect. Comput. Eng., vol. 27, No. 4, pp. 195-200, Oct. 2002.

Neculoiu et al., "Membrane supported Yagi-Uda antennae for millimeter-wave applications", IEE Proc.-Microw. Antennas Propag., vol. 151, No. 4, Aug. 2004.

Ojefors et al., "Micromachined Loop Antennas on Low Resistivity Silicon Substrates", IEEE Transactions on Antennas and Propagation, vol. 54, No. 12, pp. 3593-3601, 2006.

Omura et al., "New Resonant Accelerometer Based on Rigidity Change", IEEE International Conference of Solid-State Sensors and Actuators (Transducers '97), pp. 855-858, 1997.

Pavuluri et al., "A High-Performance Aperture-Coupled Patch Antenna Supported by a Micromachined Polymer Ring", IEEE Antennas and Wireless Propagation Letters, vol. 7, pp. 283-286, 2008.

Phan et al, "A novel elastomer-based magnetoresistive accelerometer", Sensors and Actuators A 145-146, pp. 109-115, 2008.

Pourahmadi et al., "Silicon Accelerometer with New Thermal Self-test Mechanism", IEEE Tech. Dig. Solid-State Sensors and Actuators Workshop, Hilton Head Island, SC, Jun. 1992, pp. 122-125.

Qu et al., "A Single-crystal Silicon 3-axis CMOS-MEMS Accelerometer", Sensors, Proceedings of IEEE, vol. 2, pp. 661-664, 2004.

Riethmuller et al., "A smart accelerometer with on-chip electronics fabricated by a commercial CMOS process", Sensors and Actuators A, vol. 31, pp. 121-124, 1992.

Rizk & Rebeiz, "Millimeter-Wave Fermi Tapered Slot Antennas on Micromachined Silicon Substrates", IEEE Transactions on Antennas and Propagation, vol. 50, pp. 379-383, 2002.

Roszhart et al., "An inertial-grade, micromachined vibrating beam accelerometer", Tech. Dig. 8th Int. Conf. solid-State Sensor and Actuators (Transducers '95), Stockholm, Sweden, pp. 656-658, Jun. 1995.

Roylance & Angell, "A Batch-Fabricated Silicon Accelerometer", IEEE Transactions on Electronic Devices, vol. ED-26, No. 12, Dec. 1979, pp. 1911-1917.

Rudolf et al., "Precision Accelerometers with mg Resolution", Sensors and Actuators, A21-A23, pp. 297-302, 1990.

Saadaoui et al., "Dry followed by wet backside etching processes for micromachined endfire antennae", J. Micromech. Microeng., vol. 15, pp. S65-S71, 2005.

Satchell & Greenwood, "A Thermally-Excited Silicon Accelerometer", Sensors and Actuators, vol. 17, pp. 241-245, 1989.

Sedaghat-Pisheh et al., "three-Dimensional On-Chip Conical Spiral Antennas on Video-Monitored Micromachined (100) Silicon Wafers", Proceedings of Asia-Pacific Microwave Conference, pp. 2038-2040, 2006.

Sedaghat-Pisheh et al., "Design, Simulation, and Fabrication of an On-Chip Antenna Fabricated Using Silicon Micromachining for Broad-Band Millimeter-Wave Wireless Communications", Proceedings of the $36^{th}$ European Microwave Conference, pp. 1446-1448, Sep. 2006.

Seidel et al., "A Piezoresistive Silicon Accelerometer with Monolithically Integrated Cmos-Circuitry", Tech. Dig. $8^{th}$ Int. Conf. Solid-State Sensor and Acutators (Transducers '95) Stockholm, Sweden, Jun. 1995, pp. 597-600.

Seshia et al., "A Vacuum Packaged Surface Micromachined Resonant Accelerometer", Journal of Microelectromechanical systems, vol. 11, No. 6, pp. 784-792, 2002.

Sharaf et al. "Design and Simulation of a New Decoupled Micromachined Gyroscope", Journal of Physics: Conference Series 34, pp. 464-469, 2006.

Sharma et al., "Design and Development of Square and Circular Micromachined Patch Antennas at Ka-band", International RF and Microwave Conference Proceedings, pp. 130-134, 2006.

Shenouda et al, "Etched-Silicon Micromachined W-Band Waveguides and Horn Antennas", IEEE Transactions on Microwave Theory and Techniques, vol. 49, No. 4, pp. 724-727, Apr. 2001.

Sherman et al., "A low-cost monolithic accelerometer: product/technology update," Tech. Dig. IEEE Electron Devices Meeting (IEDM '92), pp. 160-161, 1992.

(56) References Cited

OTHER PUBLICATIONS

Shuangfenga et al., "Design and fabrication of a new miniaturized capacitive accelerometer," Sensors and Actuators A, 147:70-74, 2008.
Smith et al., "A 15b electromechanical sigma-delta converter for acceleration measurements," in Tech. Dig. IEEE Int. Electron Device Meeting, San Francisco, CA, pp. 160-161, 1994.
Soliman et al., "Circularly polarized aperture antenna fed by CPW and built in MCM-D technology," Electronics Letters, 35(4):250-251, 1999.
Soliman et al., "Dual-Polarized omnidirectional planar slot antenna for WLAN applications," IEEE Transactions on Antennas and Propagation, 53(9):3093-3097, 2005.
Spangler & Kemp, "ISAAC—Integrated silicon automotive accelerometer," Tech. Dig. 8$^{th}$ Int. Conf. Solid-State Sensors and Actuators, Stockholm, Sweden, pp. 585-588, Jun. 1995.
Van Drieenhuizen et al., "Force-balanced accelerometer with mG resolution fabricated using silicon fusion bonding and deep reactive ion etching," Tech. Dig. 9$^{th}$ Int. Conf. Solid-State Sensors and Actuators, pp. 1229-1230, 1997.
Xie, "Integrated microelectromechanical gyroscopes," Journal of Aerospace Engineering, 16(2):65-75, 2003.
Xue et al., "Modeling and Design of Polymer-Based Tunneling Accelerometers by ANSYS/MATLAB," IEEE/ASME Transactions on Mechatronics, 10(4):486-472, 2005.
Yan & Murch, "Fabrication on wideband antenna on a low-resistivity silicon substrate using a novel micromachining technique," IEEE Antennas and Wireless Propagation Letters, 6:476-479, 2007.
Yazdi & Najafi, "An all-silicon single-wafer fabrication technology for precision microaccelerometers," Tech. Dig. 9$^{th}$ Int. Conf. Solid-State Sensors and Actuators (Transducers '97), Chicago, IL, pp. 1181-1184, 1997.
Yeh & Najafi, "A low-voltage bulk-silicon tunneling based microaccelermoter," Tech. Dig. IEEE Int. Electron Devices Meeting (IEDM), Washington, DC, pp. 593-596, 1995.
Yeh & Najafi, "A low-voltage tunneling based silicon microaccelerometer," IEEE Trans. Electron Devices, 44(11): 1875-1882, 1997.
Yeh & Najafi, "CMOS interface circuitry for a low-voltage micromachined tunneling accelerometer," J of Microelectromechanical Systems, 7(1):6-15, 1998.
Yook & Katehi, "Micromachined microstrip patch antenna with controlled mutual coupling and surface waves," IEEE Transactions on Antennas and Propagation, 49:1282-1289, 2001.
Yun et al., "Surface micromachined digitally force-balanced accelerometer with integrated CMOS detection circuitry," Tech. Dig. Solid-State Sensor and Actuator Workshop, Hilton Head Island, SC, Jun. 1992, pp. 126-131.
Zheng et al., "Broadband microstrip patch antenna on micromachined silicon substrates," Electronics Letters, 34:3-4, 1998.
Ma et al., "A Bulk-Silicon Capacitive Microaccelerometer with Built-in Overrange and Force Feedback Electrodes", Solid State Sensor and Actuator Workshop, pp. 160-163, 1994.
Binning and Rohrer, "Scanning tunneling microscopy," IBM J. Res. Develop., 30:355-369, 1986.
Boser & Howe, "Surface micromachined accelerometers," IEEE J. Solid-State Circuits, 31:366-375, 1996.
Bowen et al., "Micromachined waveguide antennas for 1.6 THz," Electronics Letters, 42(15), 2 pages, 2006.
Dong et al., "A high-performance accelerometer with a fifth-order sigma-delta modulator," J. Micromech. Microeng., 15:1-8, 2005.
Gauthier et al., "A 94-GHz aperture-coupled micromachined microstrip antenna," IEEE Transactions on Antennas and Propagation, 47:1761-1766, 1999.
Geen, "New iMEMS angular-rate-sensing gyroscope," Analog Dialogue, 37-03, 2003.
Ghafari et al., "Design and modeling of a 3-D micromachined accelerometer," NSTI—Nanotech, available online at www.nsti.org, ISBN 0-9728422-8-4, vol. 2, 2004.
International Search Report, issued in International Patent Application No. PCT/US2010/036406, mailed on Jun. 23, 2010.
Joshi et al., "Performance improvisation of cantilever-type silicon micro acceleration sensors using stress concentration regions technique," Defence Science Journal, 57(3):271-279, 2007.
Kubena et al., "A new miniaturized surface micromachined tunneling accelerometer," IEEE Electron Device Lett., 17:306-308, 1996.
Lee et al., "Fully micromachined finite-ground coplanar line-to-waveguide transitions for W-band applications," IEEE Transactions on Microwave Theory and Techniques, 52:1001-1007, 2004.
Lemkin et al., "A 3-axis force balanced accelerometer using a single proof-mass," Tech. Dig. 9$^{th}$ Int. Conf. Solid-State Sensors and Actuators (Transducers '97), Chicago, IL, Jun. 1997, pp. 1185-1188.
Lemkin et al., "A 3-axis surface micromachined accelerometer," Tech. Digest Int. Solid State Circuits Conf. (ISSCC '97), San Francisco, CA, pp. 202-203, 1997.
Lemkin et al., "A Three-Axis micromachined accelerometer with a CMOS position-sense interfaceand digital offset-trim electronics," IEEE Journal of Solid-State Circuits, 34(4):456-468, 1999.
Li et al., "Development of a novel GaAs micromachined accelerometer based on resonant tunneling diodes," Sensors and Actuators A, 143:230-236, 2008.
Lu et al.,"A monolithic surface micromachined accelerometer with digital output," IEEE J. Solid-State Circuits, 30:1367-1373, 1995.
Lubecke et al., "Micromachining for teC24rahertz applications," IEEE Transactions on Microwave Theory and Techniques, 46(11):1821-1831, 1998.
Lynch et al., "Design of piezoresistive MEMS-Based accelerometer for integration with wireless sensing unit for structural monitoring," Journal of Aerospace Engineering, 108-114, 2003.
Neculoiu et al., "MEMS antennas for millimeter wave applications," Proceedings of SPIE—The International Society for Optical Engineering, pp. 66-72, Oct. 2001.
Oh et al., "60-GHz CPW-fed dielectric-resonator-above-patch (DRAP) antenna for broadband WLAN applications using micromachining technology," Microwave and Optical Technology Letters, 49:1859-1861, 2007.
Pan et al., "A high performance surface-micromachined elevated patch antenna," IEEE AP-S International Symposium Digest, pp. 397-400, 2005.
Pan et al., "Analysis and characterization of a high-performance Ka-band surface micromachined elevated patch antenna," IEEE Antennas and Wireless propagation Letters, 5: 511-514, 2006.
Papapolymerou et al., "Micromachined patch antennas," IEEE Transactions on Antennas and Propagation, 46:25-283, 1998.
Park et al., "Fabrication of 3D MEMS antenna array for infrared detector using novel UV-lithography apparatus, plastic micromachining and micro assembly technique," Nanotechnology Conference and Trade Show, pp. 498-501, 2003.
Rocksatd et al, "A miniatrure high-sensitivity broad-band accelerometer based on electron tunneling transducers," Sensors Actuators A, 43:107-114, 1994.
Sammoura et al., "Micromachined 95 GHz waveguide-fed plastic horn antennas," Journal of Micromechanics and Microengineering, 18:055009, 2008.
Selvakumar et al., "A high sensitivity z-axis torsional silicon accelerometer," in Tech. Dig. IEEE Int. Electron Device Meeting, San Francisco, CA, pp. 765-768, 1996.
Shkel, "Type I and Type II Micromachined Vibratory Gyroscopes," Position, Location and Navigation Symposium, pp. 586-593, Apr. 25-27, 2006.
U.S. Appl. No. 61/181,565, entitled "Novel Architecture for High Performance Inertial Grade MEMS Gyroscopes and Accelerometers," by Ahmed A. Aziz, filed on May 27, 2009.
Wang & Pavuluri, "Fabrication and assembly of high gain MEMS antenna for wireless communications," Proceedings—Electronic Components and Technology Conference, pp. 1941-1945, 2008.

(56) References Cited

OTHER PUBLICATIONS

Wu et al., "Novel substrate-independent broadband micromachined antenna for mm-wave cognitive radio applications," *IEEE AP-S International Symposium Digest*, pp. 5833-5836, 2007.

Yazdi, "Micromachined inertial sensors," *Proceedings of the IEEE*, 86(8):1640-1659, 1998.

Yoon et al., "A vertical W-band surface micromachined Yagi-Uda Antenna," *IEEE AP-S international Symposium Digest*, pp. 594-597, 2005.

Yoon et al., "Surface micromachined millimeter-wave antenna," *Digest of Technical Papers International Conference on Solid State Sensors and Actuators and Microsystems*, pp. 1986-1989, 2005.

\* cited by examiner

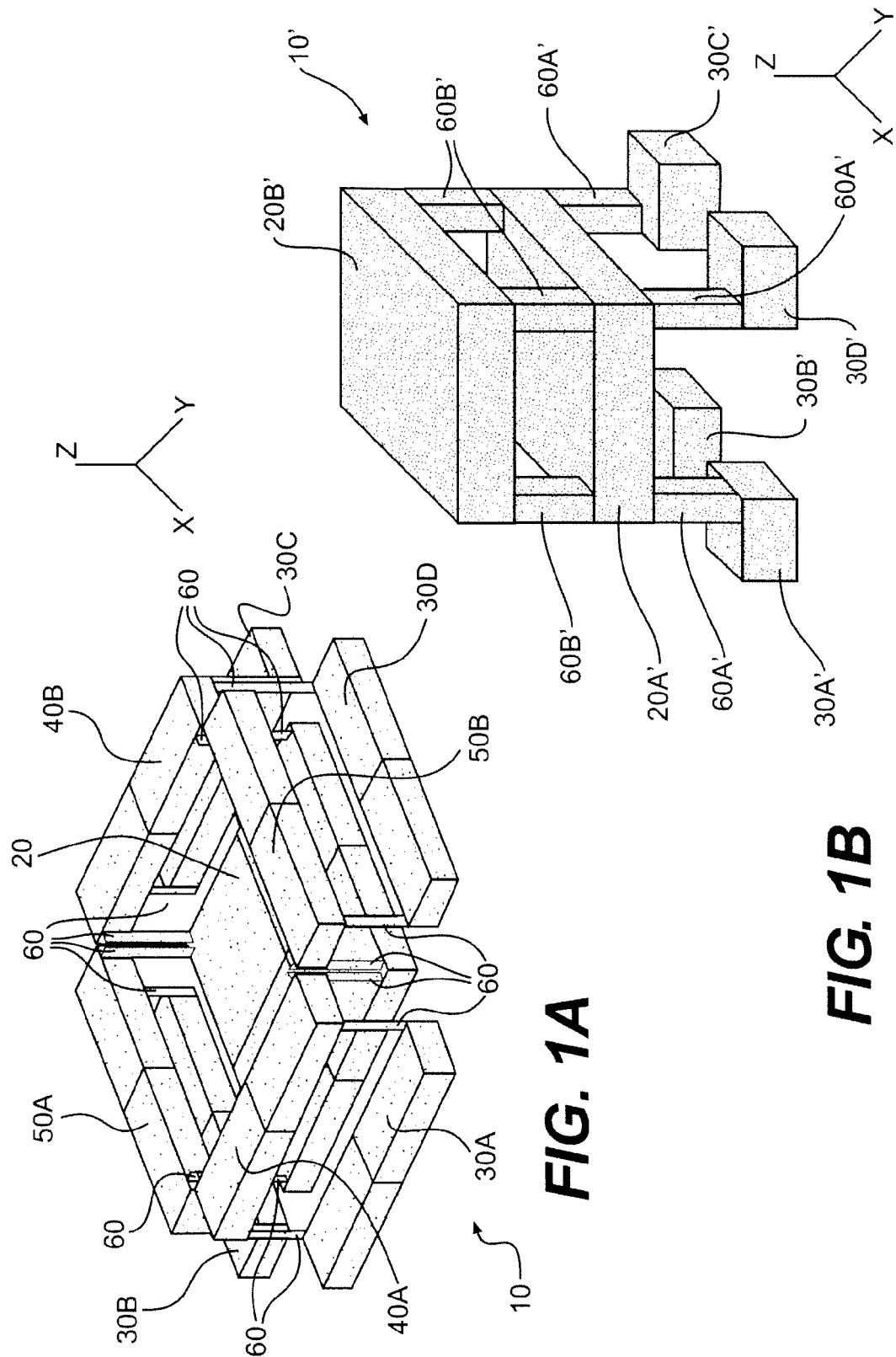

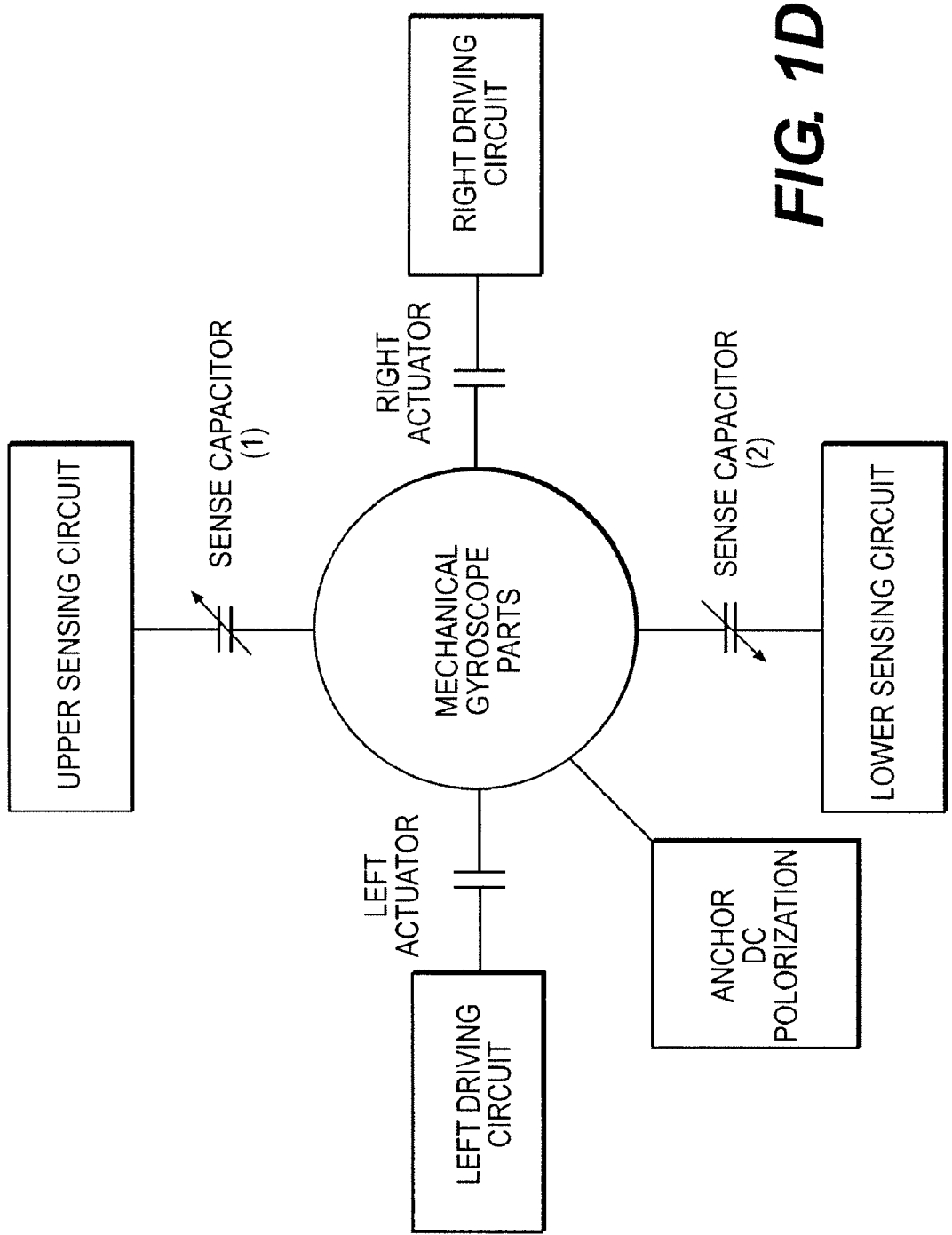

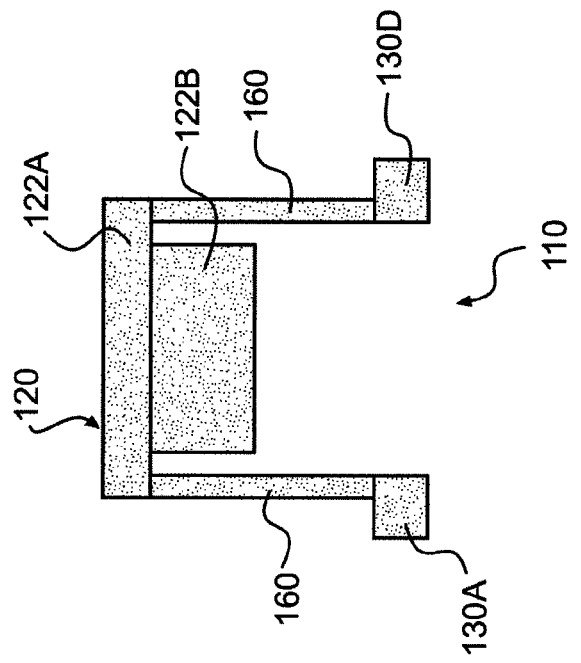
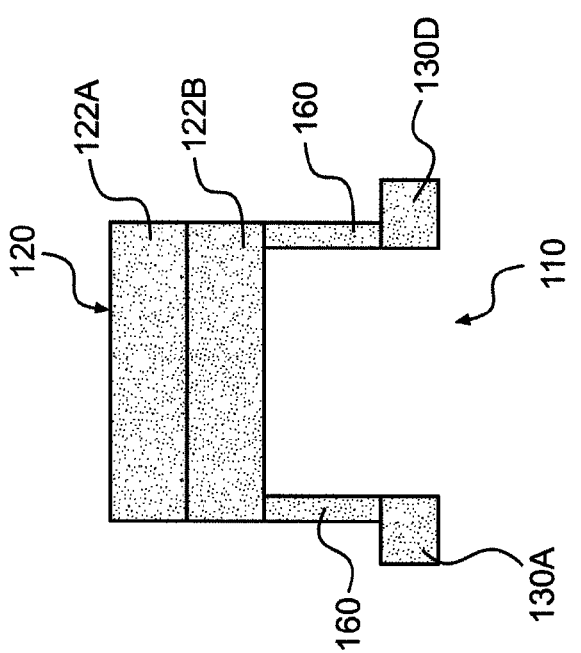

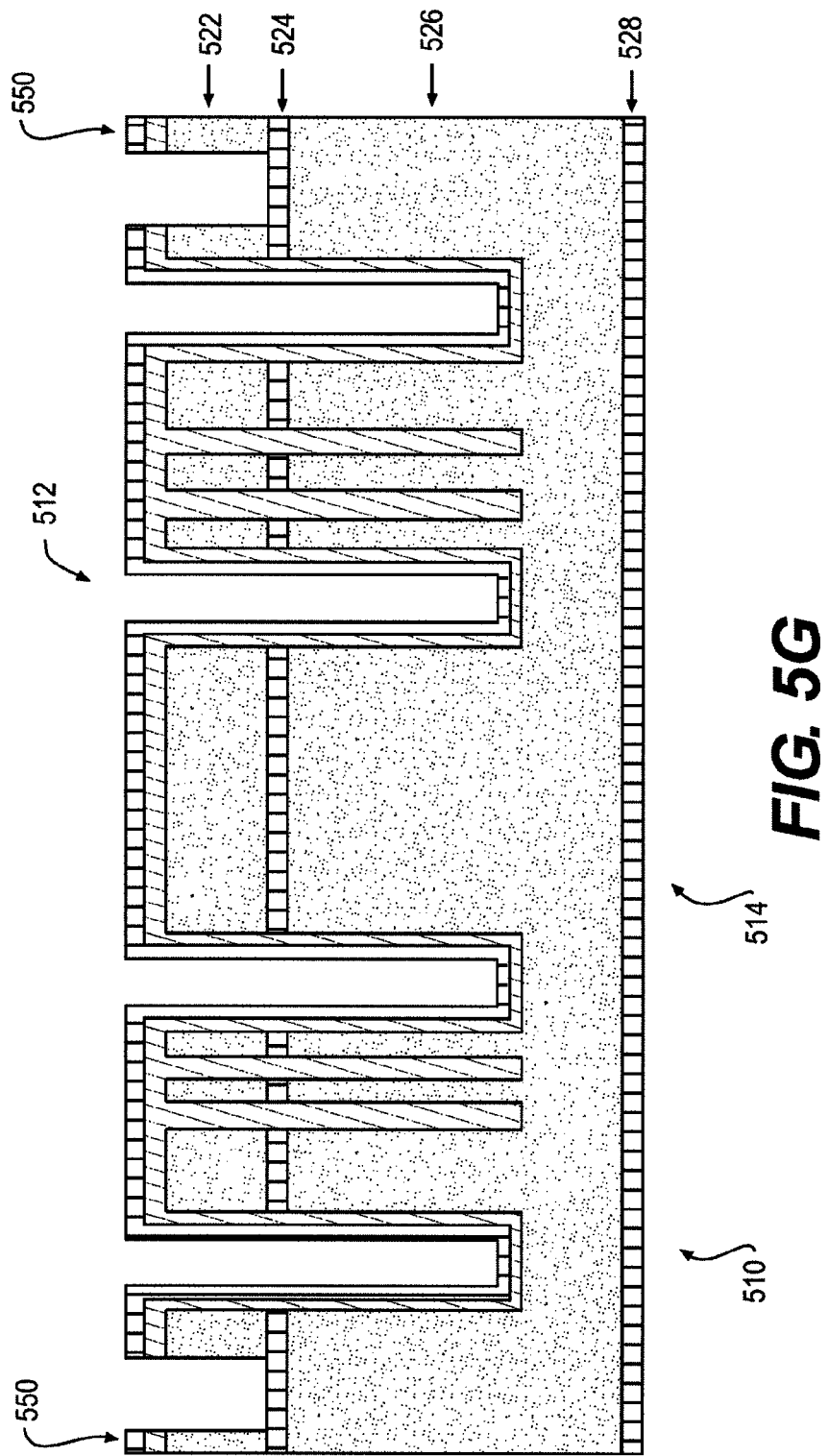

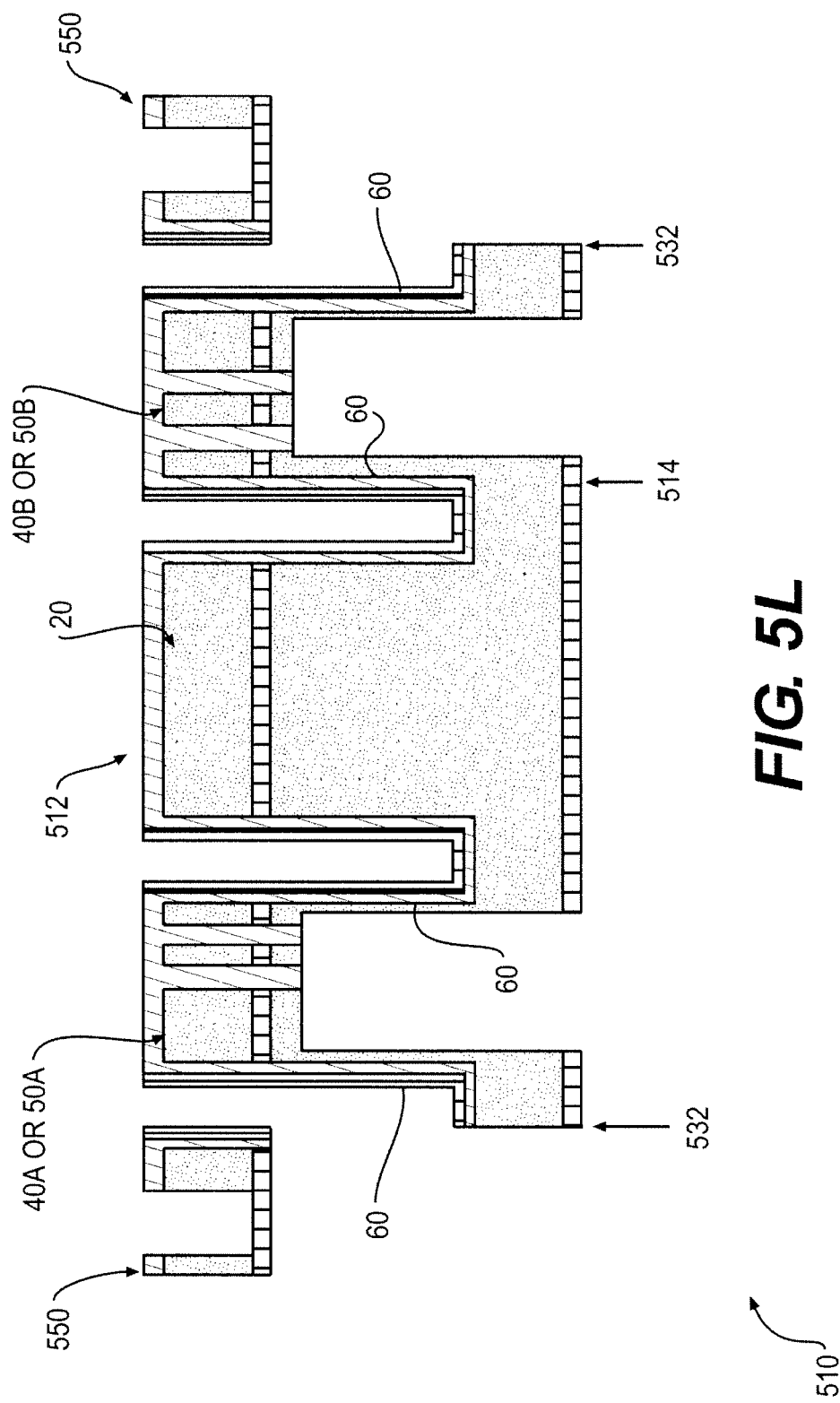

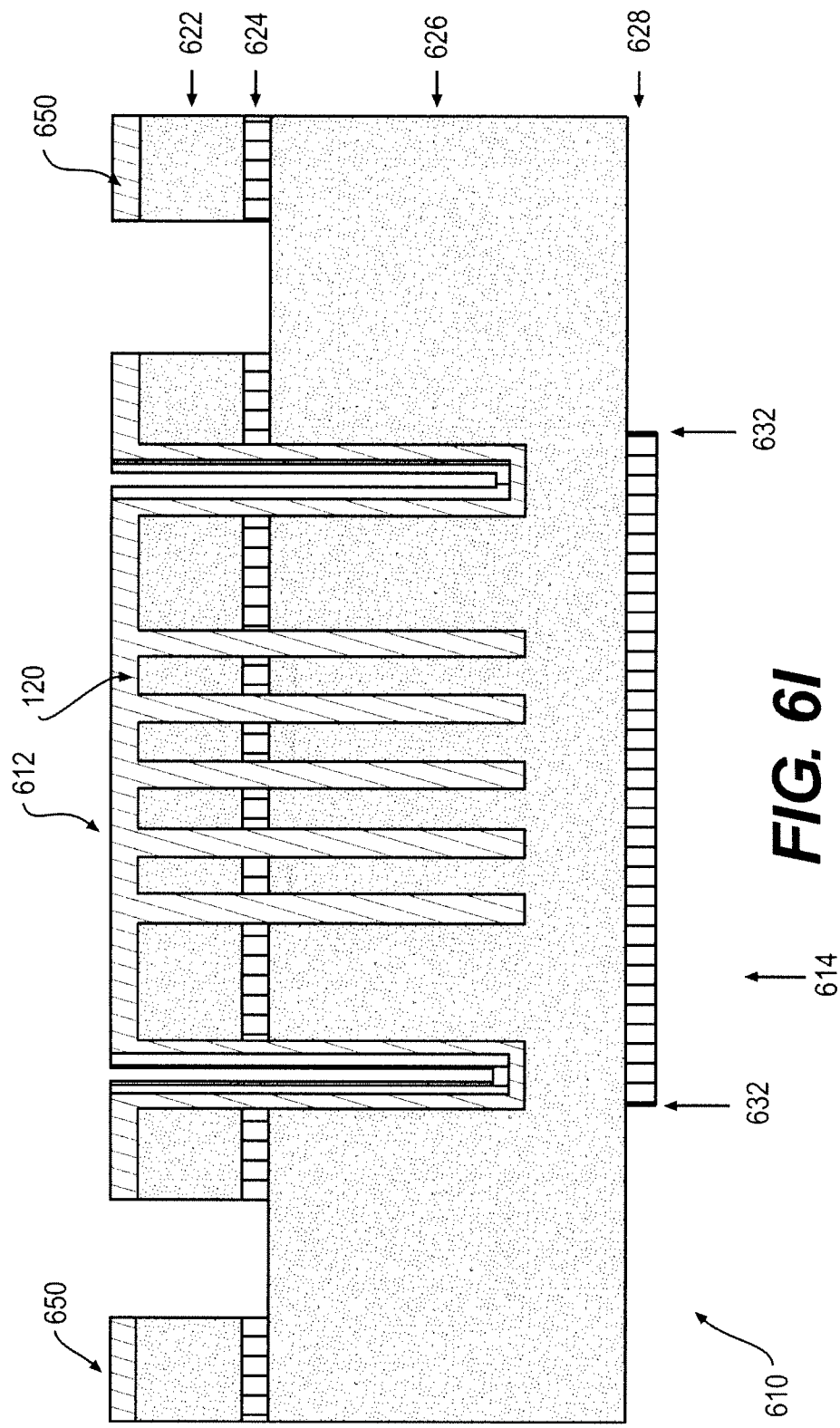

MEMS MASS-SPRING-DAMPER SYSTEMS USING AN OUT-OF-PLANE SUSPENSION SCHEME

CROSS-REFERENCE TO RELATED APPLICATIONS

This application claims priority from U.S. provisional patent application No. 61/181,565 filed on May 27, 2009, the subject matter of which is hereby incorporated by reference.

FIELD OF THE INVENTION

The present invention relates to microelectromechanical (MEMS) mass-spring-damper (MSD) systems generally. More specifically, the present invention relates to MEMS MSD systems, including MEMS gyroscopes and accelerometers, that are inertial grade and/or that use an out-of-plane (or vertical) suspension scheme and a method for fabricating such MEMS MSD systems.

BACKGROUND OF THE INVENTION

MEMS sensors, such as MEMS gyroscopes and accelerometers, are known in the art. In the past few decades, such sensors have drawn great interest. MEMS technology is attractive because, among other reasons, it enables efficient packaging, minimizes sensor area, and significantly reduces power consumption. Further, more specifically, MEMS sensors can be easily integrated with driving and sensing electronics (CMOS-compatible), such that everything can be packaged on the same chip.

Prior art MEMS sensors typically operate in the rate grade. In other words, generally speaking, such MEMS sensors have a rate resolution greater than $0.1°/hr^{1/2}$, and require 100 µg for the resolution of detection. Rate grade sensors are useful in certain applications, such as in airbag deployment systems, vehicle stabilization systems, and navigation systems in the automotive industry. But in applications where greater sensor sensitivity is required, rate grade sensors may not be suitable. For example, in applications in the space industry (such as Picosatellites and planetary landers), inertial grade sensors should be used. Inertial grade sensors generally have a rate resolution less than $0.001°/hr^{1/2}$, and may require fewer than 4 µg for the resolution of detection.

Prior art MEMS sensors may typically operate in the rate grade due to the configuration of suspensions in the sensor. Typically, such MEMS sensor use in-plane (or horizontal) suspensions (which may be attributable, at least in part, to the fact that such configuration makes it easier and more cost-effective to fabricate such MEMS sensors). The use of in-plane suspensions, however, makes it difficult to obtain inertial grade operation. This may be due to a number of reasons. For example, with such configuration, the suspensions and the proof mass are geometrically coupled to one another. In other words, the dimensions of the suspensions cannot be modified without affecting the geometry of the proof mass. Such configuration also limits the proof mass area fill factor of the sensor (or, in other words, the ratio between the area occupied by the proof mass and the total area of the sensor). This may in turn limit the potential size of the proof mass. Reducing the size of the proof mass may result in, among other things, a degraded Brownian noise floor, an increase in the minimum detectable angular rate, and a worsening of output signal sensitivity to input angular rate, as well as a decease in signal-to-noise ratio (SNR). Further, in such arrangement, out-of-plane deflection may be suppressed, which may, in certain instances, detrimentally affect performance.

The use of out-of-plane suspensions in MEMS sensors, however, significantly improves sensor performance, enabling MEMS sensors to achieve inertial grade operation. Such configuration may do so for a number of reasons. For example, the configuration decouples the suspensions from the proof mass, allowing the dimensions of the suspensions to be optimized without affecting the space available for the proof mass, and, further, significantly improves the proof mass area fill factor of the sensor, as well as the volume fill factor. Such configuration permits a larger proof mass and reduces the resonance frequency and Brownian noise floor, as well as improves the mechanical quality factor, the output signal sensitivity to input angular rate, and SNR.

For the aforementioned reasons and others, there is a need in the art for MEMS sensors (including MEMS gyroscopes and accelerometers) that are inertial grade and/or that use out-of-plane (or vertical) suspensions, as well a method for fabricating such MEMS sensors.

SUMMARY OF THE INVENTION

Novel MEMS MSD systems, which use out-of-plane suspensions, are presented. In some embodiments, such MEMS MSD systems may be inertial grade.

An embodiment of a MEMS gyroscope of the present invention is also presented, and may be comprised of a shared proof mass, one or more anchors, one or more movable combs, and a plurality of suspensions, wherein said suspensions are out-of-plane with said shared proof mass. In some embodiments, such MEMS gyroscope may be inertial grade.

An embodiment of a MEMS accelerometer of the present invention is also presented, and may be comprised of a proof mass, one or more anchors, and a plurality of suspensions, wherein said suspensions are out-of-plane with said proof mass. In some embodiments, such MEMS accelerometer may be inertial grade.

A manufacturing process for fabricating out-of-plane suspensions in MEMS MSD systems is also presented. In an embodiment of such fabrication process, the first two sides of an out-of-plane suspension may be realized by etching from a top surface of a substrate, and the other two sides of said out-of-plane suspension may be realized by etching from a bottom surface of said substrate. Embodiments of fabrication processes for embodiments of a MEMS gyroscope and a MEMS accelerometer of the present invention are also presented, as applications of the aforementioned manufacturing process for fabricating out-of-plane suspensions.

BRIEF DESCRIPTION OF THE FIGURES

FIG. 1a is an angled, top view of an embodiment of a MEMS gyroscope of the present invention.

FIG. 1b is an angled, top view of another embodiment of a MEMS gyroscope of the present invention.

FIGS. 1c and 1d illustrate how driving and/or sensing electronics may be connected to a MEMS gyroscope of the present invention.

FIG. 2b is a front view of an embodiment of a MEMS accelerometer of the present invention.

FIG. 2c is a front view of another embodiment of a MEMS accelerometer of the present invention.

FIGS. 5a through 5l illustrate cross-sections of various steps in an embodiment of the manufacturing process for an embodiment of a MEMS gyroscope of the present invention.

FIGS. 6a through 6l illustrate cross-sections of various steps in an embodiment of the manufacturing process for an embodiment of a MEMS accelerometer of the present invention.

DETAILED DESCRIPTION

Gyroscope

Figure 1C:
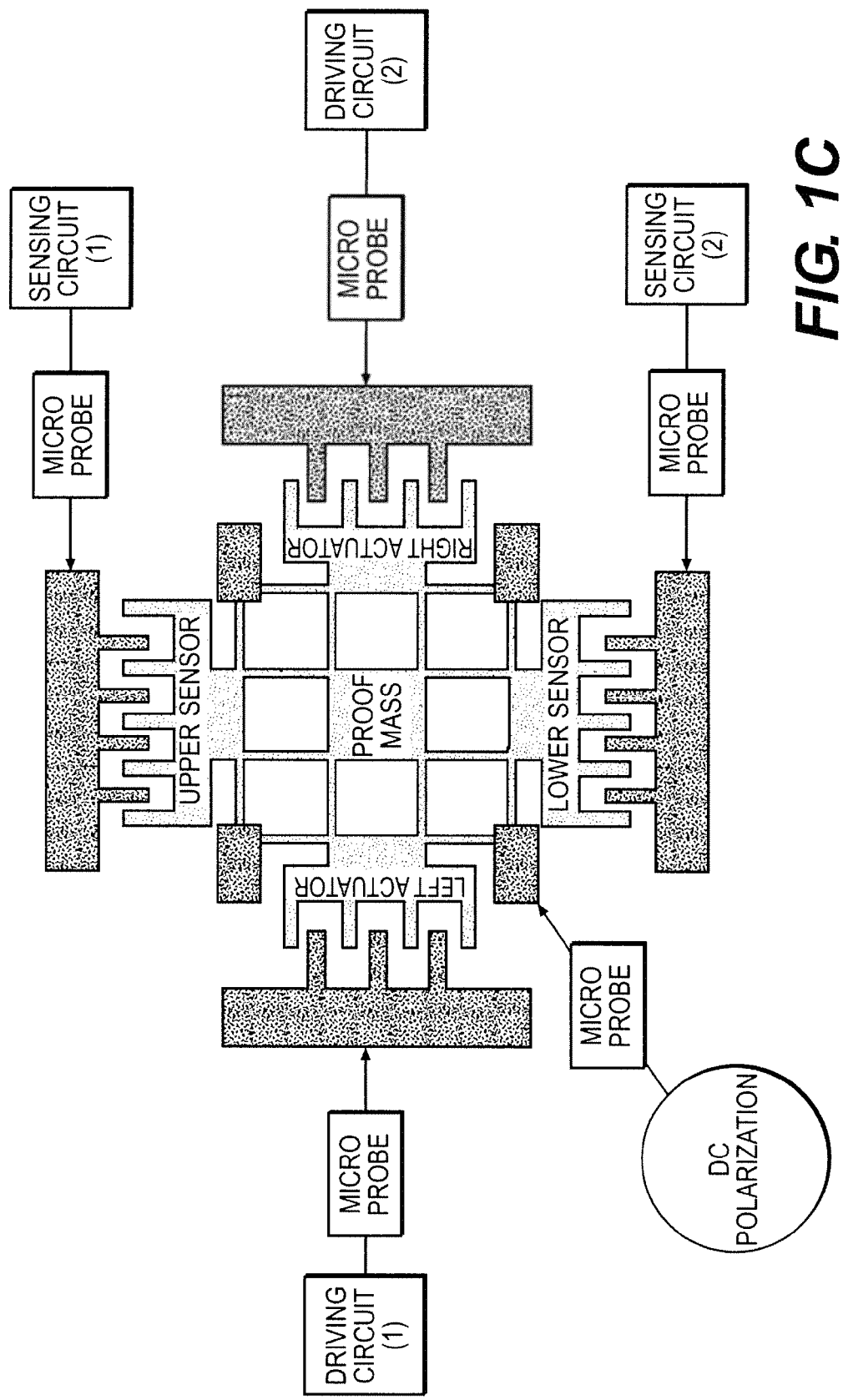

FIG. 1a illustrates an embodiment of a MEMS gyroscope of the present invention. The gyroscope 10 may comprise, among other things, a shared proof mass 20; first, second, third, and fourth anchors 30a, 30b, 30c, 30d; first and second drive combs 40a, 40b; first and second sense combs 50a, 50b; and a plurality of suspensions 60.

The shared proof mass 20 may be located at the center of said gyroscope 10, and may have first, second, third, and fourth edges and first, second, third, and fourth corners. In some embodiments, the shared proof mass 20 may be square-shaped. The shared proof mass 20 (as well as the other components of the gyroscope 10) may be made of any dielectric substance. In some embodiments, the shared proof mass 20 may be comprised of crystalline Silicon (Si). Also in some embodiments, there may be a layer of oxide dividing the shared proof mass 20 into an upper and a lower mass. During operation of the gyroscope 10, the shared proof mass 20 may vibrate. Where there is a rotation of the gyroscope 10, the shared proof mass 20 may experience a "secondary vibration," or vibrate in an orthogonal direction. Such secondary vibrations may be used to determine the angular velocity (and thus angular displacement) of the object or device to which the gyroscope 10 is affixed or connected.

Each anchor 30a-d of the gyroscope 10 may lie parallel with an edge of said shared proof mass 20, such that, for example, the first anchor 30a lies parallel with the first edge of the shared proof mass 20. Each anchor 30a-d may have a first corner and a second corner. In some embodiments, the anchors 30a-d may have the same range of length and thickness as the shared proof mass 20, and further may each have a width ranging from 200 μm to 400 μm. Varying the dimensions of said anchors should generally not affect the performance of the gyroscope 10. In some embodiments, the anchors 30a-d may be made of crystalline Si. The anchors 30a-d may be used to fix, or "anchor," the gyroscope 10 and/or the components thereof to the substrate on which the gyroscope 10 rests.

Suspensions 60 may extend out-of-plane, or vertically or upward, from the first and second corners of the anchors 30a-b. Suspensions 60 may similarly extend out-of-plane from the first, second, third, and fourth corners of the shared proof mass 20. Thus, in some embodiments, said shared proof mass 20 may rest below the suspensions 60, and, in certain of such embodiments, in plane with the anchors 30a-b. Also in some embodiments, said suspensions 60 may have a cross-section ranging from 5×5 μm² to 100×100 μm², and, in certain of such embodiments, have a cross-section of 10×70 μm². Also in some embodiments, said suspensions 60 may have a length ranging from 150 μm to 600 μm, and, in certain of such embodiments, have a length of 250 μm. The cross-sectional dimensions and the length of the suspensions 60 may affect the stiffness constant of said suspensions 60, which may affect such sensor's resonant frequency, support losses, quality factor, and/or noise level, as well as rotation rate. Generally speaking, increasing the size of a suspension's 60 cross-section increases its stiffness, and increasing a suspension's 60 length decreases its stiffness. The cross-section and length of the suspensions 60 should be designed so as to minimize suspension 60 stiffness. In some embodiments, the suspensions 60 may be made of crystalline Si.

Said suspensions 60 may provide support for the movable combs. In some embodiments, said movable combs may be comprised of first and second drive combs 40a-b and first and second sense combs 50a-b. The first and second drive combs 40a-b may have first, second, third, and fourth corners. Similarly, the first and second sense combs 50a-b may have first, second, third, and fourth corners. Said suspensions 60, extending from said anchors 30a-d and said shared proof mass 20, may connect with said corners of said combs 40a-b, 50a-b, with said combs 40a-b, 50a-b resting on top of said suspensions 60.

In some embodiments, the drive combs 40a-b and sense combs 50a-b may have the same dimensions as one another, and the gyroscope 10 may be a three-fold-symmetric gyroscope (3FSG). In other words, the gyroscope 10 may have three geometrical symmetries: about the center line, parallel to the X-axis; about the center line, parallel to the Y-axis; and about the diagonal of the gyroscope 10. Such symmetry aids in matching the driving and sense modes of said gyroscope 10. The drive combs 40a-b may be used for the actuation of the spring-mass-damper system (for example, in the X-direction). When a rotational rate is applied (for example, in the Z-direction), the sense combs 50a-b may be used to sense the Coriolis force in the cross-product direction (for example, in the Y-direction). In some embodiments, the combs 40a-b, 50a-b may be made of crystalline Si.

The total proof mass of the gyroscope 10 may be the shared proof mass 20 plus two combs 40a-b, 50a-b. In some embodiments, the total drive proof mass may be the shared proof mass 20 plus the first and second drive combs 40a-b, and, similarly, the total sense proof mass may be the shared proof mass 20 plus the first and second sense combs 50a-b. The total proof mass may have a length and width ranging from 100 μm to 3 mm and a thickness ranging from 10 μm to 300 μm. In certain embodiments, the total proof mass may be 1200 μm×1200 μm×200 μm, and have a proof mass area fill factor of 73.4%. Also in some embodiments, the total proof mass may have a weight ranging from 30 µg to 3 mg. In certain embodiments, the two combs 40a-b, 50a-b may comprise less than 10% of the area and weight of the total proof mass.

FIG. 1b illustrates another embodiment of a MEMS gyroscope 10' of the present invention, specifically a gimbaled MEMS gyroscope 10'. In this embodiment, four anchors 30a'-30d' are used to fix, or "anchor," said gyroscope 10' to the substrate on which the gyroscope 10' rests. Outer suspensions 60a' may then extend out-of-plane (or upwardly therefrom) to support an outer proof mass (or gimbal) 20a'. Inner suspensions 60b' may then extend out-of-plane from said outer proof mass 20a'. Resting on top of said inner suspensions 60b' may be an inner proof mass 20b'. As can be seen in FIG. 1b, in this embodiment, the proof masses 20a'-b' may rest on top of, instead of being suspended below (as in FIG. 1a), their respective suspensions 60a'-b'. In this embodiment, the outer proof mass 20a' may vibrate in the drive mode (X-axis), while the inner proof mass 20b' may vibrate in the sense mode (Y-axis). Such configuration may decouple sensed motion in two orthogonal directions.

Accelerometer

Figure 2A:
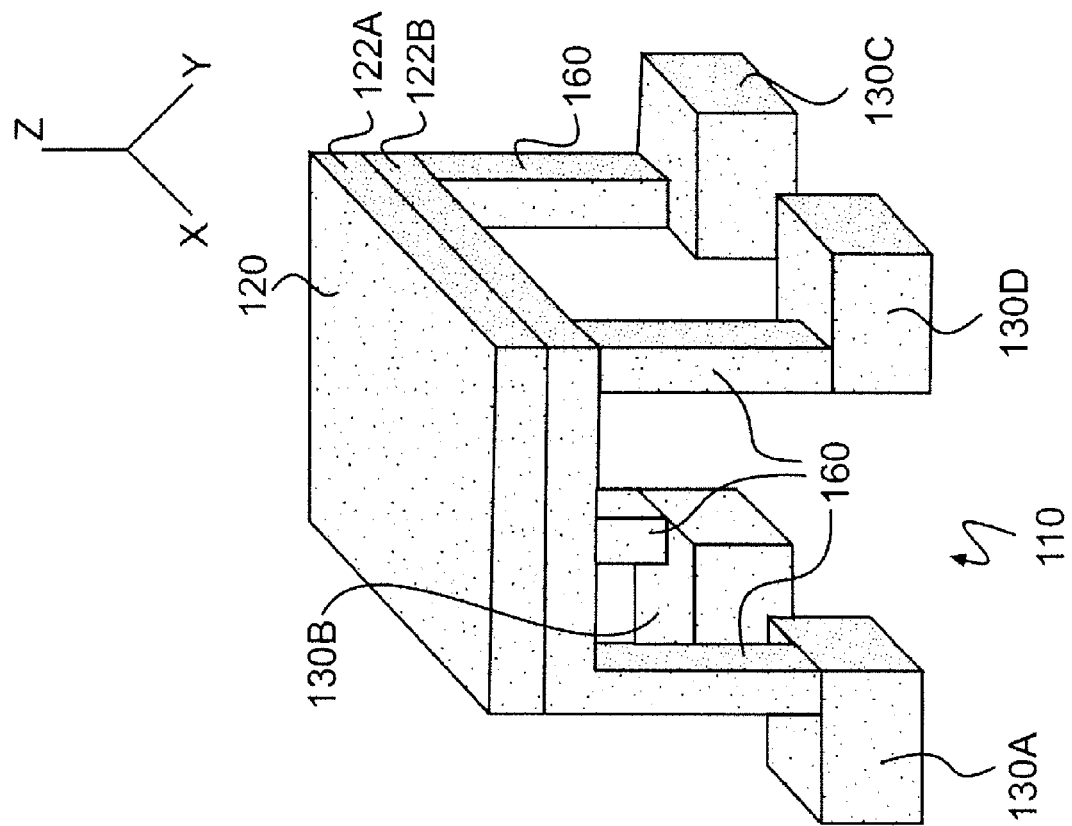
FIG. 2a is an angled, top view of an embodiment of a MEMS accelerometer of the present invention.
Figure 2D:
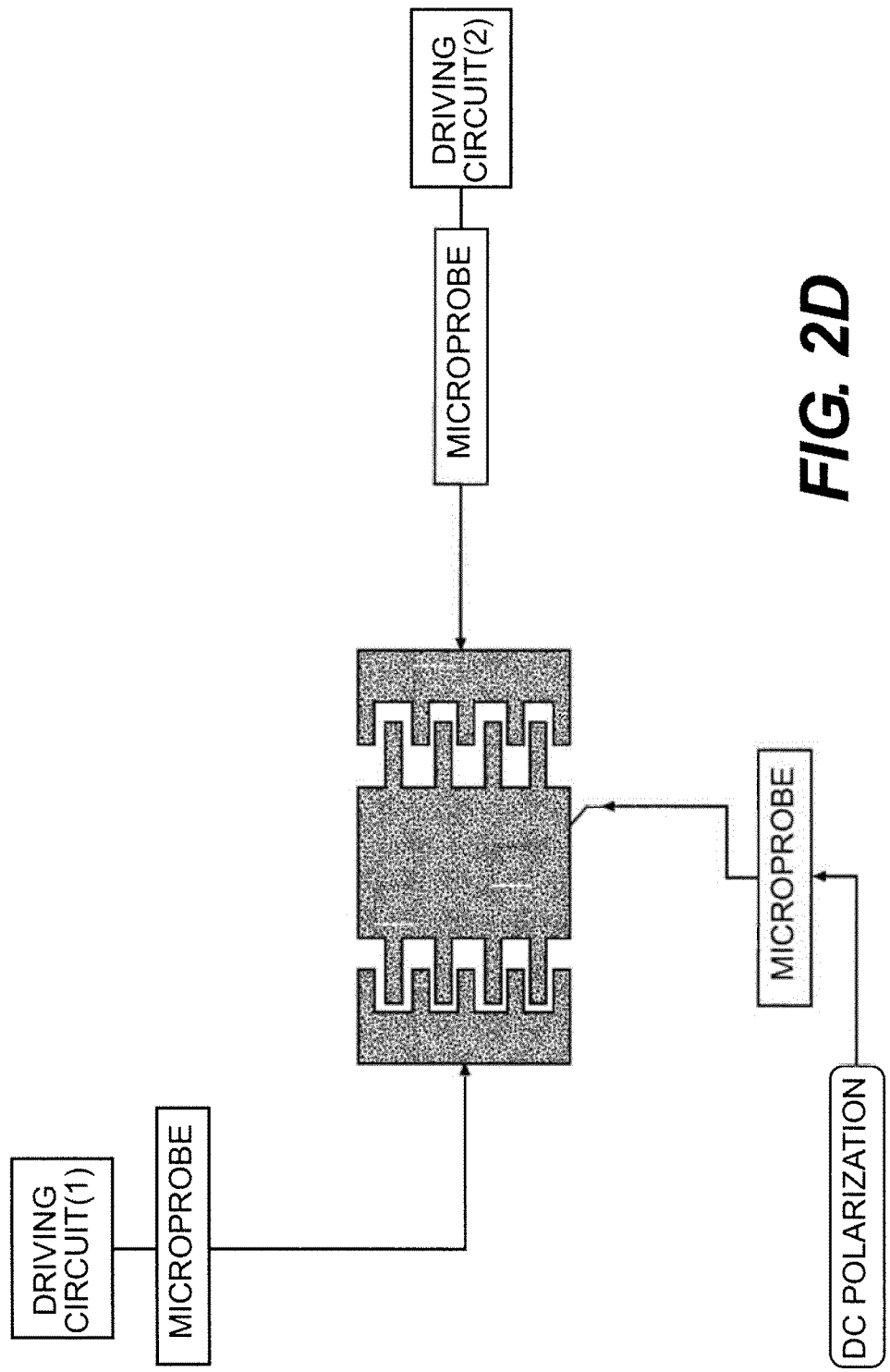
FIG. 2d illustrates how driving and/or sensing electronics may be connected to a MEMS accelerometer of the present invention.

FIG. 2a illustrates an embodiment of a MEMS accelerometer of the present invention. The accelerometer 110 may comprise, among other things, a proof mass 120; first, second, third, and fourth anchors 130a, 130b, 130c, 130d; and a plurality of suspensions 160.

The proof mass 120 may be located at the center of said accelerometer 110, and may have first, second, third, and fourth corners. In some embodiments, there may be a layer of oxide dividing the proof mass 120 into an upper mass 122a and a lower mass 122b. Also in some embodiments, the upper mass 122a and lower mass 122b may have a length and width ranging from 100 µm to 3 mm, as well as a thickness ranging from 10 µm to 300 µm. Also in some embodiments, the proof mass 120 may have a weight ranging from 30 µg to 3 µg. As with the gyroscope, increasing the weight of the proof mass 120 may improve the sensitivity of the accelerometer 110, while increasing the dimensions of the proof mass 120 may detrimentally affect performance. The proof mass 120 (as well as the other components of the accelerometer 110) may be made of any dielectric substance. In some embodiments, the proof mass 120 may be made of crystalline Si. Where the object or device to which the accelerometer 110 is affixed or connected to moves, the proof mass 120 will vibrate or be displaced. Such vibration or displacement may be used to determine the angular acceleration of such object or device.

Each anchor 130a-d of the accelerometer 110 may lie at or around a corner of the proof mass 120, such that, for example, the first anchor 130a lies at or around the first corner of the proof mass 120. Each anchor 130a-d may have a first corner. Varying the dimensions of said anchors 130a-d should generally not affect the performance of the accelerometer 110. In some embodiments, the anchors 130a-d may be made of crystalline Si. The anchors 130a-d may be used to fix, or "anchor," the accelerometer 110 and/or the components thereof to the substrate on which the accelerometer 110 rests.

Suspensions 160 may extend out-of-plane, or vertically or upward, from the first corners of the anchors 130a-d, and may connect with the first, second, third, and fourth corners of the proof mass 120. Thus, in some embodiments, the proof mass 120 may rest on top of said suspensions 160. Such configuration is consistent with the function of an accelerometer, which need only sense in a single mode. In some embodiments, said suspensions 160 may have a cross-section ranging from 5×5 µm² to 100×100 µm². Also in some embodiments, said suspensions 160 may have a length ranging from 250 µm to 600 µm. The cross-sectional dimensions and length of the suspensions 160 may affect the stiffness constant of said suspensions 160, as such dimensions and length similarly affect the gyroscope 10 (as described above), and, more specifically, may affect the resolution in acceleration. In some embodiments, the suspensions 160 may be made of crystalline Si.

FIGS. 2b and 2c illustrate front views of two embodiments of a MEMS accelerometer of the present invention. FIG. 2b, like FIG. 2a, illustrates an embodiment where the proof mass 120 rests on the suspensions 160. FIG. 2c illustrates another embodiment, where the suspensions 160 are connected directly to the upper mass 122a, and where the lower mass 122b is smaller than, and thus "hangs" below, said upper mass 122a. In some embodiments, said lower mass 122b may be 100 µm to 200 µm shorter in length than said upper mass 122a. Such configuration may be achieved during the selective etching in the fabrication process described below. As can be seen by a comparison of FIGS. 2b and 2c, the configuration in FIG. 2c allows for an increased suspension 160 length. FIG. 2c further demonstrates the geometrical decoupling of the suspensions 160 and the proof mass 120, a benefit of the present invention.

Quad-Mass MEMS Gyroscopes and Other Sensors

Figure 3A:
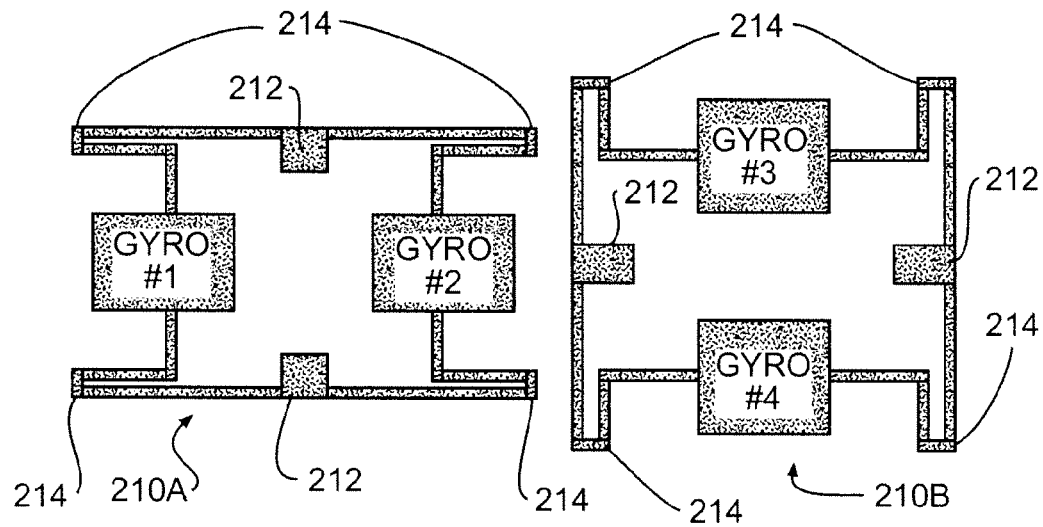
FIG. 3a is an example of a potential quad-mass sensing scheme using prior art dual-mass gyroscopes.
Figure 3B:
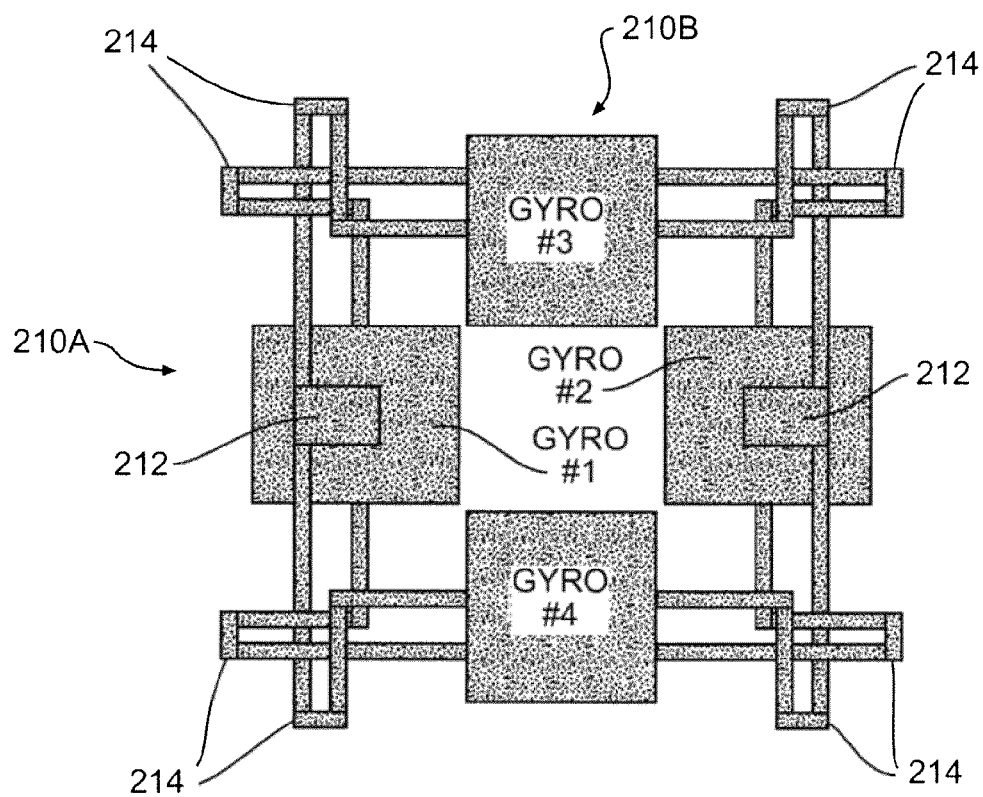
FIG. 3b illustrates how prior art dual-mass gyroscopes cannot be "stacked" next to one another in a quad-mass sensing scheme.
Figure 3C:
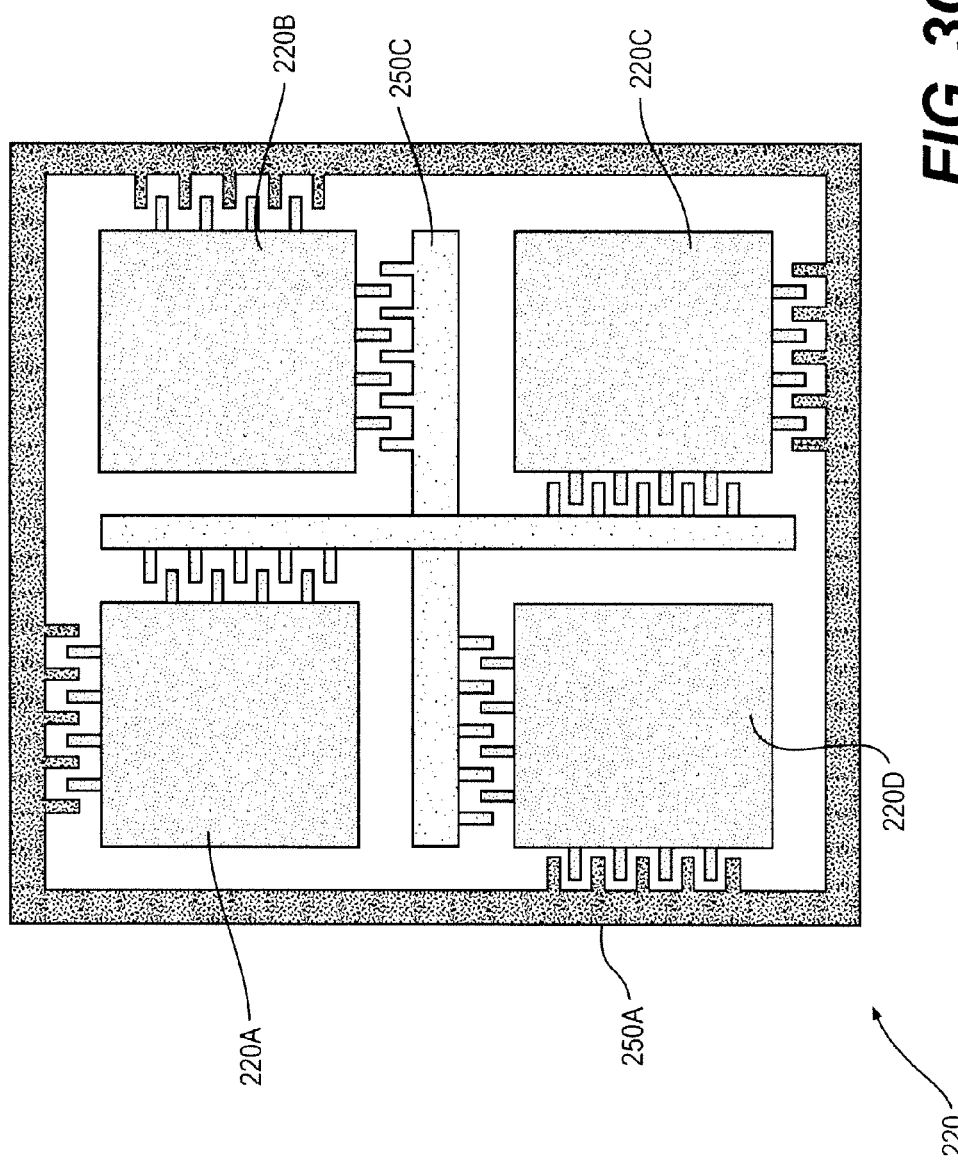
FIGS. 3c and 3d are two embodiments of a quad-mass sensing scheme of the present invention, in which a quad-mass gyroscope is linearly driven and linearly sensed.
Figure 3D:
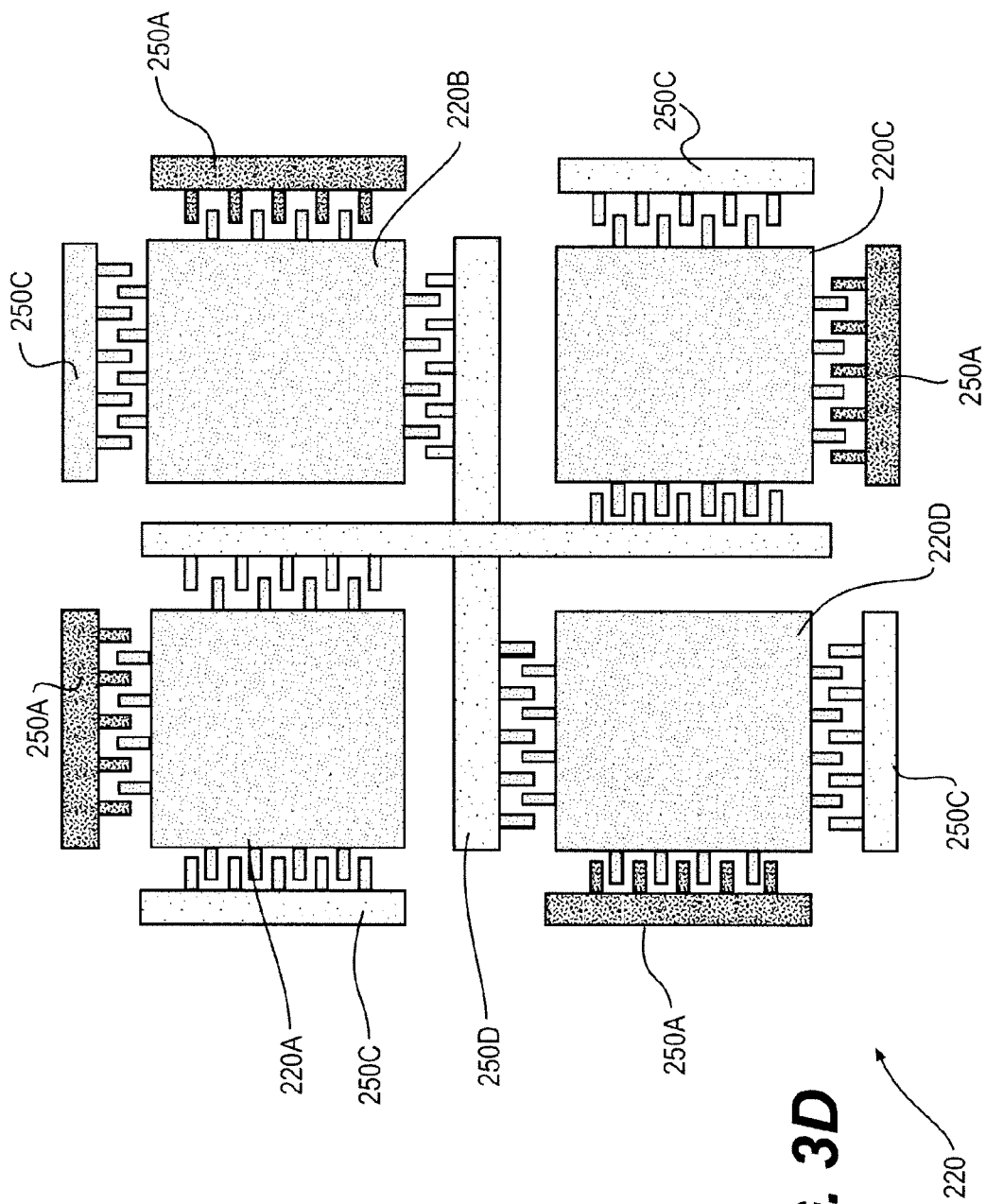
Figure 3E:
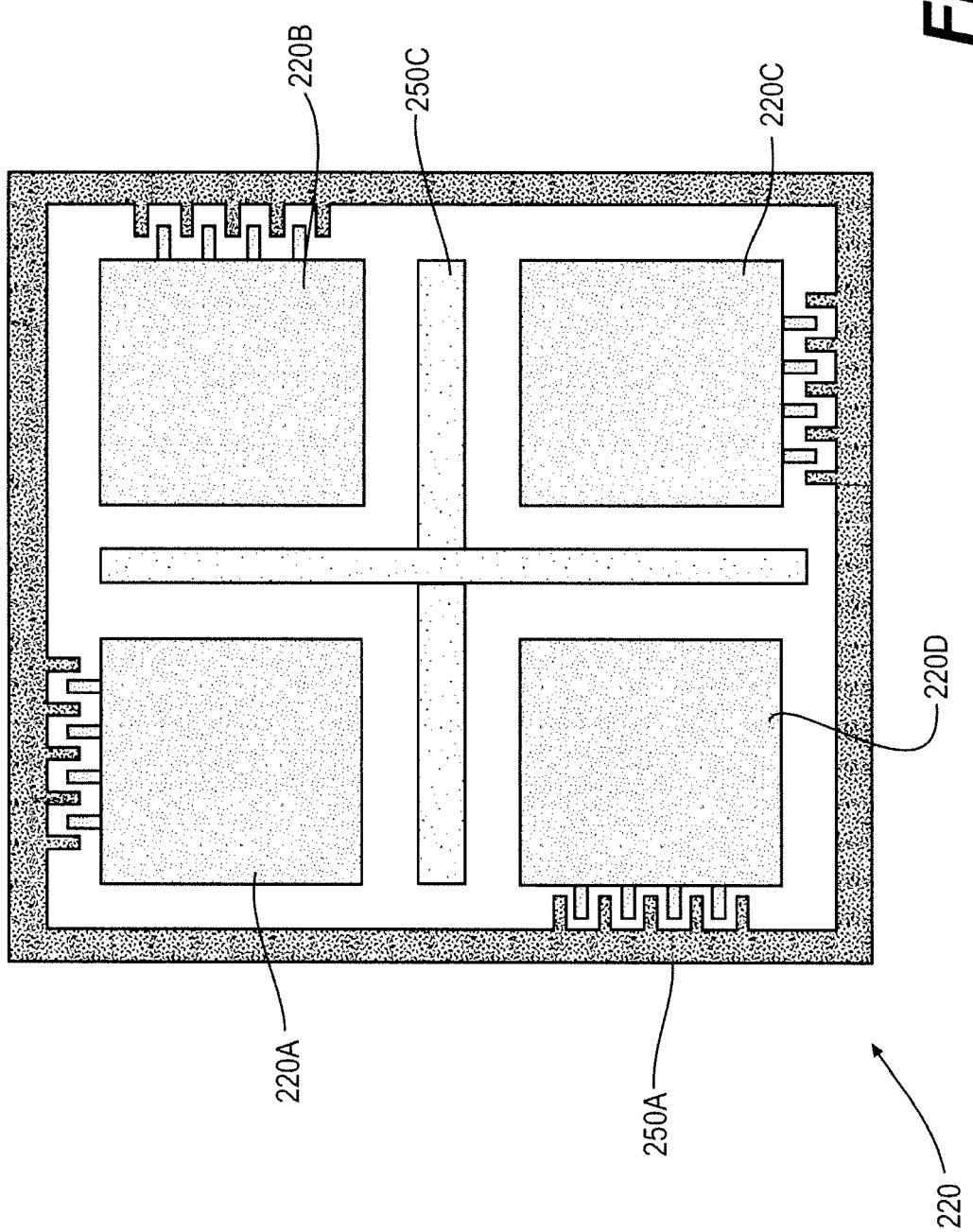
FIGS. 3e and 3f are two embodiments of a quad-mass sensing scheme of the present invention, in which a quad-mass gyroscope is linearly driven but non-linearly sensed.
Figure 3F:
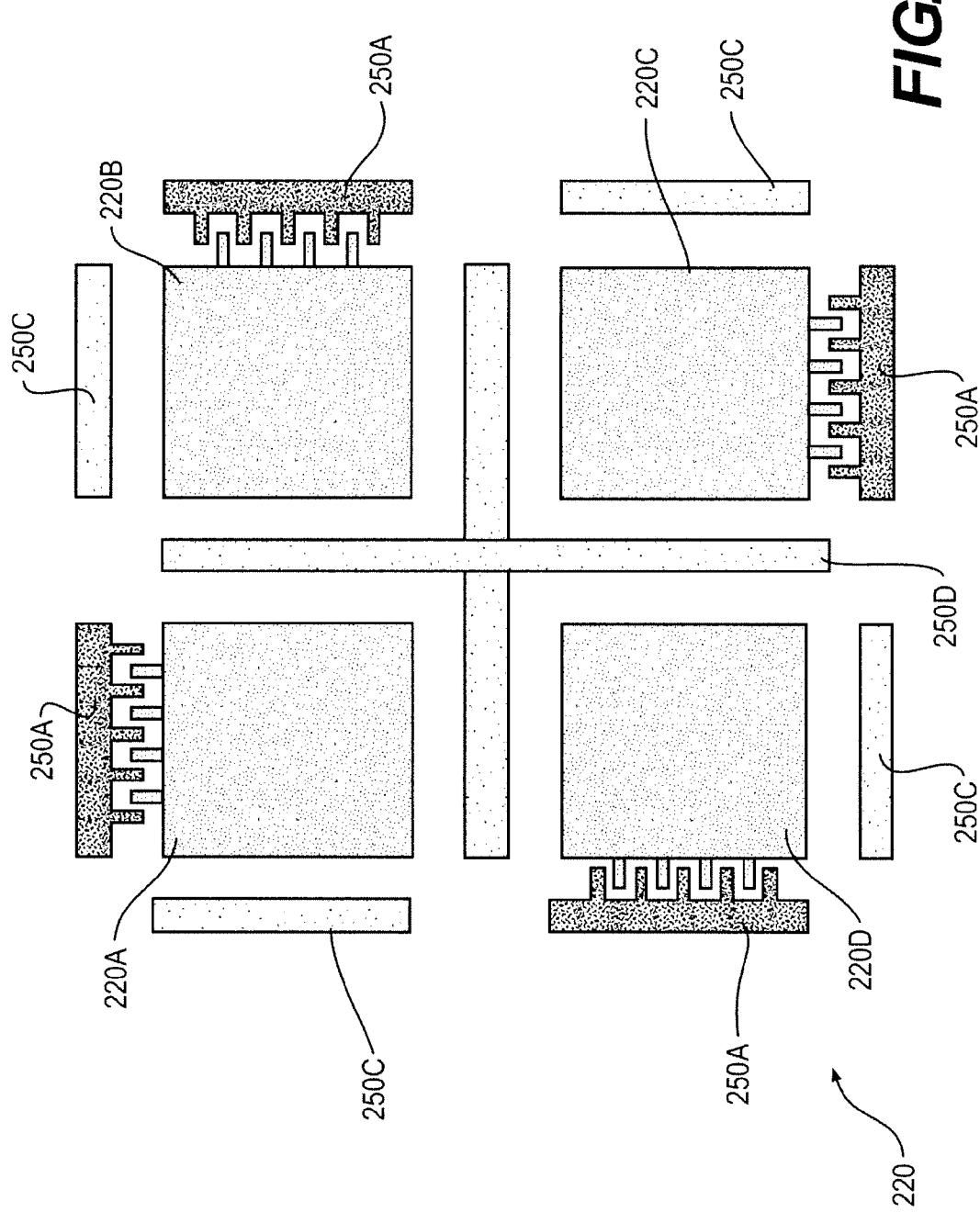
Figure 3G:
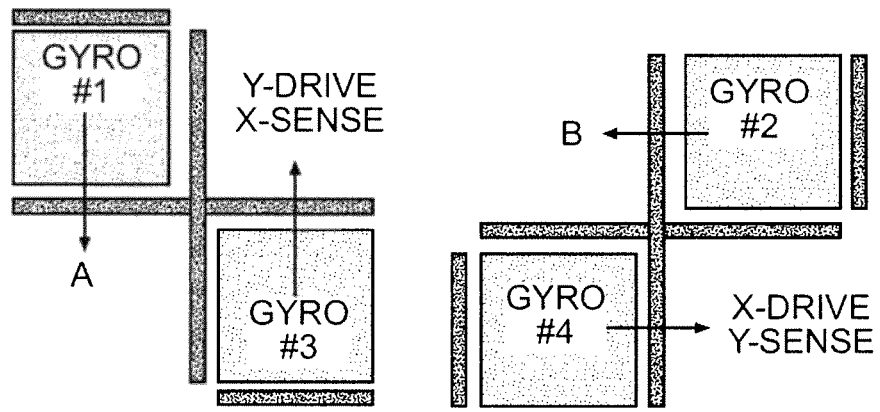
FIG. 3g illustrates the sensing directionality for the quad-mass sensing schemes in FIGS. 3c through 3f.

The use of out-of-plane (or vertical) suspensions provides a further benefit with respect to multi-mass sensors. By way of example, multi-mass gyroscopes may be implemented by situating two prior art dual-mass gyroscopes 210a, 210b next to each other, facing in opposite directions, as can be seen in FIG. 3a. (The anchors are labeled as 212, and the in-plane suspensions are labeled as 214.) There are numerous drawbacks to such arrangement. For example, this arrangement doubles the overall area that the sensors (or gyroscopes) occupy. Further, such prior art dual-mass gyroscopes 210a-b must be wired to one another to share sensory information. Such drawbacks cannot be alleviated using such prior art dual-mass gyroscopes because, as can be seen from FIG. 3b, such gyroscopes 210a-b cannot be "stacked" next to one another due to the presence of the in-plane (or horizontal) suspensions 214, which would interfere with each other.

As can be from FIGS. 3c through 3f, by contrast, the use of out-of-plane suspensions permits four sensors (including, without limitation, MEMS gyroscopes and accelerometers) of the present invention to be placed one next to the other. By way of example, in a quad-mass gyroscope of the present invention, four gyroscopes 220a, 220b, 220c, 220d of the present invention may be placed one next to the other to create a dual-differential sensing scheme. The gyroscopes 220a-d may share sense combs and/or drive combs (and thus electrical sense and/or drive signal circuitry). With respect to FIGS. 3c and 3d, such quad-mass gyroscopes 220 are linearly driven and linearly sensed. With respect to FIGS. 3e and 3f, such quad-mass gyroscopes 220 are linearly driven but non-linearly sensed. Locations of where first (driving), third (sensing), and, where applicable, fourth (sensing) signals may be found are labeled on 250a, 250c, and 250d. (A second (driving) signal is not shown, but may be connected to the gyroscopes 220a-d to provide a DC polarization voltage, as well other driving signals.) As can be seen by comparing FIGS. 3c and 3d to FIGS. 3e and 3f, the embodiments in FIGS. 3e and 3f use parallel plate capacitors with respect to the sense combs, whereas the embodiments in FIGS. 3c and 3d use comb-drive capacitors. Parallel plate capacitors may provide more sensing capacitance and capacitance changes due to displacement.

As should be obvious to one skilled in the art, the out-of-plane (or vertical) suspension scheme presented herein is not limited to use in respect of gyroscopes, accelerometers, and quad-mass gyroscopes, but rather can be used in other MEMS sensory systems. Specifically, such out-of-plane suspension scheme can be used in any MEMS MSD system (including, by way of example and without limitation, radio frequency MEMS resonators and MEMS-based mechanical filters), as MSD systems use a mass attached to a suspension to detect and/or determine sensory information.

Method of Fabrication

The MEMS MSD systems of the present invention, including MEMS gyroscopes and accelerometers, can be fabricated using various types of micromachining. By way of example, various type of bulk micromachining may be used, including, without limitation, deep reactive ion etching (DRIE), LIGA, and electroforming. Bulk micromachining provides a number of advantages over surface micromachining. For example, bulk micromachining allows for a sensor with a larger proof mass and improved capacitance. Also by way of example, with surface micromachining, the lateral (in-wafer-plane) dimensions are generally tighter than those allowed by bulk micromachining techniques, in part due to the inherent mechanical stresses and stress gradient of surface micromachined structural layers.

Figure 4A:
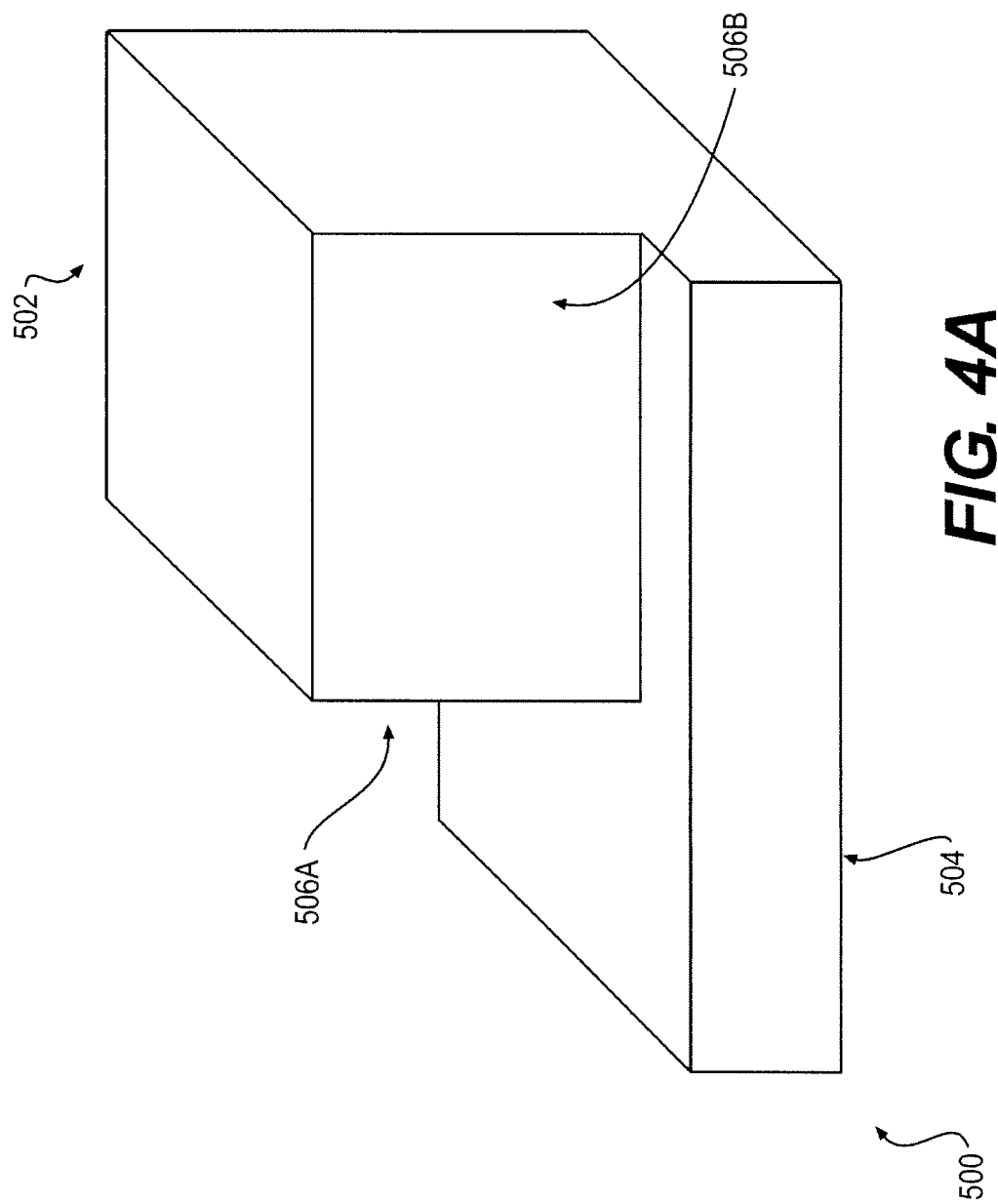
FIGS. 4a through 4b illustrate steps that may be used to realize vertical suspensions in a MEMS MSD system.
Figure 4B:
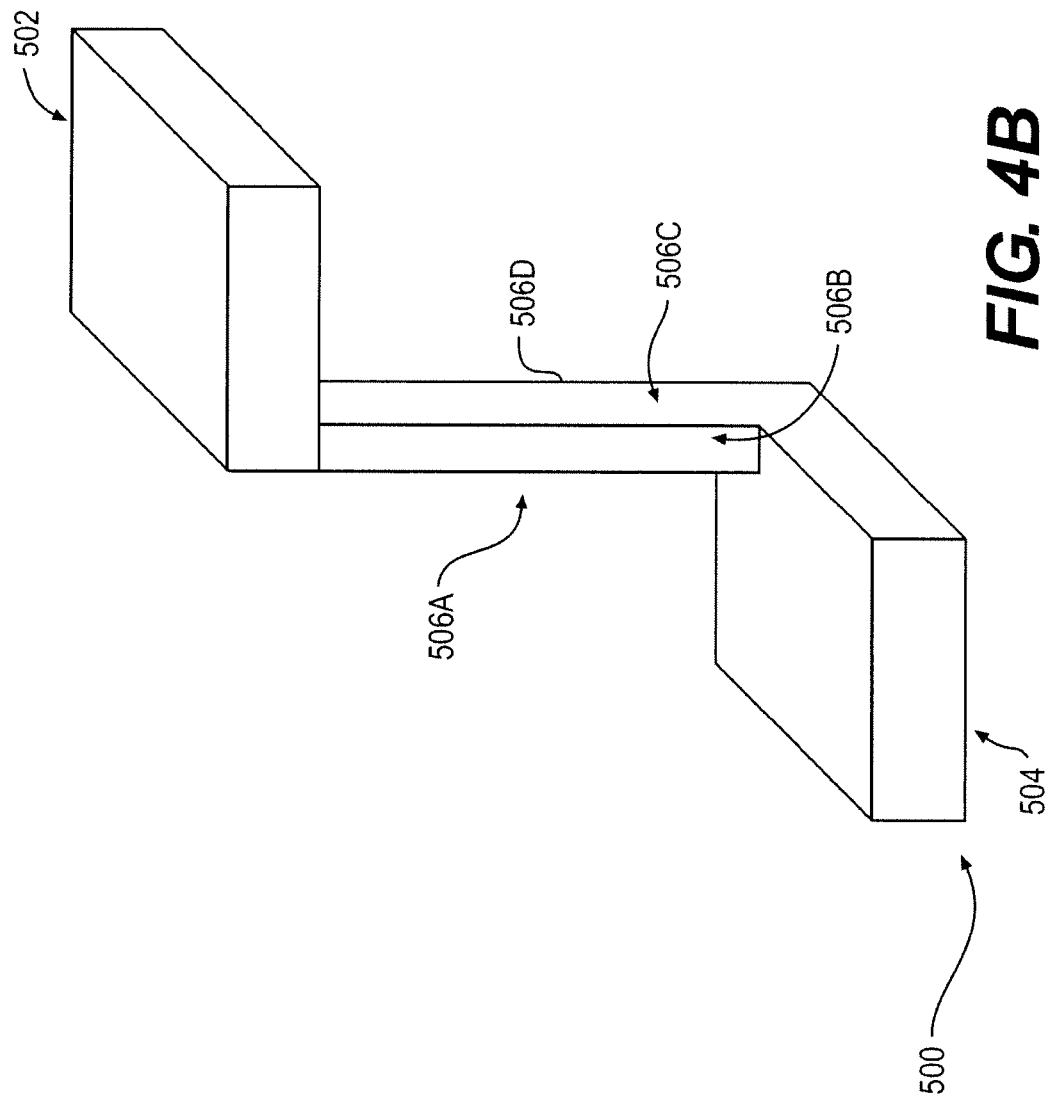

As previously described, the MEMS MSD systems of the present invention use out-of-plane suspensions. The following steps represent an embodiment of the manufacturing process that may be used to fabricate such out-of-plane suspensions in such MEMS MSD systems. First, a dielectric substrate 500 may be etched from the top surface 502 to form the first two sides of an out-of-plane suspension 506a-b, as can be seen in FIG. 4a. In some embodiments, said first two sides of said out-of-plane suspension 506a-b may be patterned using DRIE. Second, said dielectric substrate 500 may be etched from the bottom surface 504 to form the other two sides of said out-of-plane suspension 506c-d, as can be seen in FIG. 4b. In some embodiments, said other two sides of said out-of-plane suspension 506c-d may also be patterned using DRIE. The cross-section and length of said suspension may be dictated by the desired performance characteristics of the applicable MEMS MSD system.

Methods of fabricating an embodiment of a MEMS gyroscope of the present invention and an embodiment of a MEMS accelerometer of the present invention will now be presented, as applications of the fabrication process described in the preceding paragraph. Although the following methods are presented in a specific sequence, other sequences may be used and certain steps omitted or added. It should be noted that the shapes of any etchings, and the dimensions of such shapes, as well as the shapes and depths of any deposited metal, will be dictated by the desired dimensions and shapes of the sensor and the components thereof, as will be obvious to one having ordinary skill in the art.

MEMS Gyroscope

Figure 5A:
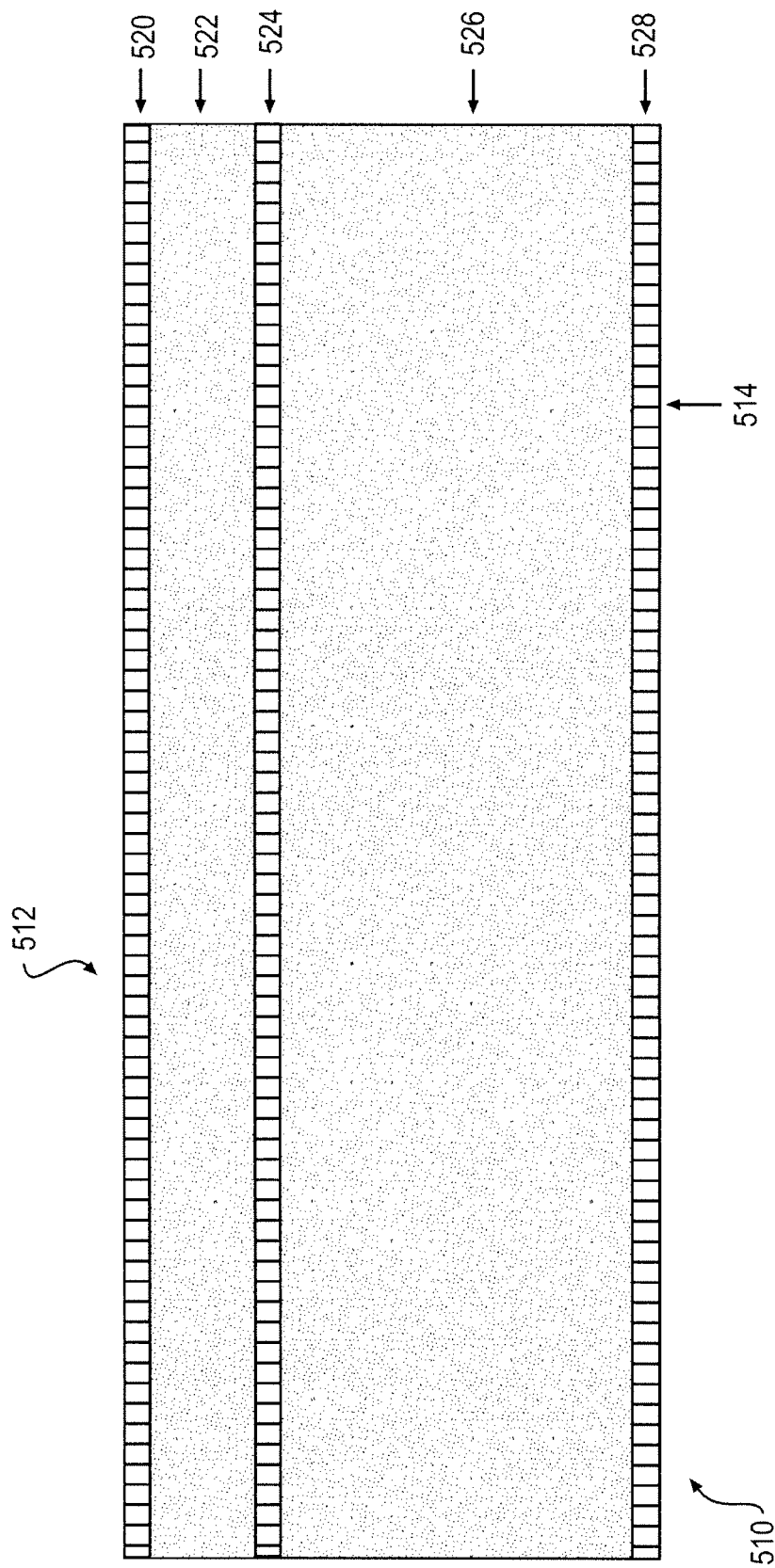

As shown in FIG. 5a, a substrate 510, such as silicon on insulator (SOI) substrate, having a top surface 512 and a bottom surface 514 may be provided. In some embodiments, said substrate 510 may, starting from the top surface 512, have the following layers: a first layer of oxide 520 having a thickness of 4 µm; a first layer of silicon 522 having a thickness of 100 µm; a second layer of oxide 524 having a thickness of 4 µm; a second layer of silicon 526 having a thickness of 570 µm; and a third layer of oxide 528 having a thickness of 4 µm. Said oxide layers 520, 524, 528 may each act as a sacrificial layer during etching.

Figure 5B:
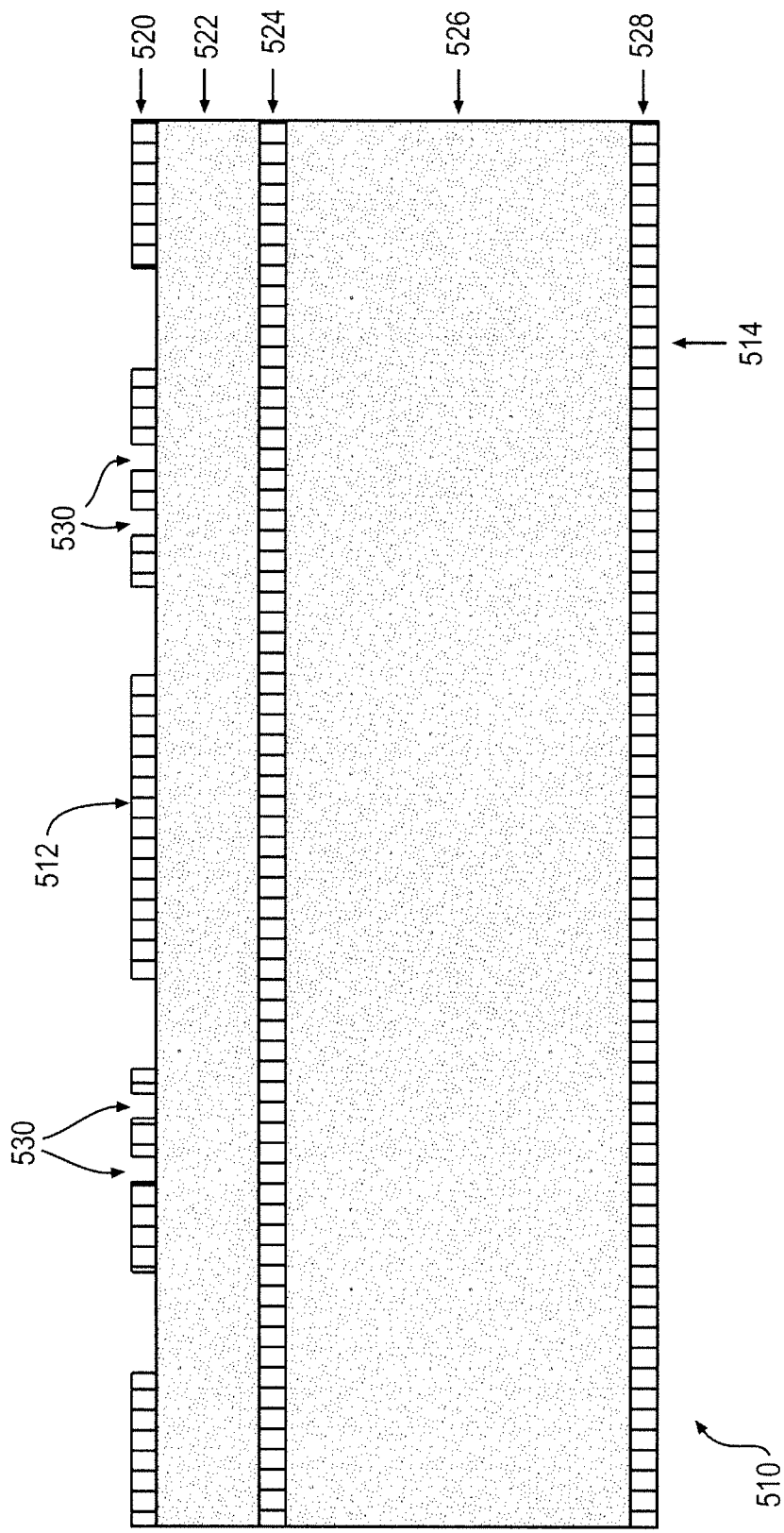
Figure 5C:
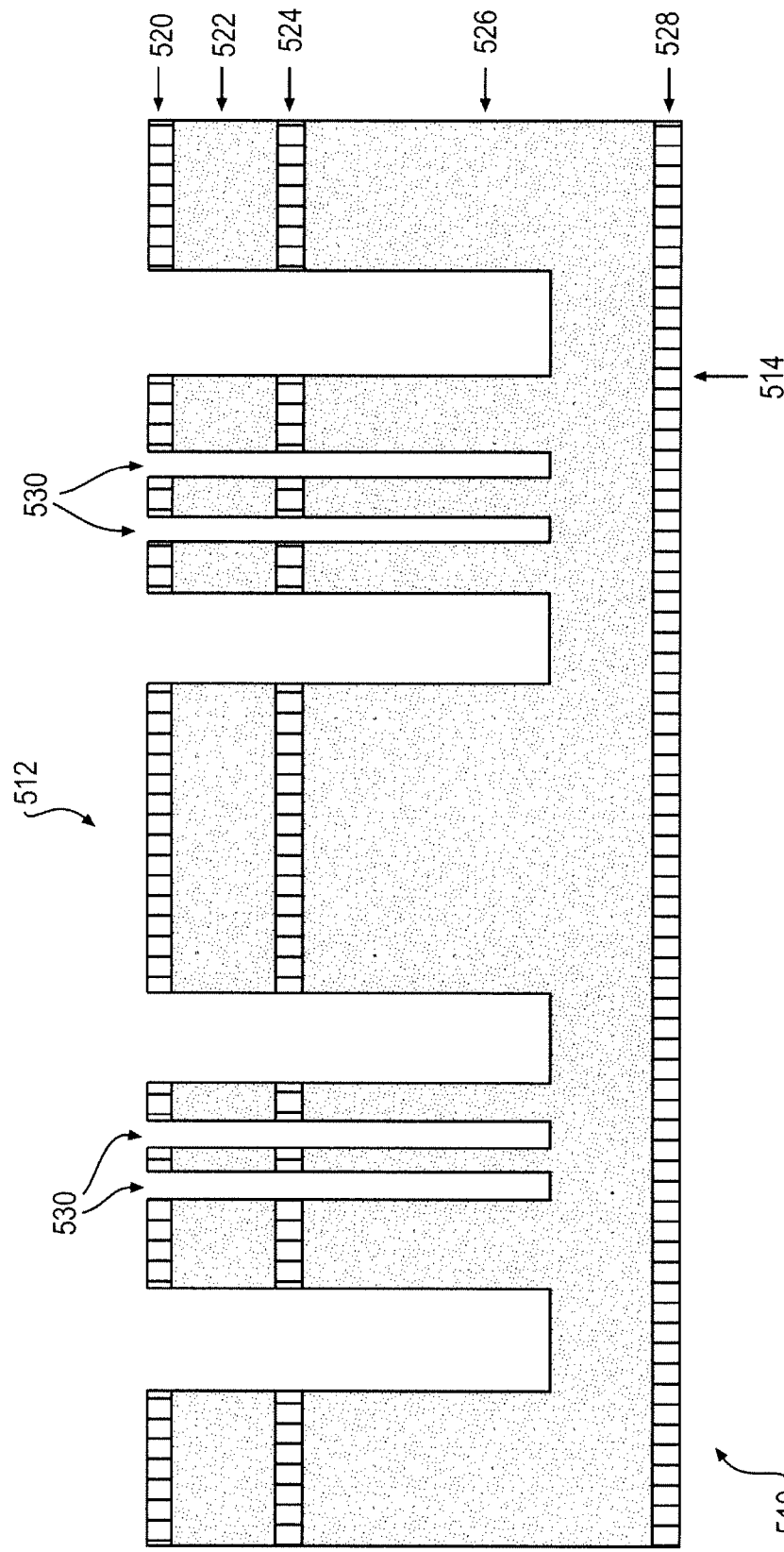

As shown in FIGS. 5b and 5c, the top surface 512 of the substrate 510 may be selectively etched to define the shared proof mass, the movable combs, and the out-of-plane suspensions, as well the openings 530 that may be used to short circuit portions of certain gyroscope components that are separated by the second layer of oxide 524. Generally speaking, said openings 530 should be narrow enough to allow for a conformal coating of a conductive metal and to permit a trench that may be etched therethrough to close completely when said metal is deposited. By depositing a conductive material in the trenches that may be etched in said openings 530, said portions of said certain gyroscope components may be "short circuited" and thus electrically connected to one another. Contact pads for the shared proof mass may also be etched in these steps. Signals sensed by the shared proof mass through the out-of-plane suspensions and down to the sensor's anchors may be transmitted to such contact pads. In some embodiments, the etching may be to a depth of 130 µm to 140 µm, thereby etching through said first layer of oxide 520, said first layer of silicon 522, said second layer of oxide 524, and a portion of said second layer of silicon 526.

Figure 5D:
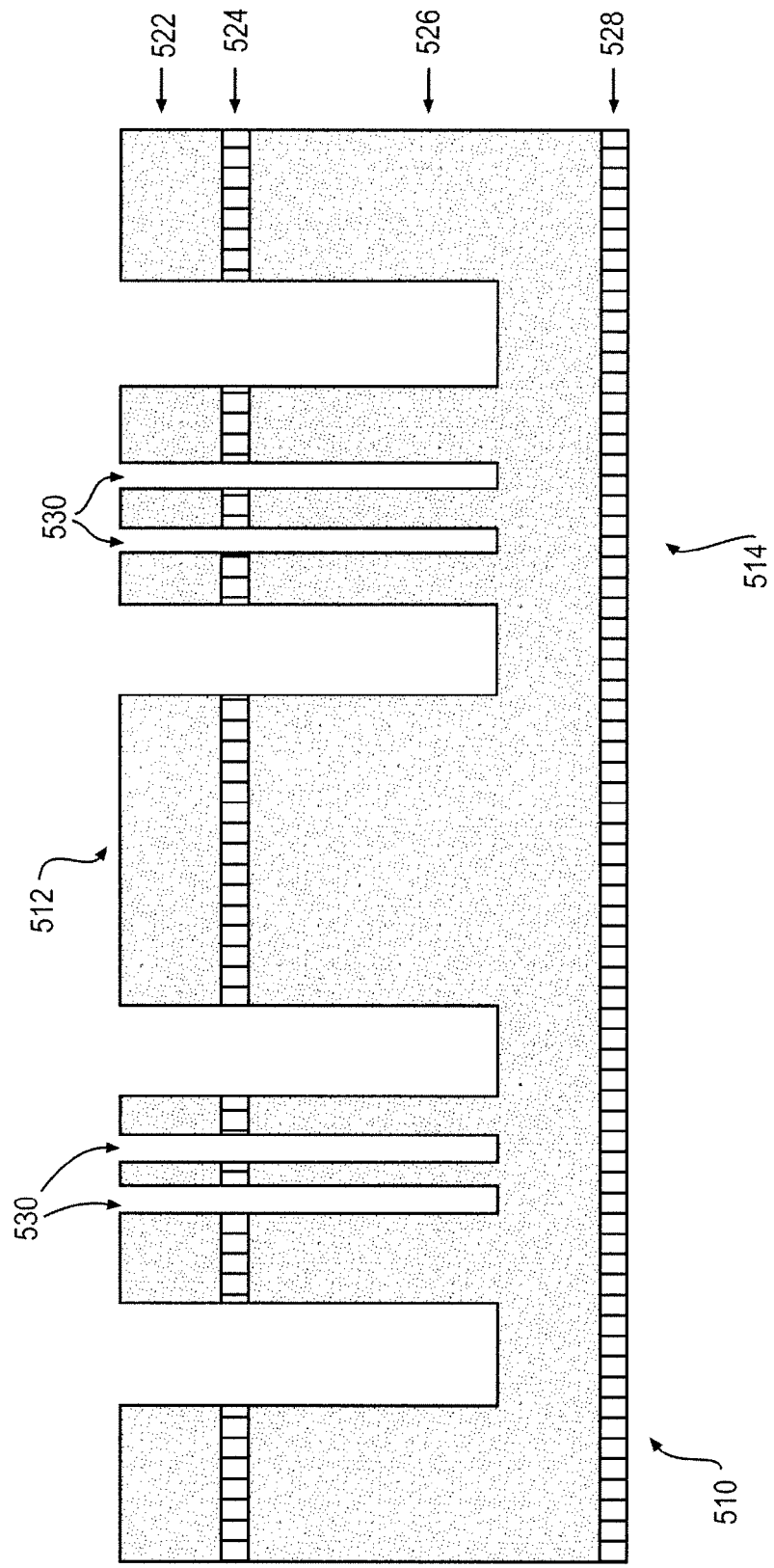

As shown in FIG. 5d, the top surface 512 of the substrate 510 may be further etched to remove the remainder of the first oxide layer 520. This will prepare the substrate 510 for the deposition of the conductive metal as described in the next paragraph.

Figure 5E:
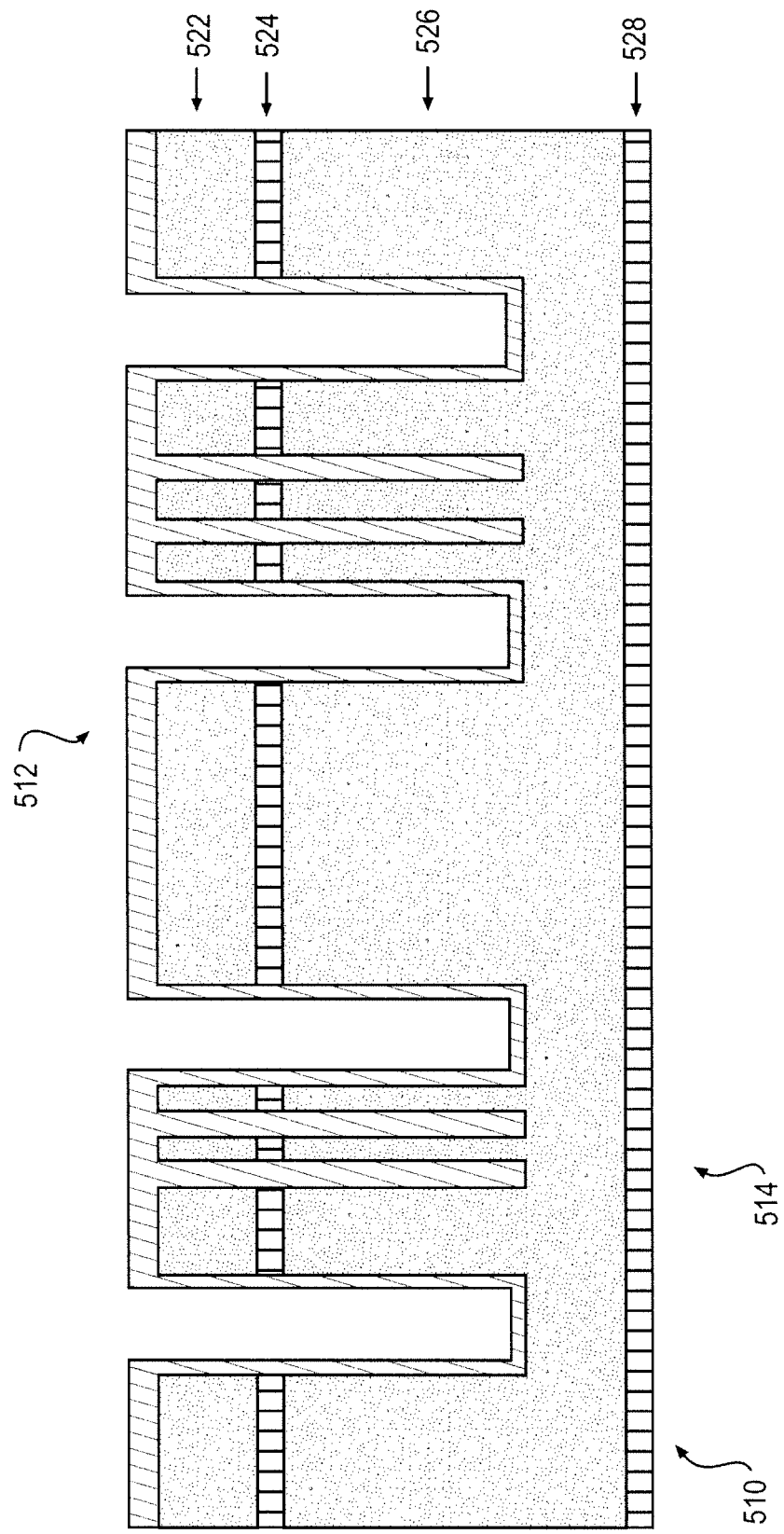

As shown in FIG. 5e, in this step, a conductive metal may be deposited by various techniques (including, without limitation, sputtering, platting, and pulse laser deposition) on the top surface 512 of the substrate 510. In some embodiments, a conformal coating of Silicon Germanium (SiGe) may be deposited, using low pressure chemical vapor deposition (LPCVD), on said top surface 512 and in the areas etched in the preceding two steps (e.g., the openings 530). Such conductive metal may short-circuit the total proof mass. In this case, short circuiting the total proof mass may be done through the movable combs, which, in this embodiment, are the parts that are connected to the suspensions affixed to the anchors. Such short-circuit may be necessary so that the signal from the movable combs may be passed through the anchors by way of the out-of-plane suspensions.

Figure 5F:
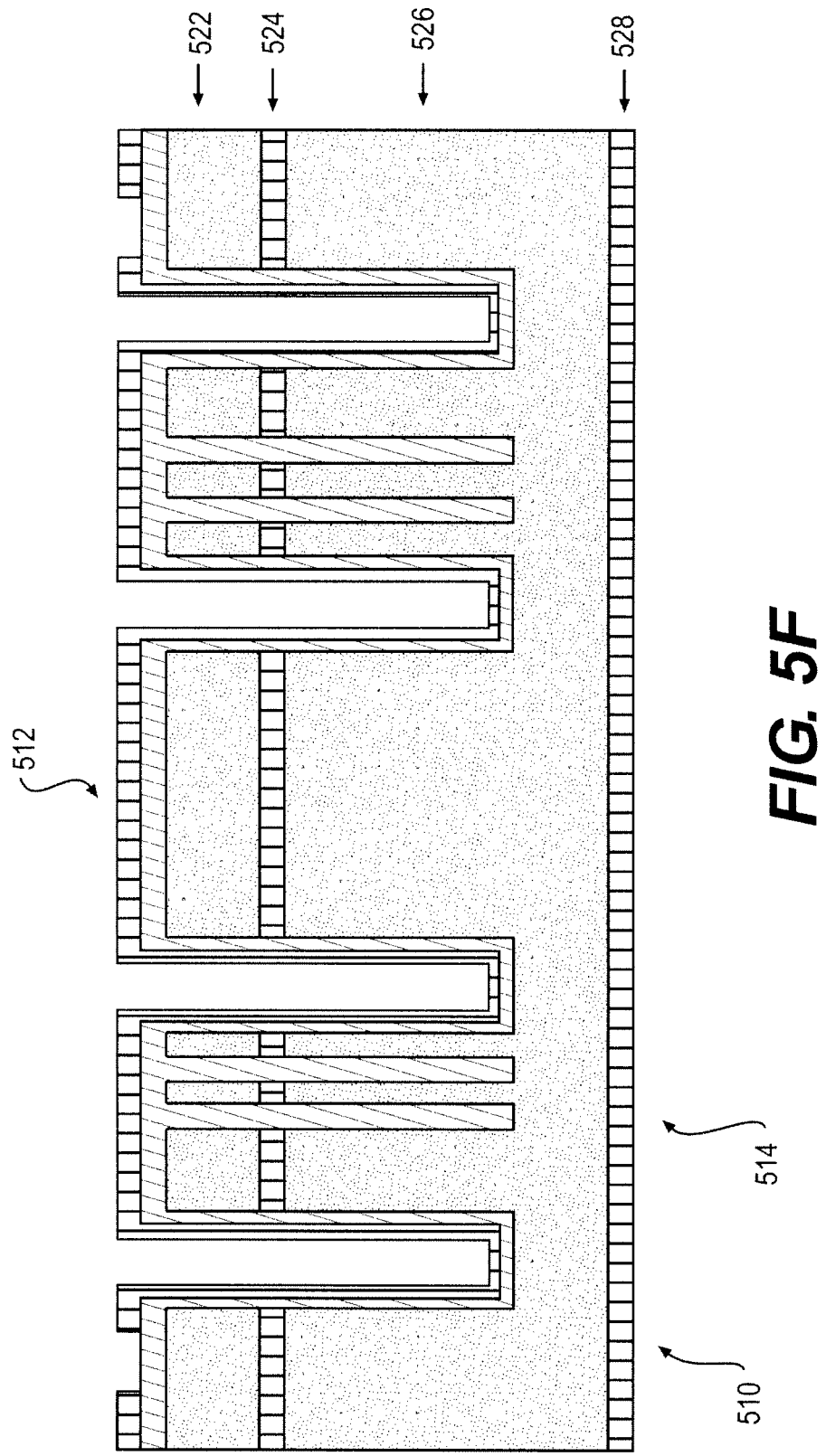

As shown in FIG. 5f, a thin layer of oxide may be selectively deposited on the top surface 512 of the substrate 510, over the conductive metal deposited in the previous step. In some embodiments, Silicon Dioxide ($SiO_2$) may be selectively deposited using LPCVD. This may be used to define, among other things, the fixed electrodes. The fixed electrodes are fixed comb-drive electrodes that may face the movable comb-drive electrodes of the drive and sense modes. Said fixed electrodes represent the other terminal of the linear comb-drive capacitance (whether for the drive and sense modes of the gyroscope or for the sense mode of the accelerometer). They may be used to interface the fabricated gyroscope to the drive and sense circuitry (i.e., the CMOS). In some embodiments, the thickness of the oxide may range sub-µm to 10 µm, depending the permissible parasitic capacitance.

As shown in FIG. 5g, the areas between said fixed electrodes 550 and the gyroscope may be selectively etched. In some embodiments, said areas may be etched using DRIE through to the second layer of oxide 524.

Figure 5H:
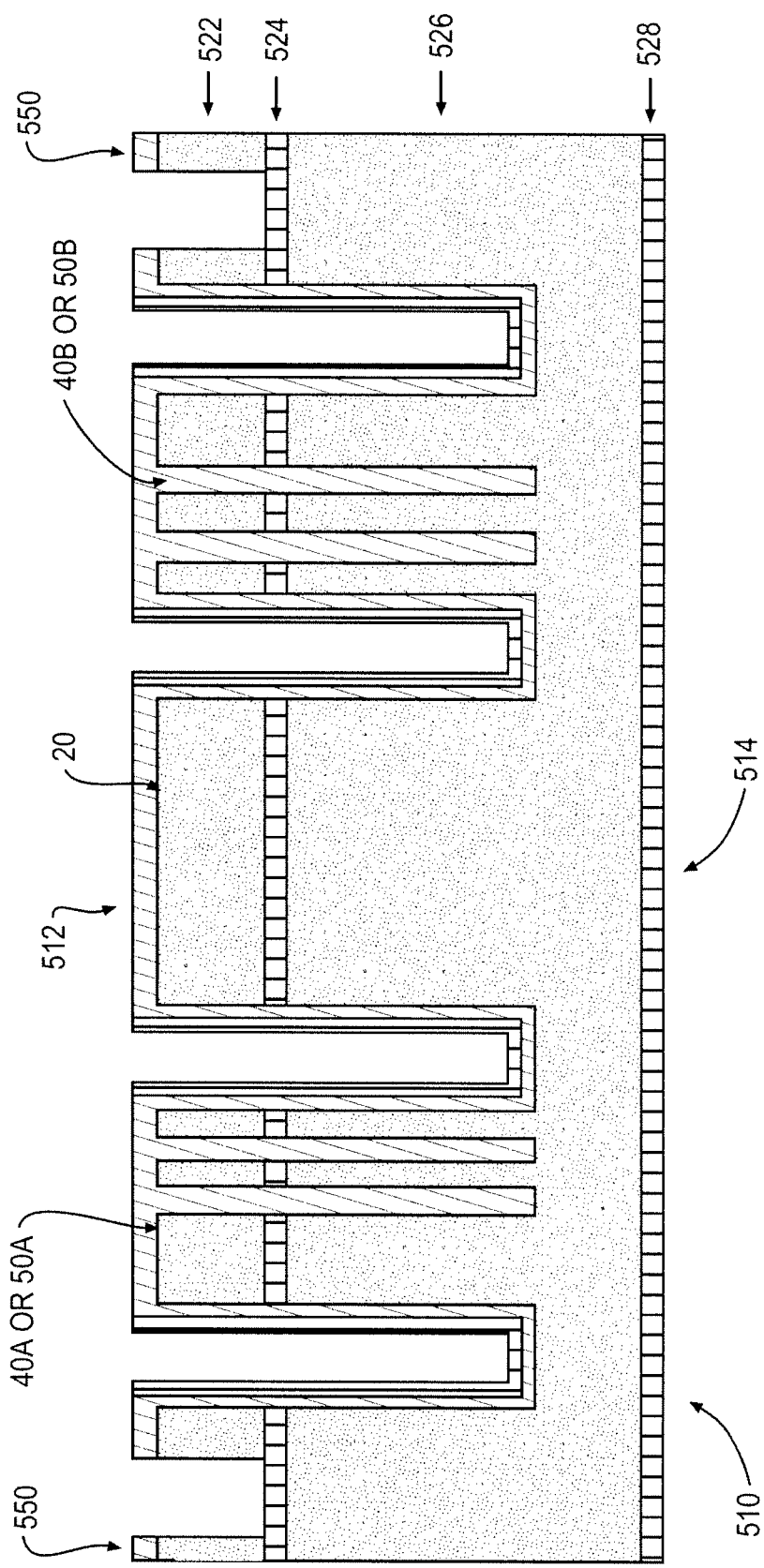

As shown in FIG. 5h, the layer of oxide remaining on the top surface 512 of the substrate 510 may then be etched, in some embodiments using DRIE, so as to remove the remainder of such oxide. Such etching may complete the fabrication of the top surface 512 of the substrate 510, realizing the fixed electrodes 550, the shared proof mass 20, and the drive and sense combs 40a-b, 50a-b. (As can be seen in this FIG. 5h, there is a "short circuit" in the middle of the movable combs, connecting the portions of said combs that are below and above the second layer of oxide 524.)

Figure 5I:
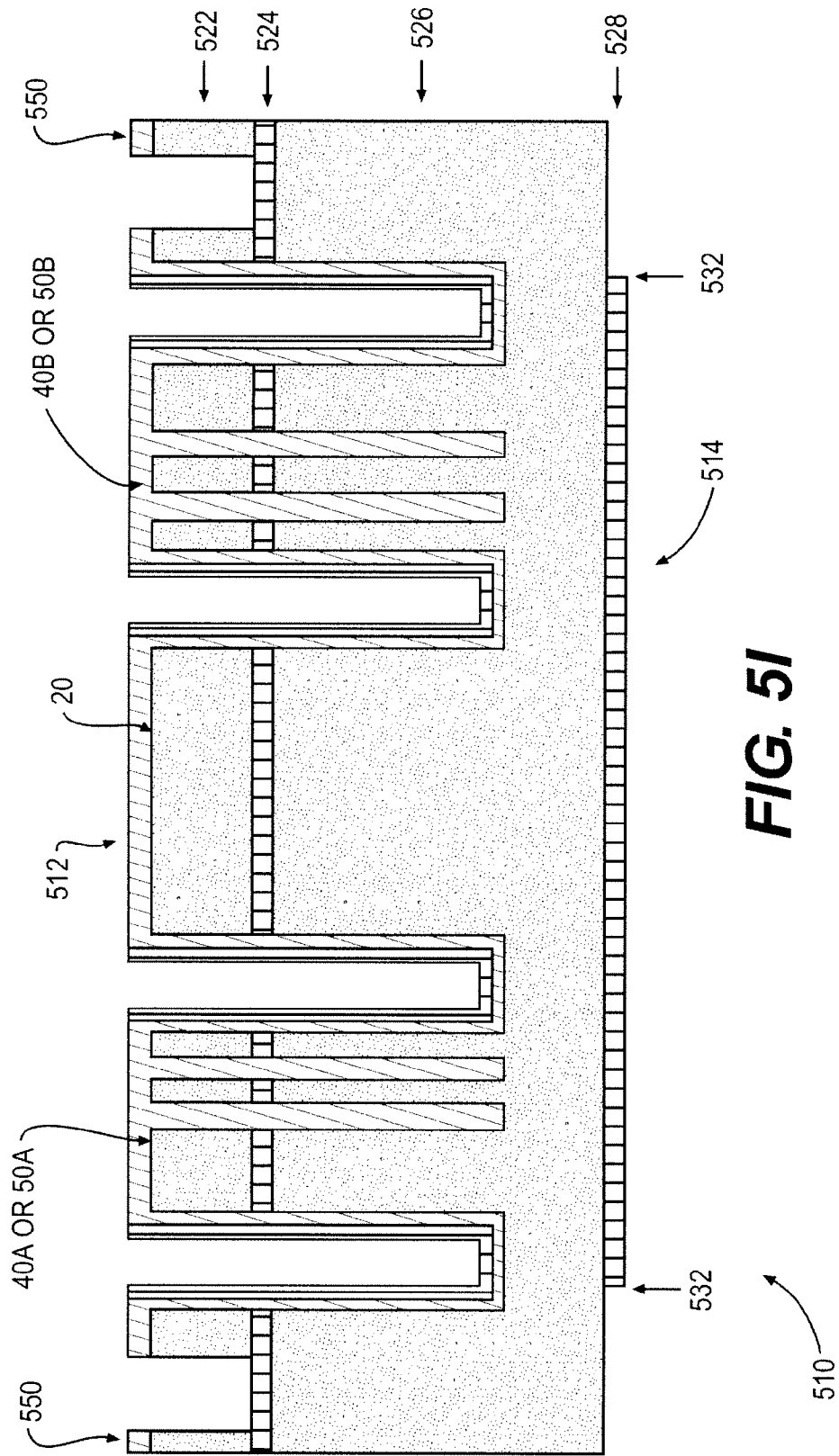
Figure 5J:
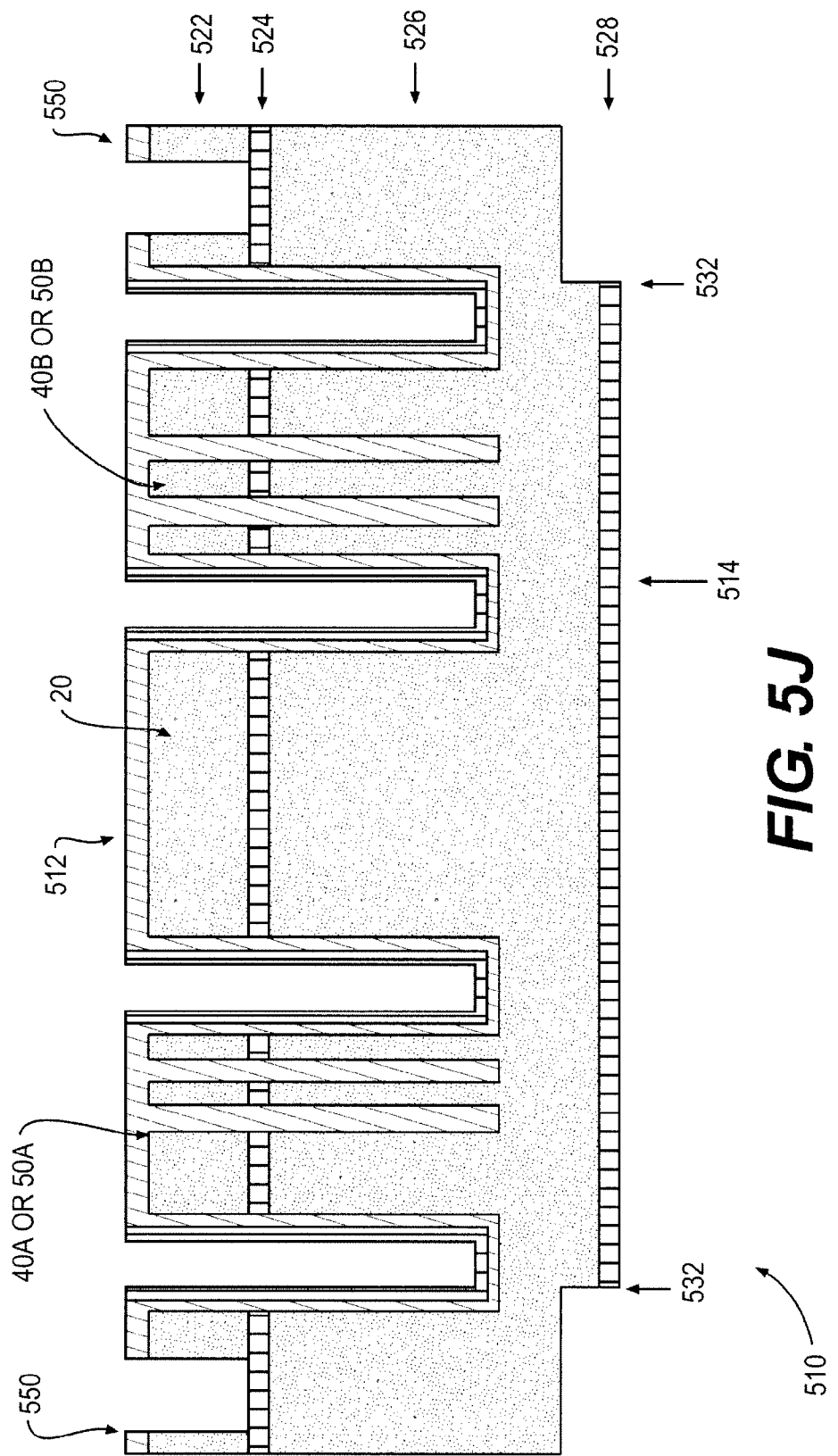

As shown in FIGS. 5i and 5j, the bottom surface 514 of the substrate 510 may be selectively etched, in some embodiments using DRIE, to define the outer boundaries 532 of the gyroscope. Such etching may be to a depth of 50 μm.

Figure 5K:
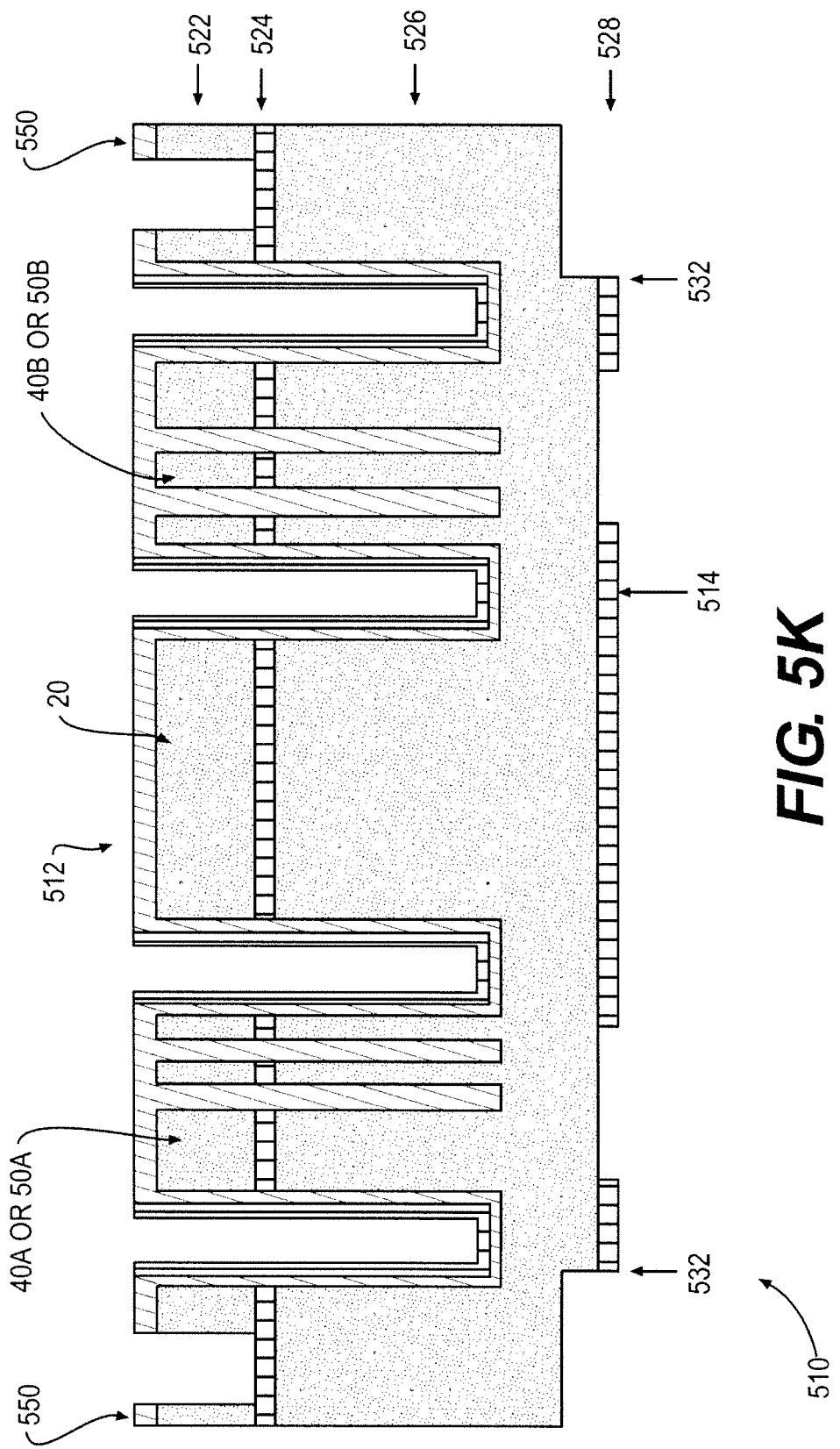

As shown in FIG. 5k, the bottom surface 514 of the substrate 510 may be further selectively etched to remove selected portions of the third layer of oxide, in order to prepare the bottom surface 514 of the substrate 510 for further etching.

As shown in FIG. 5l, the bottom surface 514 of the substrate 510 may be selectively etched to finalize the gyroscope. At the outer boundaries, said bottom surface 514 may be etched up to the second layer of oxide 524. The bottom surface may be etched to a depth of 250 μm to 500 μm to realize the out-of-plane suspensions 60. In some embodiments, DRIE may be used to perform such etching. Such etching may, among other things, reduce parasitic capacitance.

MEMS Accelerometer

Figure 6A:
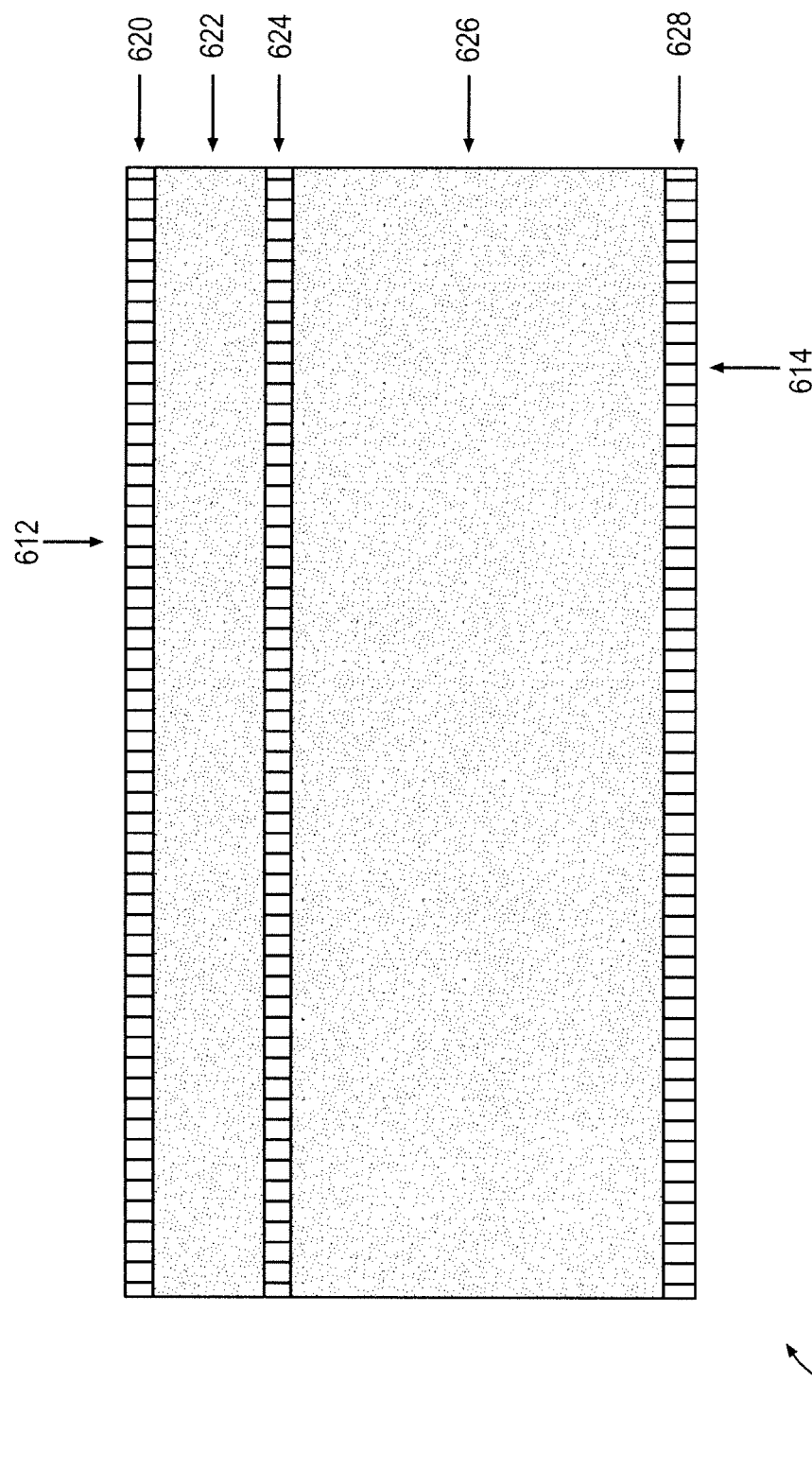

As shown in FIG. 6a, a substrate 610, such as silicon on insulator (SOI) substrate, having a top surface 612 and a bottom surface 614 may be provided. In some embodiments, said substrate 610 may, starting from the top surface 612, have the following layers: a first layer of oxide 620 having a thickness of 4 μm; a first layer of silicon 622 having a thickness of 100 μm; a second layer of oxide 624 having a thickness of 4 μm; a second layer of silicon 626 having a thickness of 570 μm; and a third layer of oxide 628 having a thickness of 4 μm. Said oxide layers 620, 624, 628 may each act as a sacrificial layer during etching.

Figure 6B:
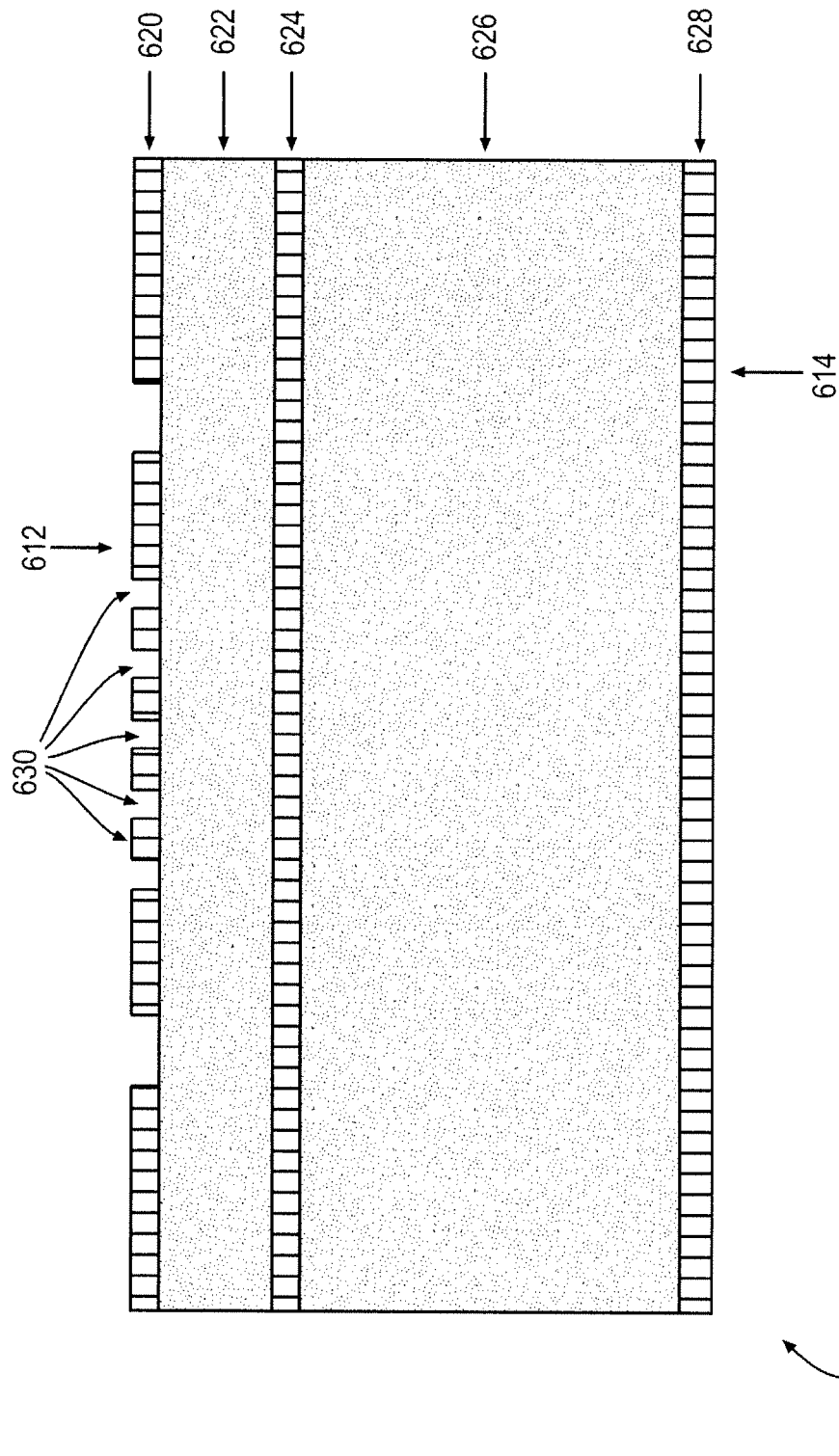
Figure 6C:
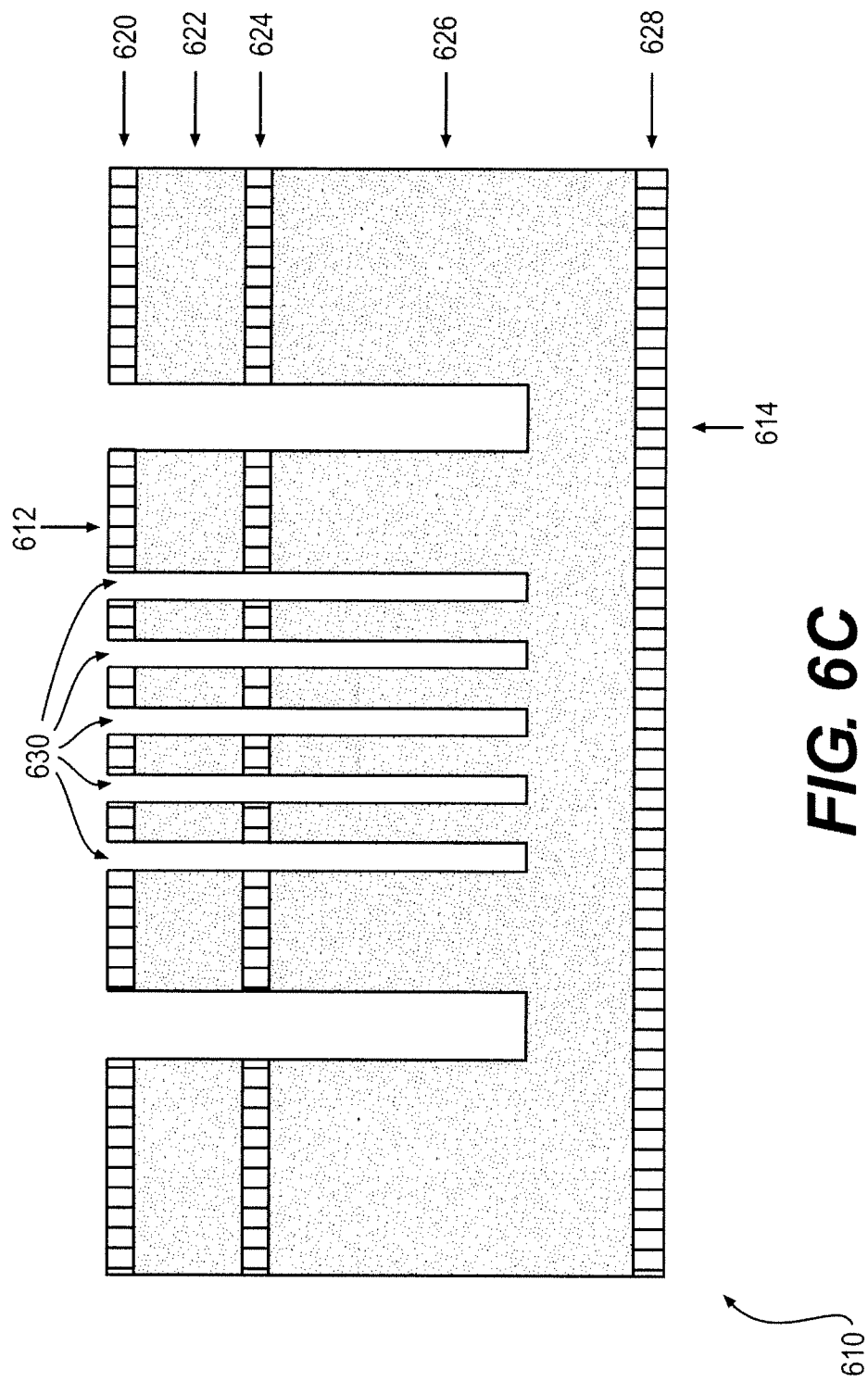

As shown in FIG. 6b, the first layer of oxide 620 may be selectively etched to define the openings 630 for the trenches that will be used to "short circuit" the proof mass, as well as to define the out-of-plane suspensions. Further, as shown in FIG. 6c, the openings 630 and out-of-plane suspensions may be etched through to a depth of 130 μm to 140 μm. In some embodiments, said etching may be performed using DRIE.

Figure 6D:
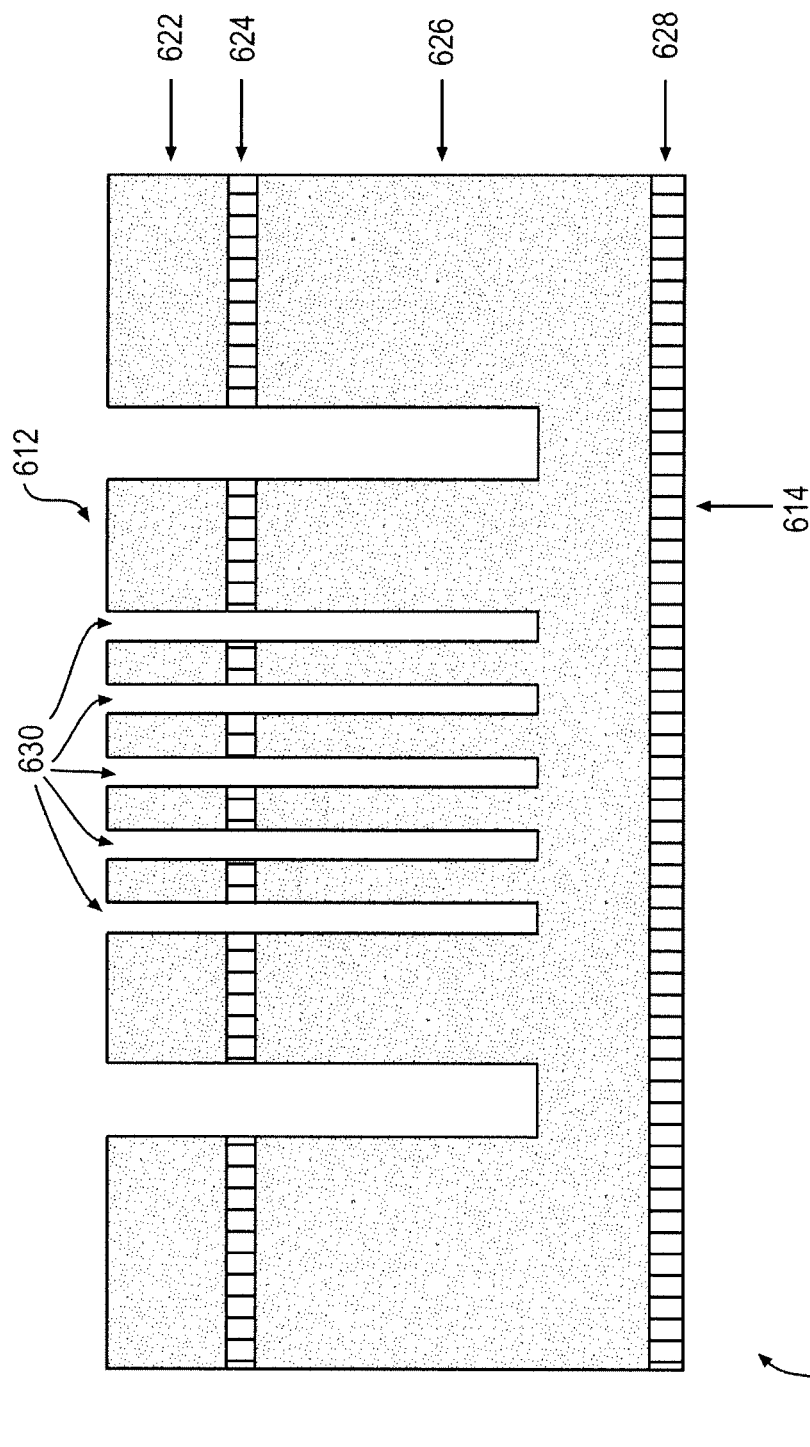

As shown in FIG. 6d, the top surface 612 of the substrate 610 may be further etched to remove the remainder of the first oxide layer 620. In some embodiments, said etching may be performed using DRIE. This will prepare the substrate 610 for the deposition of the conductive metal as described in the next paragraph.

Figure 6E:
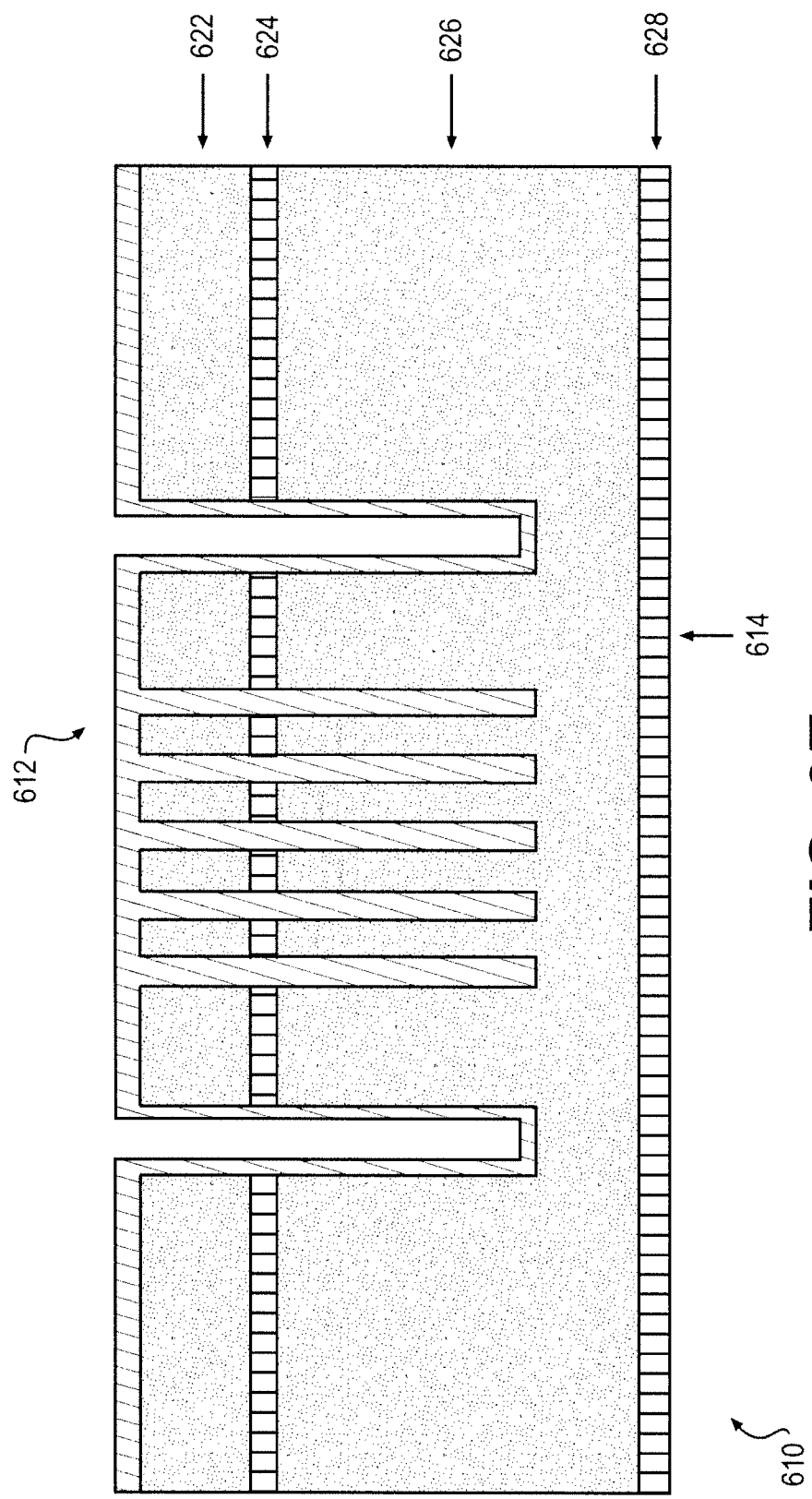

As shown in FIG. 6e, in this step, a conductive metal may be deposited by various techniques (including, without limitation, sputtering, platting, and pulse laser deposition) on the top surface 612 of the substrate 610. In some embodiments, a conformal coating of Silicon Germanium (SiGe) may be deposited, using low pressure chemical vapor deposition (LPCVD), on said top surface 612 and in the openings 630 and out-of-plane suspensions. As with the gyroscope, the conductive metal deposited in the openings may short-circuit parts of the proof mass (i.e., parts below and above the second oxide layer).

Figure 6F:
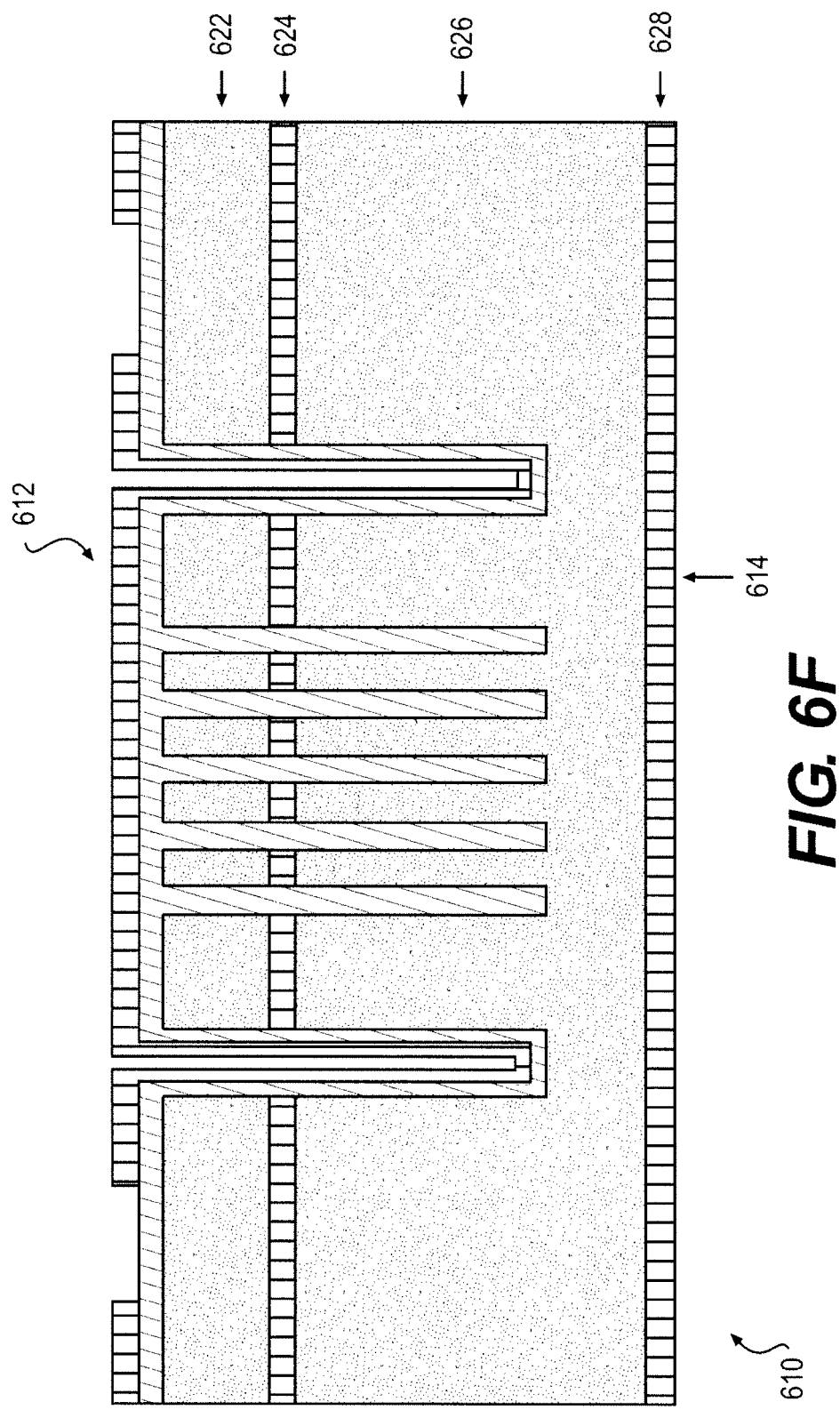

As shown in FIG. 6f, a thin layer of oxide may be selectively deposited on the top surface 612 of the substrate 610. In some embodiments, Silicon Dioxide ($SiO_2$) may be selectively deposited using LPCVD. This may be used to define, among other things, the isolated electrodes. The isolated electrodes carry the necessary electrical signals for sensing purposes. In some embodiments, the thickness of the oxide may range from sub-μm to 10 μm, depending on the maximum permissible parasitic capacitance.

Figure 6G:
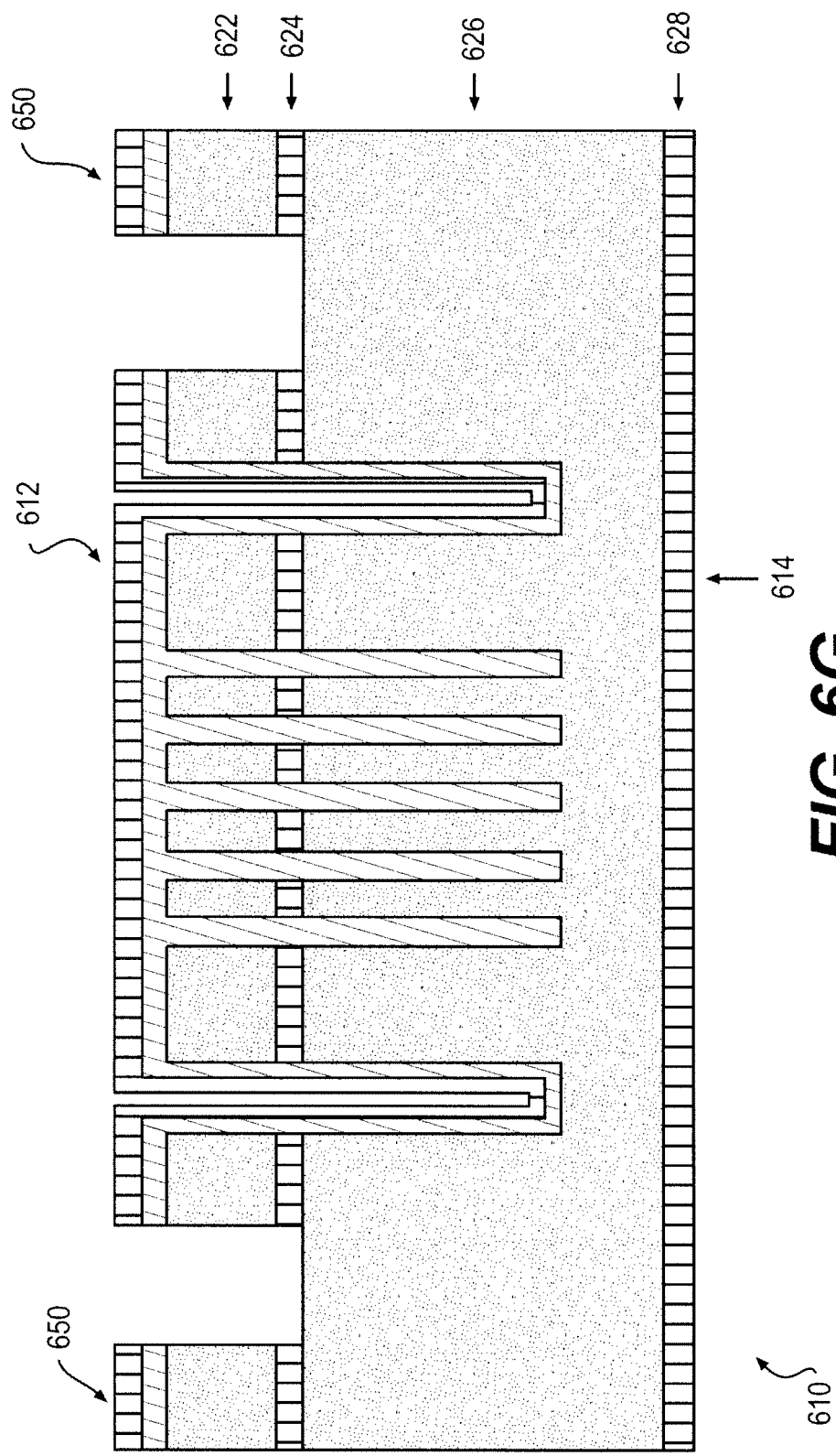

As shown in FIG. 6g, the areas between the isolated electrodes 650 and the accelerometer may be selectively etched. In some embodiments, said areas may be etched using DRIE through to the second layer of oxide 624.

Figure 6H:
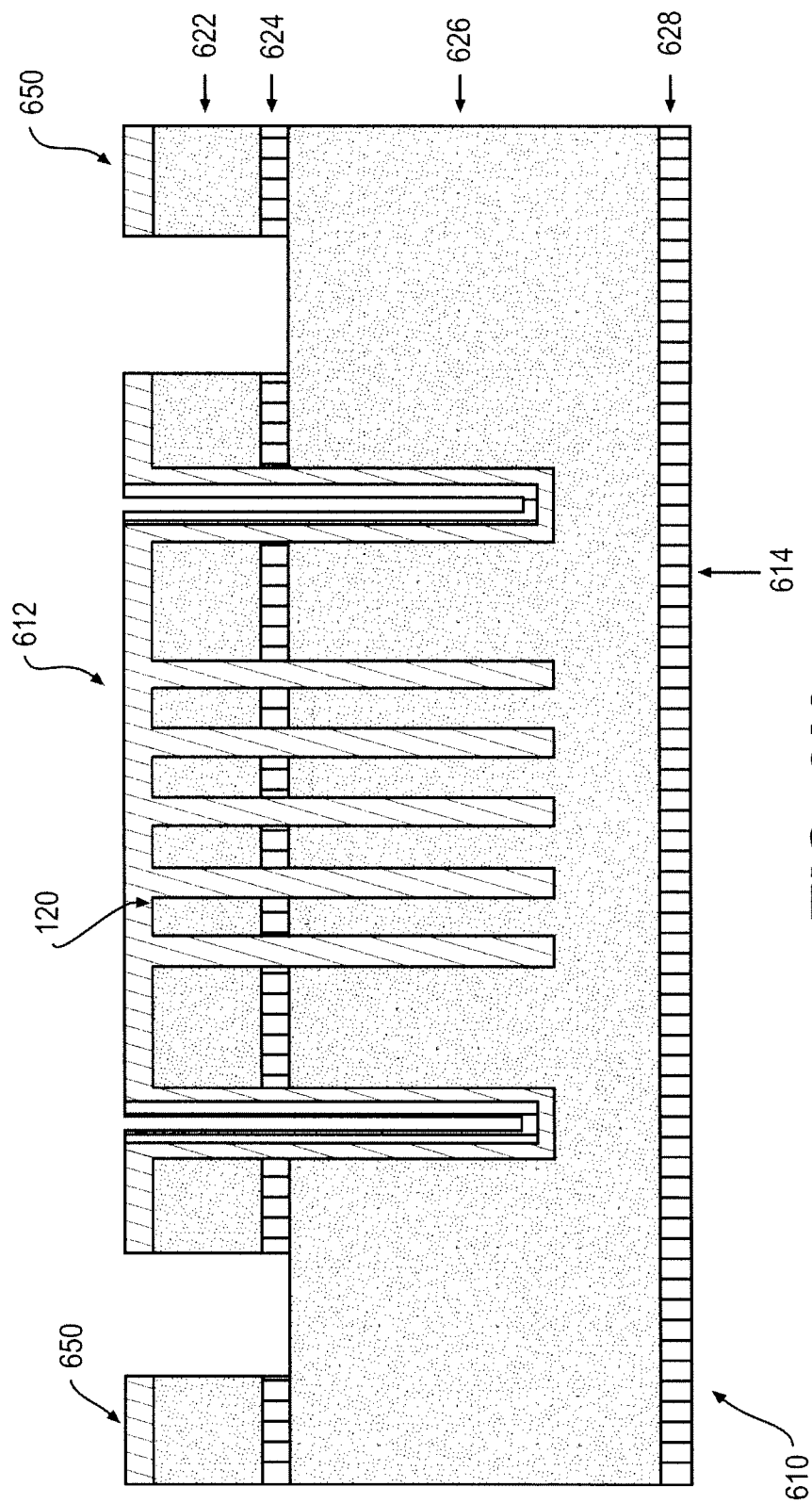

As shown in FIG. 6h, the layer of oxide remaining on the top surface 612 of the substrate 610 may then be etched, in some embodiments using DRIE, so as to remove the remainder of such oxide. Such etching may complete the fabrication of the top surface 612 of the substrate 610, realizing the isolated electrodes 650 and the proof mass 120.

Figure 6J:
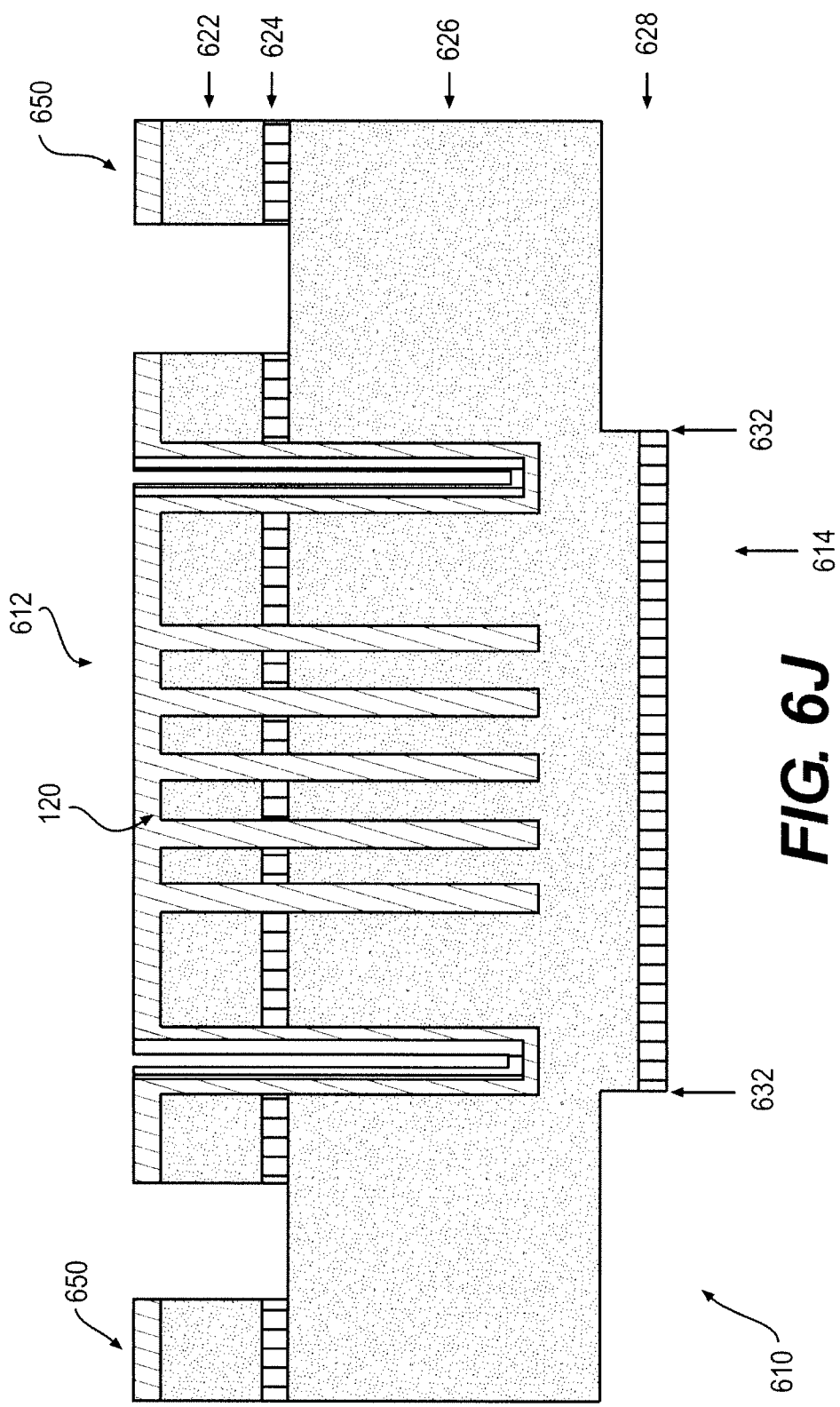

As shown in FIGS. 6i and 6j, the bottom surface 614 of the substrate 610 may be selectively etched, in some embodiments using DRIE, to define the outer boundaries 632 of the accelerometer. Such etching may be to a depth of 50 μm.

Figure 6K:
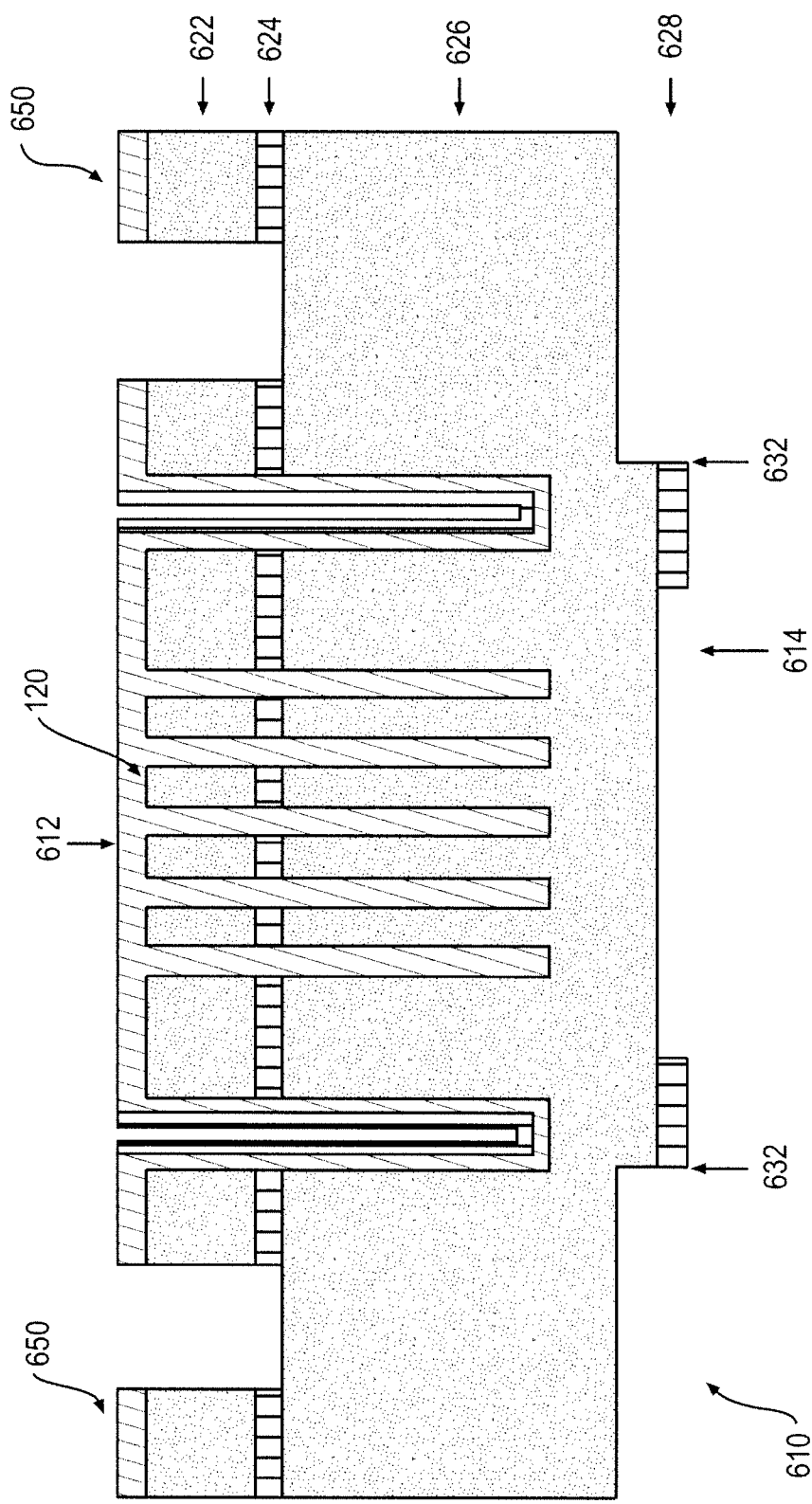

As shown in FIG. 6k, the bottom surface 614 of the substrate 610 may be further selectively etched to remove selected portions of the third layer of oxide 628, in order to prepare the bottom surface 614 of the substrate 610 for further etching.

Figure 6L:
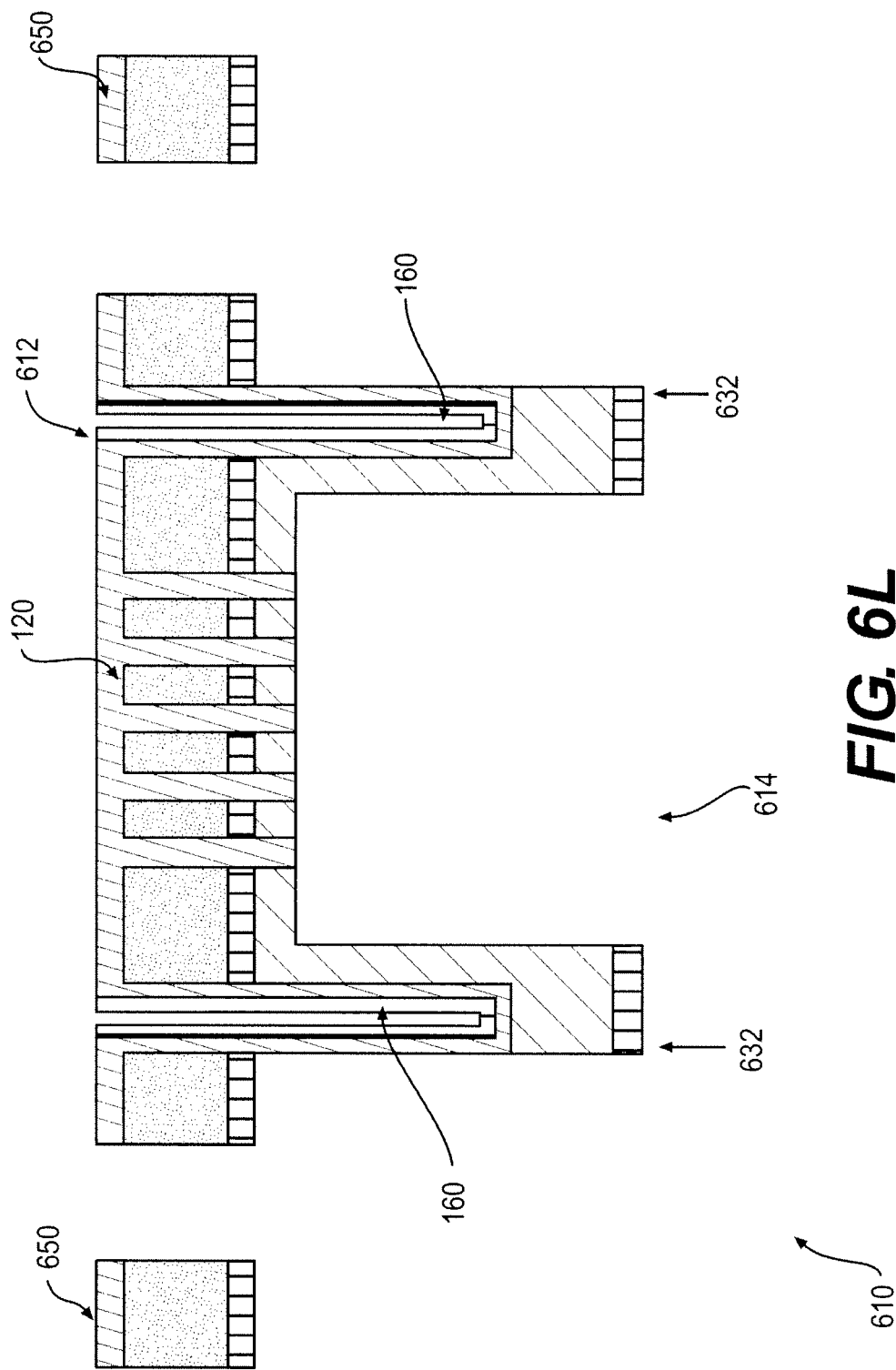
Figure 7A:
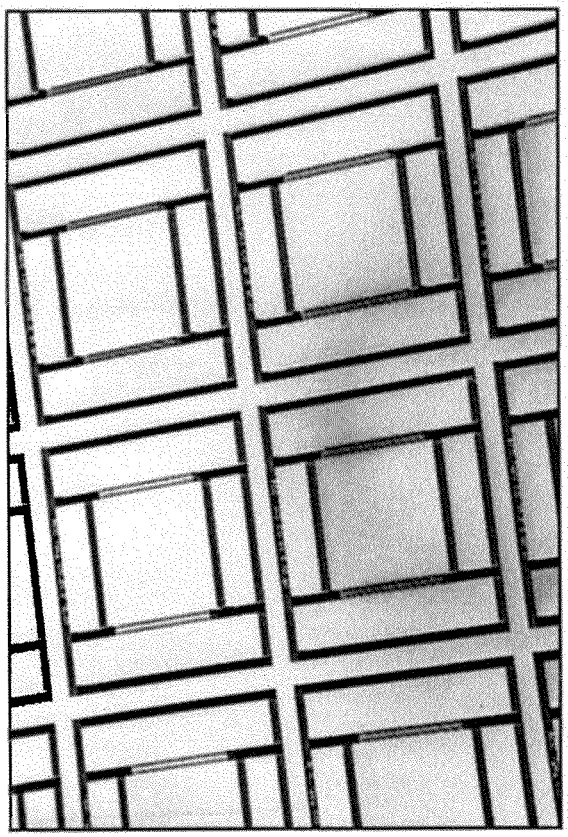
FIGS. 7a and 7b are scanning electronic microscope (SEM) images of an embodiment of a MEMS gyroscope of the present invention.
Figure 7B:
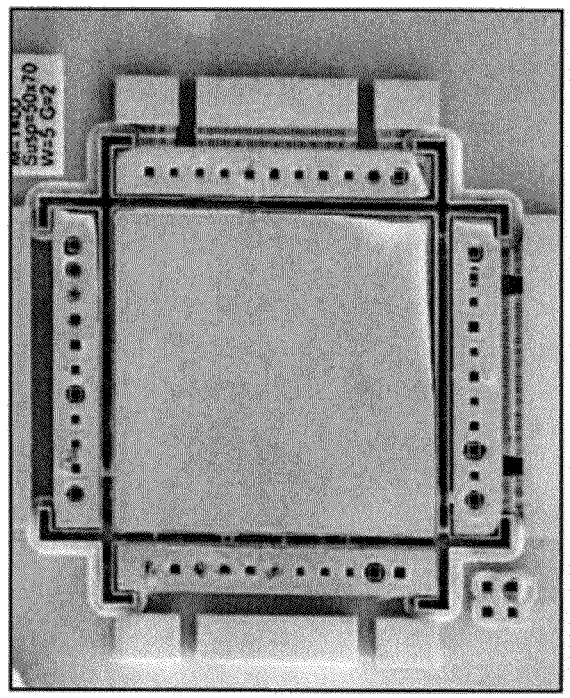
Figure 7C:
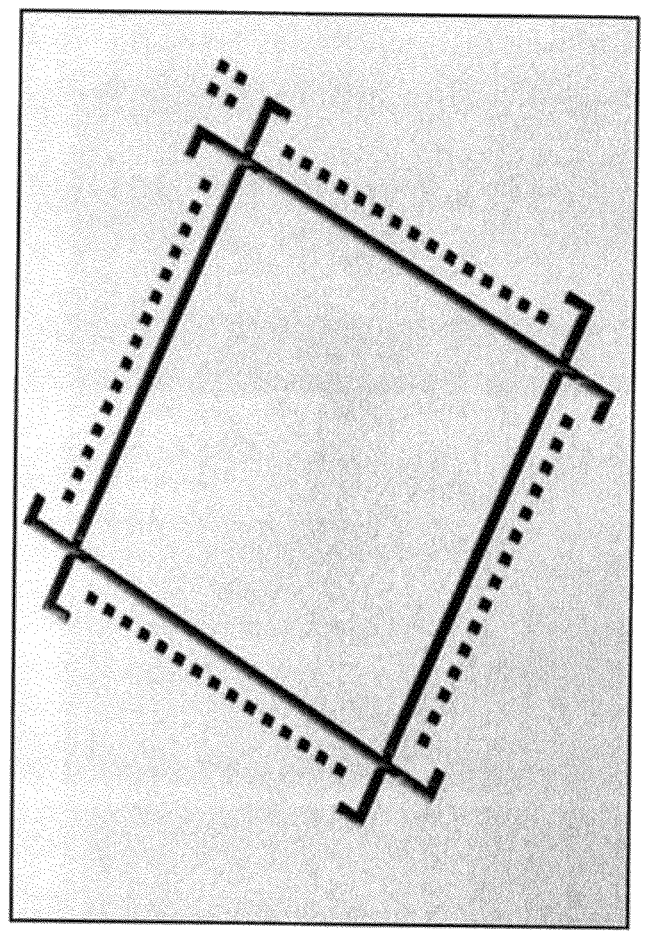
FIG. 7c is a SEM image of an embodiment of a MEMS gyroscope of the present invention that illustrates the openings that may be used to short circuit certain components in said gyroscope.
Figure 8:
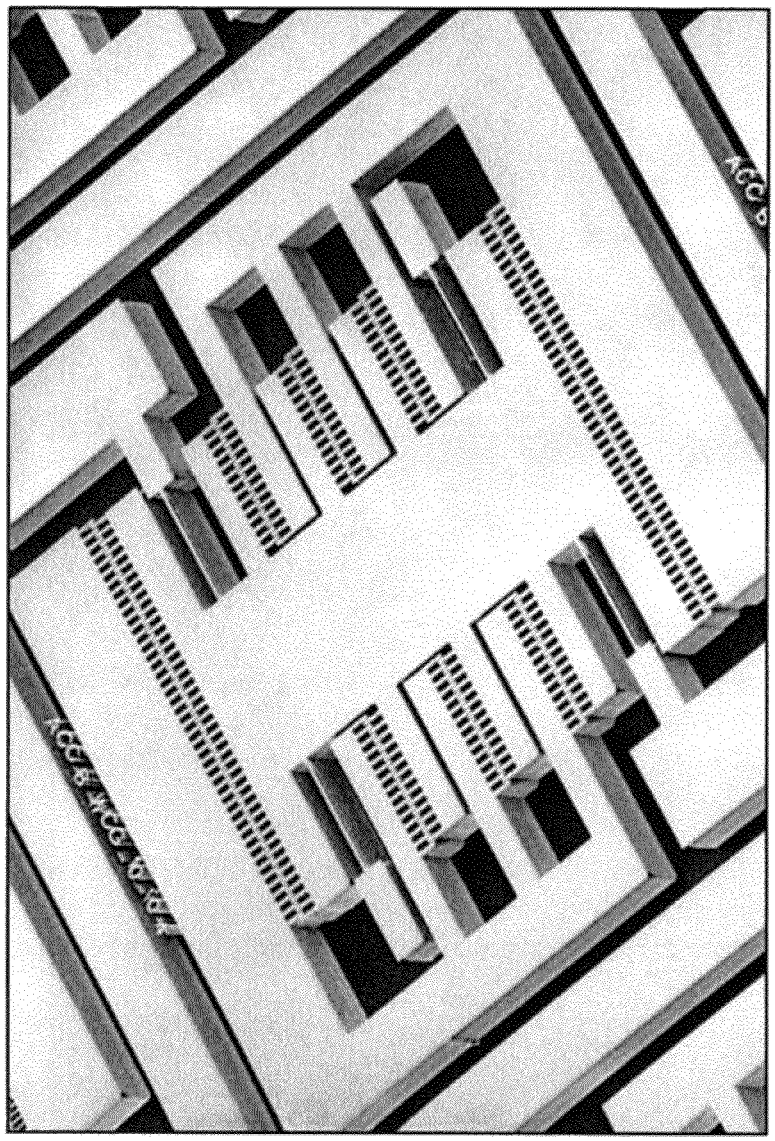
FIG. 8 is a SEM image of an embodiment of a MEMS accelerometer of the present invention.

As shown in FIG. 6l, the bottom surface 614 of the substrate 610 may be selectively etched to finalize the accelerometer. At the outer boundaries, said bottom surface 614 may be etched up to the second layer of oxide 624. Around the out-of-plane suspensions, the bottom surface 614 may be etched to a depth of 250 μm to 550 μm to realize said suspensions 160. In some embodiments, DRIE may be used to perform such etching. Such etching may, among other things, reduce parasitic capacitance.

Test Results

MEMS Gyroscope

An embodiment of a MEMS gyroscope of the present invention was tested against a prior art MEMS gyroscope, as such prior art gyroscope is described in the following publication: A. Sharm, F. Zaman, B. Amini, F. Ayazi, "*A High-Q In-Plane SOI Tuning Fork Gyroscope*," IEEE, 2004, pp. 467-470. Such gyroscopes had the same sensor area, 2 mm², and wafer thickness, 675 μm. The key difference between such gyroscopes was that the prior art MEMS gyroscope used in-plane suspensions, whereas the MEMS gyroscope of the present invention used out-of-plane suspensions. With respect to the MEMS gyroscope of the present invention, such tests were performed using COMSOL Multiphysics v3.5. The performance results of the prior art gyroscope were obtained from the aforementioned publication. A comparison of the performance of each gyroscope can be seen in the following Table 1.

TABLE 1

| Performance Measure | Prior Art Design | Embodiment of the Present Invention |
|---|---|---|
| 1. Dimensions of the Total Proof Mass and Proof Mass Area Fill Factor (PMAFF) and Proof Mass Volume Fill Factor (PMVFF) | 570 * 570 * 40 μm³ PMAFF~17% PMVFF~1% | 1200 * 1200 * 200 μm³ PMAFF~73.4% PMVFF~22% (The effective mass is around 22 times larger due to area and thickness expansion inherent with the novel gyroscope architecture.) |
| 2. Total Proof Mass ($M_e$) | 0.03 mg | 0.67 mg (The resulting mass is in the order of 1 mg.) |
| 3. Resonance Frequency ($F_r$) for the Same Stiffness and Support Losses | 17.4 KHz | 3.7 KHz (The frequency is still high in this embodiment because of the Poly-Silicon material properties.) |
| 4. Quality Factors for Drive and Sense Modes ($Q_d$ and $Q_s$) | 81,000 and 64,000 | 380,000 and 300,000 (These will be limited or clipped by the Q values due to finite support losses and thermo-elastic damping.) |
| 5. Theoretical Mechanical Noise Equivalent Angular Rate (MNEΩ) | 0.3°/hr | 0.014°/hr (The noise floor is reduced by a factor of 22, and is deeply in the inertial grade range.) |
| 6. Drive Mode Amplitude ($X_d$) for the Same Drive Voltage | 1 μm | 4.69 μm |
| 7. Sense Mode Amplitude ($X_s$) | 1 nm | 103 nm (The Coriolis displacement sensed at the output is more than two orders of magnitude more.) |
| 8. Drive and Sense Capacitances ($C_d$ and $C_s$) | 0.16 pF | 0.34 pF (The capacitance is increased due to improving the PMAFF, but the active or electrical thickness is the same.) |
| 9. Parasitic or Coupling Sustaining Area for the Same SOI Oxide Thickness | 100 * 570 μm² | 100 * 100 μm² (The parasitic capacitance is reduced by a factor of 5.7 as a result of the suggested support for the fixed combs.) |
| 10. Electrical Output Sensitivity ($S_e$) | 1.25 mV/°/s | 125 mV/°/s |
| 11. Signal to Noise Ratio (SNR) | 4.17 mV/°/hr | 9,166 mV/°/hr (The SNR is improved by 2200 times or more than three orders of magnitude.) |

As can be seen in Table 1, with the MEMS gyroscope of the present invention, the total proof mass size is increased by more than an order of magnitude (i.e., ten times) in the same overall device area (i.e., 2 mm²). The quality factor, drive amplitude, and resonance frequency are improved by a factor of 4.7. The dominating Brownian noise floor is lowered by a factor of 22, i.e., more than an order of magnitude. Furthermore, the sensed Coriolis displacement, output signal, and sensor sensitivity are improved by a factor of 103. Finally, the SNR is improved by more than three orders of magnitude.

Table 2 shows the resonance frequency and coupling percentage for various embodiments of a MEMS gyroscope of the present invention. Such simulation results were obtained using COMSOL Multiphysics v3.5. As can be seen from this table, the decoupling ratio of such various embodiments of a MEMS gyroscope of the present invention are in the same range as prior art MEMS gyroscopes (i.e., MEMS gyroscopes using in-plane suspensions). Thus, the MEMS gyroscopes of the present invention can provide improved performance (as shown in Table 1) without detrimentally affecting other performance measures.

TABLE 2

| | | | | | |
|---|---|---|---|---|---|
| Shared Proof Mass Side Length | 800 μm | 1000 μm | 1000 μm | 1000 μm | 1800 μm |
| Shared Proof Mass Thickness | 100 μm | 100 μm | 100 μm | 100 μm | 100 μm |
| Width of the Flying Comb Portion | 100 μm | 100 μm | 100 μm | 100 μm | 100 μm |
| Suspension Cross-Section Dimensions | 10 * 70 μm² | 10 * 70 μm² | 10 * 50 μm² | 10 * 50 μm² | 10 * 70 μm² |
| Suspension | 300 μm | 400 μm | 400 μm | 300 μm | 400 μm |

TABLE 2-continued

| Length | | | | | |
|---|---|---|---|---|---|
| Resonance Frequency | 20.1 KHz | 7.8 KHz | 8.4 KHz | 11.9 KHz | 4.9 KHz |
| Coupling Percentage | 2.3% | 2.0% | 1.7% | 1.6% | 1.4% |

MEMS Accelerometer

Embodiments of a MEMS accelerometer of the present invention were tested against a prior art MEMS accelerometer, as such prior art accelerometer is described in the following publication: B. V. Amini and F. Ayazi, "*Micro-Gravity Capacitive Silicon-On-Insulator Accelerometers*," Journal of Micromechanics, Vol. 15, No. 11, October 2005, pp. 2113-2120. The key difference between the accelerometers was that the prior art MEMS accelerometer used in-plane suspensions, whereas the MEMS accelerometers of the present invention obviously used out-of-plane suspensions. With respect to the MEMS accelerometers of the present invention, such tests were performed using COMSOL Multiphysics v3.5. The performance of the results of the prior art gyroscope were obtained from the aforementioned publication. A comparison of the performance of each accelerometer can be seen in the following Table 3.

TABLE 3

| Performance Measure | Prior Art Design | Embodiment of the Present Invention With Reduced Area | Embodiment of the Present Invention With Same Area |
|---|---|---|---|
| Area of the Proof Mass ($mm^2$) | 12 | 1.65 | 12 |
| Proof Mass (mg) | 1.7 | 0.98 | 7.1 |
| Resonance Frequency (Hz) | 2000 | 670 | 250 |
| Brownian Noise Floor ($\mu g\ Hz^{-1/2}$) | 0.7 | 0.842 | 0.19 |
| Static Sensitivity ($pF\ g^{-1}$) | >0.2 | >0.07 | >0.98 |

As can be seen from Table 3, the MEMS accelerometer of the present invention can provide the same or similar performance as the prior art design, but with less than 15% of the proof mass area. The resulting resonance frequency is 66% less. Moreover, with the present invention, the Brownian noise floor will remain sub-$\mu$g. Furthermore, when the MEMS accelerometer of the present invention is designed to use the same device area as the prior art design, performance is significantly improved. First, the proof mass becomes rather large (approximately 7 mg). Further, the resonance frequency is decreased to 250 Hz, which is less than 13% of the resonance frequency of the prior art design. In addition, the Brownian noise floor is deeply in the inertial grade range. Finally, with the present invention, the SNR is improved by more than an order of magnitude.

Table 4 shows the resonance frequency and coupling percentage for various embodiments of a MEMS accelerometer of the present invention. Such simulation results were obtained using COMSOL Multiphysics v3.5. This table shows the range of resonant frequencies that be achieved using the present invention with a small proof mass.

TABLE 4

| | | | | |
|---|---|---|---|---|
| Upper Mass Dimensions ($\mu$m) | 1500 * 1500 * 100 | 1500 * 1500 * 100 | 1500 * 1500 * 100 | 1500 * 1500 * 100 |
| Lower Mass Dimensions ($\mu$m) | 1500 * 1500 * 100 | 1500 * 1500 * 100 | 1500 * 1500 * 100 | 1440 * 1440 * 100 |
| Suspension Cross-section Dimensions ($\mu$m) | 10 * 30 | 10 * 30 | 10 * 30 | 10 * 30 |
| Suspension Length ($\mu$m) | 250 | 300 | 350 | 450 |
| Resonance Frequency (Hz) | 5389 | 4121 | 3288 | 2316 |

The invention claimed is:

1. A MEMS gyroscope, comprising:
   a. a proof mass having a horizontal planar dimension;
   b. one or more anchors; and
   c. one or more movable combs connected to the proof mass and to the one or more anchors by a plurality of suspensions;
   d. wherein said plurality of suspensions are out-of-plane with the horizontal planar dimension of the proof mass and are perpendicular to the proof mass and at least one comb moves parallel to the proof mass.

2. The MEMS gyroscope of claim 1, wherein said MEMS gyroscope is an inertial grade MEMS gyroscope.

3. The MEMS gyroscope of claim 1, wherein said proof mass, together with said one or more movable combs, have a combined mass ranging from 30 μg to 3 mg.

4. The MEMS gyroscope of claim 1, wherein said proof mass is positioned below said suspensions.

5. The MEMS gyroscope of claim 1, wherein said suspensions have a cross-section ranging from 5×5 μm² to 100×100 μm².

6. The MEMS gyroscope of claim 1, wherein said suspensions have a length ranging from 150 μm to 600 μm.

7. The MEMS gyroscope of claim 1, wherein said one or more movable combs rest on said suspensions.

8. The MEMS gyroscope of claim 1, wherein said one or more movable combs are comprised of first and second sense combs and first and second drive combs.

9. The MEMS gyroscope of claim 1, wherein said MEMS gyroscope is a three-fold symmetric gyroscope.

10. The MEMS gyroscope of claim 1, wherein said proof mass, said one or more anchors, said one or more movable combs, and said suspensions are comprised of crystalline Silicon.

11. The MEMS gyroscope of claim 1, wherein said MEMS gyroscope is bulk micromachined.

12. The MEMS gyroscope of claim 1, wherein said proof mass has a length and width ranging from 100 μm to 3 mm and a thickness ranging from 10 μm to 300 μm.

13. The MEMS gyroscope of claim 1, wherein said proof mass is comprised of an upper mass and a lower mass.

14. The MEMS gyroscope of claim 13, wherein said lower mass has a smaller length than said upper mass.

15. The MEMS gyroscope of claim 14, wherein said lower mass is 100 μm to 200 μm shorter in length than said upper mass.

16. The MEMS gyroscope of claim 1, wherein said proof mass has a weight ranging from 30 μg to 3 mg.

17. The MEMS gyroscope of claim 1, wherein said proof mass, said one or more anchors, and said suspensions are comprised of crystalline Silicon.

18. The MEMS gyroscope of claim 1, wherein said proof mass rests on said suspensions.

19. The MEMS gyroscope of claim 1, wherein said suspensions have a cross-section ranging from 5×5 μm² to 100×100 μm².

20. The MEMS gyroscope of claim 1, wherein said suspensions have a length ranging from 250 μm to 600 μm.

21. The MEMS gyroscope of claim 1, comprising a drive structure and a sense structure, wherein the drive structure comprises at least one movable comb and the sense structure comprises at least one movable comb.

22. A quad-mass MEMS gyroscope, comprising:
   a. a plurality of proof masses, each having a horizontal planar dimension;
   b. one or more anchors; and
   c. one or more movable combs connected to the plurality of proof masses and to the one or more anchors by a plurality of suspensions;
   d. wherein said suspensions are out-of-plane with the horizontal planar dimension of said at least one of the proof masses and are perpendicular to the proof masses mass and at least one comb moves parallel to one of the proof masses.

23. The quad-mass MEMS gyroscope of claim 22, comprising a drive structure and a sense structure, wherein the drive structure comprises at least one movable comb and the sense structure comprises at least one movable comb.

24. The quad-mass MEMS gyroscope of claim 22, wherein said one or more movable combs are comprised of a plurality of sense combs and a plurality of drive combs.

25. The quad-mass MEMS gyroscope of claim 24, wherein each proof mass has its own respective drive comb, but said sense combs are shared by said proof masses.

26. A MEMS mass-spring-damper system, comprising:
   a. at least one proof mass having a horizontal planar dimension;
   b. one or more anchors; and
   c. one or more movable structures connected to said at least one proof mass and to the one or more anchors by a plurality of suspensions;
   d. wherein said suspensions are out-of-plane with the horizontal planar dimension of at least one of the proof masses and are perpendicular to the proof mass and at least one movable structure moves parallel to the proof mass.

27. The MEMS mass-spring-damper system of claim 26, wherein said MEMS mass-spring-damper system is an inertial grade range MEMS mass-spring-damper system.

28. The MEMS mass-spring-damper system of claim 26, wherein said MEMS mass-spring-damper system is bulk micromachined.

* * * * *